US012499812B2

(12) United States Patent
Seo et al.

(10) Patent No.: US 12,499,812 B2
(45) Date of Patent: Dec. 16, 2025

(54) DISPLAY DEVICE AND DISPLAY PANEL

(71) Applicant: LG Display Co., Ltd., Seoul (KR)

(72) Inventors: Jeongrim Seo, Paju-si (KR); SooHong Choi, Paju-si (KR); HongJae Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 1 day.

(21) Appl. No.: 18/443,268

(22) Filed: Feb. 15, 2024

(65) Prior Publication Data
US 2024/0290246 A1 Aug. 29, 2024

(30) Foreign Application Priority Data
Feb. 28, 2023 (KR) .................. 10-2023-0027288

(51) Int. Cl.
*G09G 3/20* (2006.01)
*G09G 3/3225* (2016.01)
(Continued)

(52) U.S. Cl.
CPC ......... *G09G 3/2096* (2013.01); *G09G 3/3225* (2013.01); *G09G 3/3266* (2013.01);
(Continued)

(58) Field of Classification Search
None
See application file for complete search history.

(56) References Cited

U.S. PATENT DOCUMENTS

| 2021/0201767 | A1 | 7/2021 | Park et al. |
| 2022/0208109 | A1* | 6/2022 | Seo ............... G09G 3/3233 |
| 2023/0178048 | A1* | 6/2023 | Jeon .............. G09G 3/3677 |
| | | | 345/87 |

FOREIGN PATENT DOCUMENTS

| KR | 10-2021-0083620 A | 7/2021 |
| KR | 10-2021-0086311 A | 7/2021 |

(Continued)

OTHER PUBLICATIONS

European Patent Office, Extended European Search Report, European Patent Application No. 24160271.3, Jul. 5, 2024, 13 pages.
(Continued)

*Primary Examiner* — Ifedayo B Iluyomade
(74) *Attorney, Agent, or Firm* — Fenwick & West LLP

(57) ABSTRACT

A display panel comprising a display area including a plurality of subpixels, a gate driving circuit disposed in a non-display area outside the display area to supply a plurality of scan signals to the plurality of subpixels, and a plurality of gate high-potential voltage lines which are disposed in the non-display area for transferring a plurality of gate high-potential voltages to the gate driving circuit, wherein plurality of gate high-potential voltage lines include a first gate high-potential voltage line transferring a first gate high-potential voltage for charging a first node of the gate driving circuit, a second gate high-potential voltage line transferring a second gate high-potential voltage for charging a second node of the gate driving circuit, and a third gate high-potential voltage line which is branched from the first gate high-potential voltage line for transferring a third gate high-potential voltage to stabilize a transistor controlling the first node.

23 Claims, 31 Drawing Sheets

(51) Int. Cl.
    *G09G 3/3266*     (2016.01)
    *H10K 59/131*     (2023.01)
(52) U.S. Cl.
    CPC ... *H10K 59/131* (2023.02); *G09G 2300/0819* (2013.01); *G09G 2300/0842* (2013.01); *G09G 2310/0291* (2013.01); *G09G 2320/0223* (2013.01)

(56) References Cited

FOREIGN PATENT DOCUMENTS

KR    10-2022-0028620 A    3/2022
KR    10-2022-0092208 A    7/2022

OTHER PUBLICATIONS

Korean Intellectual Property Office, Office Action, Korean Patent Application No. 10-2023-0027288, Aug. 30, 2025, 16 pages.

* cited by examiner

Vsen Wave

DISPLAY DEVICE AND DISPLAY PANEL

CROSS-REFERENCE TO RELATED APPLICATION

This application claims priority from Republic of Korea Patent Application No. 10-2023-0027288, filed on Feb. 28, 2023, which is hereby incorporated by reference in its entirety.

BACKGROUND

Field

Embodiments of the disclosure relate to a display device and a display panel and, more specifically, to a display device and a display panel that can improve operating characteristics by stably maintaining the critical node voltage of a gate driving circuit.

Description of Related Art

Representative display devices for displaying an image based on digital data include liquid crystal display (LCD) devices using liquid crystal and organic light emitting display devices using organic light emitting diodes OLEDs.

Among these display devices, the organic light emitting display device uses self-emission light emitting diodes, providing advantages, such as a fast response and better contrast ratio, luminous efficiency, luminance, and viewing angle. In this case, the light emitting diode may be implemented with an inorganic material or an organic material.

The organic light emitting display device may include organic light emitting diodes respectively arranged in a plurality of subpixels disposed on a display panel and cause the organic light emitting diodes to emit light by controlling the current flowing to the organic light emitting diodes, thereby displaying images while controlling the brightness of each subpixel.

The display device includes a gate driving circuit and a data driving circuit that may drive the display panel.

Among these, the gate driving circuit has two critical nodes (Q node and QB node) that are important for the gate driving state. Therefore, when the voltage of the Q node and QB node changes, the performance of driving the display panel or sensing characteristic values may be deteriorated.

SUMMARY

Accordingly, the inventors of the disclosure have invented a display device and display panel that may stably maintain the critical node voltage of a gate driving circuit at low power.

Embodiments of the disclosure may provide a display device and display panel that may stably maintain the critical node voltage of a gate driving circuit at low power by minimizing or at least reducing the fluctuation of the gate high voltage applied to the gate driving circuit.

Embodiments of the disclosure may provide a display panel comprising a display area where a plurality of subpixels are disposed, a gate driving circuit disposed in a non-display area outside the display area to supply a plurality of scan signals to the plurality of subpixels, and a plurality of gate high-potential voltage lines which are disposed in the non-display area for transferring a plurality of gate high-potential voltages to the gate driving circuit, wherein plurality of gate high-potential voltage lines include a first gate high-potential voltage line transferring a first gate high-potential voltage for charging a first node of the gate driving circuit, a second gate high-potential voltage line transferring a second gate high-potential voltage for charging a second node of the gate driving circuit, and a third gate high-potential voltage line which is branched from the first gate high-potential voltage line for transferring a third gate high-potential voltage to stabilize a transistor controlling the first node.

Embodiments of the disclosure provide a display device comprising a display panel including a plurality of subpixels, a gate driving circuit configured to supply a plurality of scan signals to the display panel through a plurality of gate lines, a data driving circuit configured to supply a plurality of data voltages to the display panel through a plurality of data lines, and a timing controller configured to control the gate driving circuit and the data driving circuit, wherein a first gate high-potential voltage line transferring a first gate high-potential voltage for charging a first node of the gate driving circuit, a second gate high-potential voltage line transferring a second gate high-potential voltage for charging a second node of the gate driving circuit, and a third gate high-potential voltage line which is branched from the first gate high-potential voltage line for transferring a third gate high-potential voltage to stabilize a transistor controlling the first node are disposed in a side area of the gate driving circuit.

According to embodiments of the disclosure, it is possible to stably maintain the critical node voltage of a gate driving circuit at low power.

According to embodiments of the disclosure, it is possible to stably maintain the critical node voltage of a gate driving circuit at low power by minimizing or at least reducing the fluctuation of the gate high voltage applied to the gate driving circuit.

BRIEF DESCRIPTION OF DRAWINGS

The above and other objects, features, and advantages of the disclosure will be more clearly understood from the following detailed description, taken in conjunction with the accompanying drawings, in which.

DETAILED DESCRIPTION

Figure 1:
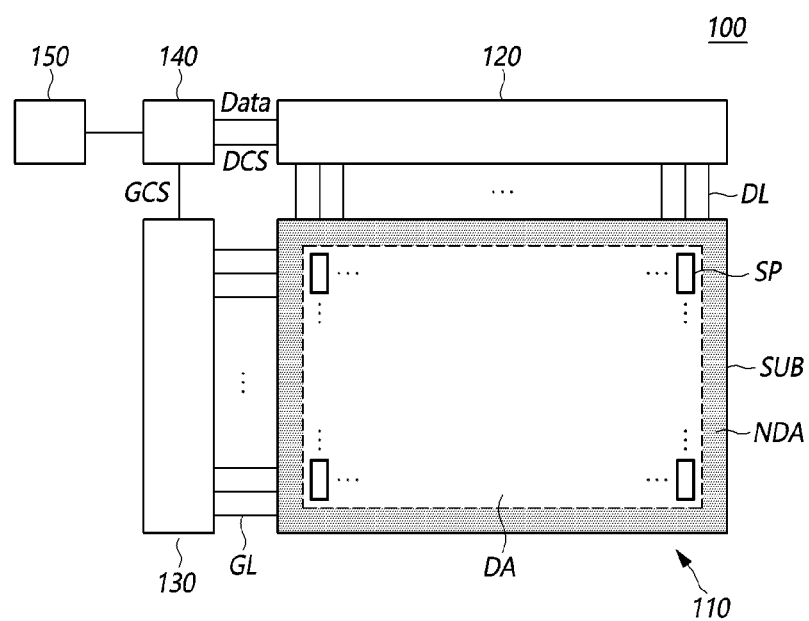
FIG. 1 is a view illustrating a system configuration of a display device according to embodiments of the disclosure.

Hereinafter, some embodiments of the disclosure will be described in detail with reference to exemplary drawings. In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the disclosure will be described in detail with reference to the accompanying drawings.

FIG. 1 is a view illustrating a system configuration of a display device according to embodiments of the disclosure.

Referring to FIG. 1, a display device 100 according to embodiments of the disclosure may include a display panel 110 including a plurality of subpixels SP and driving circuits for driving the plurality of subpixels SP included in the display panel 110.

The driving circuits may include a data driving circuit 120 and a gate driving circuit 130. The display device 100 may further include a controller 140 controlling the data driving circuit 120 and the gate driving circuit 130.

The display panel 110 may include a substrate SUB and signal lines, such as a plurality of data lines DL and a plurality of gate lines GL disposed on the substrate SUB. The plurality of data lines DL and the plurality of gate lines GL may be connected to the plurality of subpixels SP.

The substrate SUB may include a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto. Alternatively, the substrate SUB may include a glass or a multiple layer where an organic layer and an inorganic layer are alternately laminated. For example, the substrate SUB may include an organic insulating material layer such as polyimide (PI) and an inorganic insulating material layer such as silicon oxide (SiO2) alternately laminated.

The display panel 110 may include a display area DA in which images are displayed and a non-display area NDA in which no image is displayed. The non-display area NDA is adjacent to or surrounding the display area DA. In the display panel 110, a plurality of subpixels SP for displaying images may be disposed in the display area DA, and the driving circuits 120, 130, and 140 may be electrically connected or disposed in the non-display area NDA. Further, pad units for connection of integrated circuits or a printed circuit may be disposed in the non-display area NA.

The plurality of subpixels SP may include first, second, third and fourth subpixels SP1, SP2, SP3 and SP4. Each of the first, second, third and fourth subpixels SP1, SP2, SP3 and SP4 is connected to the gate line GL and the data line DL. For example, the first, second, third and fourth subpixels SP1, SP2, SP3 and SP4 may correspond to red, green, blue and white, respectively. Alternatively, the plurality of subpixels SP may include first, second, and third subpixels SP1, SP2, and SP3. Each of the first, second, and third subpixels SP1, SP2, and SP3 is connected to the gate line GL and the data line DL. For example, the first, second, and third subpixels SP1, SP2, and SP3 may correspond to red, green, and blue, respectively. For example, the red, green, blue, and white sub-pixels or the red, green, and blue sub-pixels may be disposed in a repeated manner, or the red, green, blue, and white sub-pixels may be disposed in a quad type. For example, the red sub pixel, the blue sub pixel, the green sub pixel and the white sub pixel may be sequentially disposed along the row direction, or the red sub pixel, the blue sub pixel, and the green sub pixel may be sequentially disposed along a row direction.

However, in the exemplary embodiment of the present disclosure, the color type, disposition type, and disposition order of the sub-pixels are not limiting, and may be configured in various forms according to light-emitting characteristics, device lifespans, and device specifications.

Meanwhile, the sub-pixels may have different light-emitting areas according to light-emitting characteristics. For example, a sub-pixel that emits light of a color different from that of a blue sub-pixel may have a different light-emitting area from that of the blue sub-pixel. For example, the red sub-pixel, the blue sub-pixel, and the green sub-pixel, or the red sub-pixel, the blue sub-pixel, the white sub-pixel, and the green sub-pixel may each has a different light-emitting area.

The data driving circuit 120 is a circuit for driving the plurality of data lines DL, and may supply data signals to the plurality of data lines DL.

The gate driving circuit 130 is a circuit for driving the plurality of gate lines GL, and may supply gate signals to the plurality of gate lines GL.

The controller 140 may supply a data control signal DCS to the data driving circuit 120 to control the operation timing of the data driving circuit 120 and may supply a gate control signal GCS to the gate driving circuit 130 to control the operation timing of the gate driving circuit 130.

The controller 140 may start scanning according to a timing implemented in each frame, convert input image data input from the outside into image data Data suited for the data signal format used in the data driving circuit 120, supply the image data Data to the data driving circuit 120, and control data driving at an appropriate time suited for scanning.

The controller 140 receives, from the outside (e.g., a host system 150), various timing signals including a vertical synchronization signal, a horizontal synchronization signal, an input data enable signal, and a clock signal, along with the input image data.

To control the data driving circuit 120 and the gate driving circuit 130, the controller 140 receives timing signals, such as the vertical synchronization signal, horizontal synchronization signal, input data enable signal, and clock signal, generates various control signals DCS and GCS, and outputs the control signals to the data driving circuit 120 and the gate driving circuit 130. Here, the horizontal synchronization signal is a signal representing a time taken to display one horizontal line of a screen and the vertical synchronization signal is a signal representing a time taken to display a screen of one frame. The input data enable signal may correspond to a signal indicating a period for which a data voltage is supplied to the pixel.

As an example, to control the gate driving circuit 130, the controller 140 outputs various gate control signals GCS including a gate start pulse, a gate shift clock, and a gate output enable signal.

To control the data driving circuit 120, the controller 140 outputs various data control signals DCS including, e.g., a source start pulse, a source sampling clock, and a source output enable signal.

The controller 140 may be implemented as a separate component from the data driving circuit 120, or the controller 140, along with the data driving circuit 120, may be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a 'source driving circuit.'

The data driving circuit 120 may include one or more source driver integrated circuit SDIC.

Each source driver integrated circuit (SDIC) may include a shift register, a latch circuit, a digital-to-analog converter (DAC), and an output buffer. In some cases, each source driver integrated circuit (SDIC) may further include an analog-digital converter ADC.

For example, each source driver integrated circuit (SDIC) may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate SUB or may be connected to the substrate SUB. In other words, the gate driving circuit 130 that is of a GIP type may be disposed in the non-display area NDA of the substrate SUB. The gate driving circuit 130 that is of a chip-on-glass (COG) type or chip-on-film (COF) type may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the subpixels SP or to overlap all or some of the subpixels SP.

When a selected gate line GL is driven by the gate driving circuit 130, the data driving circuit 120 may convert the image data Data received from the controller 140 into an analog data voltage and supply it to the plurality of data lines DL.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the gate driving scheme and the panel design scheme, gate driving circuits 130 may be connected with both the sides (e.g., both the left and right sides) of the display panel 110, or two or more of the four sides of the display panel 110.

The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit.

The controller 140 may transmit/receive signals to/from the data driving circuit 120 according to one or more predetermined interfaces. The interface may include, e.g., a low voltage differential signaling (LVDS) interface, an embedded clock point to point interface (EPI), and a serial peripheral interface (SPI).

The controller 140 may include a storage medium, such as one or more registers.

The display device 100 according to embodiments of the disclosure may be a display including a backlight unit, such as a liquid crystal display, or may be a self-emission display, such as an organic light emitting display device, a quantum dot display device, or an inorganic light emitting display device.

When the display device 100 according to embodiments of the disclosure is an organic light emitting display device, each subpixel SP may include an organic light emitting diode (OLED), which is self-emissive, as the light emitting element.

If the display device 100 according to embodiments of the disclosure is a quantum dot display device, each subpixel SP may include a light emitting element formed of a quantum dot, which is a self-emission semiconductor crystal.

If the display device 100 according to embodiments of the disclosure is an inorganic light emitting display device, each subpixel SP may include an inorganic light emitting element, which is self-emissive and formed of an inorganic material, as the light emitting element. For example, the inorganic light emitting element is also called a micro light emitting diode (LED), and the inorganic light emitting display device is also called a micro-LED display device.

Figure 2:
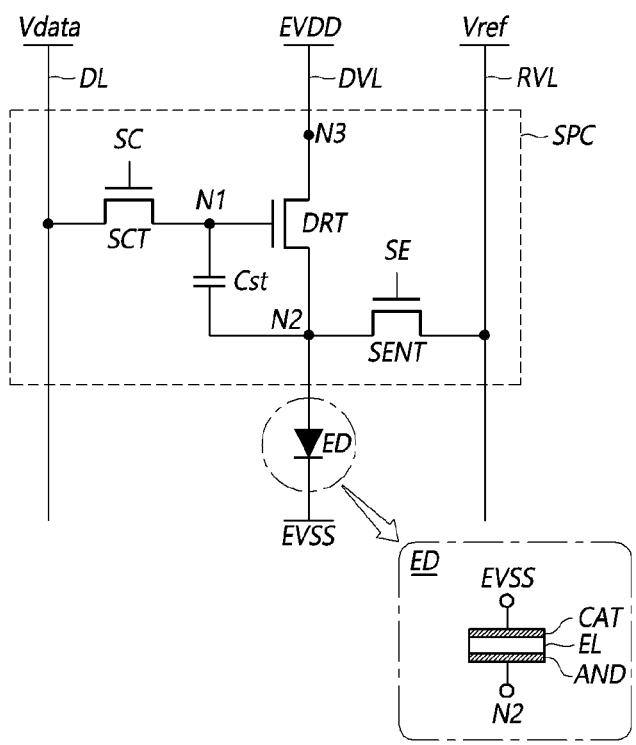
FIG. 2 is a diagram showing the equivalent circuit of a subpixel in a display panel according to embodiments of the present disclosure.

FIG. 2 is a diagram showing the equivalent circuit of a subpixel in a display panel according to embodiments of the present disclosure.

Referring to FIG. 2, each of the plurality of subpixels SP disposed on the display panel 110 of the display device 100 according to embodiments of the disclosure may include a light emitting element ED and a subpixel circuit SPC for driving the light emitting element ED.

The subpixel circuit SPC of each subpixel SP may include a driving transistor DRT, a scan transistor SCT, a sensing transistor SENT and a storage capacitor Cst. In this case, as the subpixel circuit SPC of each subpixel SP includes three transistors DRT, SCT, SENT and one capacitor Cst, it may be referred to as having a 3T (transistor) 1C (capacitor) structure.

Active layers of the driving transistor DRT, the scan transistor SCT, the sensing transistor SENT may be formed of a semiconductor material, such as an oxide semiconductor material, amorphous semiconductor material, polycrystalline semiconductor material, or organic semiconductor material, but are not limited thereto.

The oxide semiconductor material may have an excellent effect of preventing a leakage current and relatively inexpensive manufacturing cost. The oxide semiconductor may be made of a metal oxide such as zinc (Zn), indium (In), gallium (Ga), tin (Sn), and titanium (Ti) or a combination of a metal such as zinc (Zn), indium (In), gallium (Ga), tin (Sn), or titanium (Ti) and its oxide. Specifically, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), indium zinc oxide (IZO), indium gallium tin oxide (IGTO), and indium gallium oxide (IGO), but is not limited thereto.

The polycrystalline semiconductor material has a fast movement speed of carriers such as electrons and holes and thus has high mobility, and has low energy power consumption and superior reliability. The polycrystalline semiconductor may be made of polycrystalline silicon (poly-Si), but is not limited thereto.

The amorphous semiconductor material may be made of amorphous silicon (a-Si), but is not limited thereto.

The light emitting element ED may include an anode electrode AND and a cathode electrode CAT, and may include a light emitting layer EL positioned between the anode electrode AND and the cathode electrode CAT.

One of the anode electrode AND and the cathode electrode CAT may be a pixel electrode connected to a transistor, such as the driving transistor DRT, and the other may be a common electrode to which the common voltage is applied. Here, the pixel electrode is an electrode disposed in each subpixel SP, and the common electrode is an electrode commonly disposed in all subpixels SP. For example, the common voltage may be a high-level pixel high-potential voltage EVDD or a low-level pixel low-potential voltage EVSS. Here, the pixel high-potential voltage EVDD is also referred to as a driving voltage, and the pixel low-potential voltage EVSS is also referred to as a base voltage.

The anode electrode AND may be a pixel electrode connected to a transistor, such as the driving transistor DRT, and the cathode electrode CAT may be a common electrode to which the pixel low-potential voltage EVSS is applied.

The anode electrode AND may include a single layer or multiple layers including a transparent conductive material. For example, the transparent conductive material may include a material having a relatively high work function such as indium tin oxide (ITO) and indium zinc oxide (IZO).

The cathode electrode CAT may include a single layer or multiple layers including an opaque conductive material having a relatively high reflection efficiency. For example, the opaque conductive material may include a material having a relatively low work function such as aluminum (Al), silver (Ag), copper (Cu), lead (Pb), molybdenum (Mo), titanium (Ti) and an alloy thereof, and the present disclosure is not limited thereto.

For example, the light emitting element ED may be an organic light emitting diode OLED, an inorganic material-based light emitting diode LED, or a quantum dot light emitting element.

The driving transistor DRT is a transistor for driving the light emitting element ED, and may include a first node N1, a second node N2, and a third node N3.

The first node N1 of the driving transistor DRT may be a gate node of the driving transistor DRT, and may be electrically connected with a source node or a drain node of the scan transistor SCT. The second node N2 of the driving transistor DRT may be a source node or a drain node of the driving transistor DRT, and may be electrically connected to the anode electrode AND of the light emitting element ED. The third node N3 of the driving transistor DRT may be electrically connected with a pixel driving voltage line DVL supplying a pixel high-potential voltage EVDD.

The scan transistor SCT may be controlled by a scan signal SC, which is a type of gate signal, and may be connected between the first node N1 of the driving transistor DRT and the data line DL. In other words, the scan transistor SCT may be turned on or off according to the scan signal SC supplied from the scan signal line SCL, which is a type of the gate line GL, controlling the connection between the data line DL and the first node N1 of the driving transistor DRT.

The scan transistor SCT may be turned on by the scan signal SC having a turn-on level voltage and transfer the data voltage Vdata supplied from the data line DL to the first node N1 of the driving transistor DRT.

If the scan transistor SCT is an n-type transistor, the turn-on level voltage of the scan signal SC may be a high-level voltage. If the scan transistor SCT is a p-type transistor, the turn-on level voltage of the scan signal SC may be a low-level voltage. Hereinafter, the scan transistor SCT is exemplified as an n-type transistor. Accordingly, the turn-on level voltage is exemplified as a high-level voltage.

The sensing transistor SENT may be controlled by the sensing signal SE which is a type of gate signal, and may be connected between the second node N2 of the driving transistor DRT and the reference voltage line RVL. In other words, the sensing transistor SENT may be turned on or turned off according to the sensing signal SE supplied from the sensing signal line SENL which is a type of gate line GL, and may control the connection between the reference voltage line RVL and the second node N2 of the driving transistor DRT.

The sensing transistor SENT may be turned on by the turn-on level sense signal SENSE and transfer a reference voltage Vref supplied from the reference voltage line RVL to the second node N2 of the driving transistor DRT. Here, the sensing signal SE may be referenced as a second scan signal different from the scan signal SC.

In addition, the sensing transistor SENT may be turned on by the sensing signal SE having a turn-on level voltage, and may transfer the voltage of the second node N2 of the driving transistor DRT to the reference voltage line RVL.

If the sensing transistor SENT is an n-type transistor, the turn-on level voltage of the sensing signal SE may be a high-level voltage. If the sensing transistor SENT is a p-type transistor, the turn-on level voltage of the sensing signal SE may be a low-level voltage. Hereinafter, the sensing transistor SENT is exemplified as an n-type transistor. Accordingly, the turn-on level voltage is exemplified as a high-level voltage The function of the sensing transistor SENT to transfer the voltage of the second node N2 of the driving transistor DRT to the reference voltage line RVL may be used to sense the characteristic value of the subpixel SP. In this case, the voltage transmitted to the reference voltage line RVL may be a voltage for calculating the characteristic value of the subpixel SP or a voltage reflecting the characteristic value of the subpixel SP.

In the present disclosure, the characteristic value of the subpixel SP may be the characteristic value of the driving transistor DRT or the light emitting element ED. For example, the characteristic values of the driving transistor DRT may include the threshold voltage and mobility of the driving transistor DRT. The characteristic value of the light emitting element ED may include the threshold voltage of the light emitting element ED.

The storage capacitor Cst may be electrically connected between the first node N1 and second node N2 of the driving transistor DRT. The storage capacitor Cst may be charged with the quantity of electric charge corresponding to the voltage difference between both ends thereof and may serve to maintain the voltage difference between both ends for a predetermined frame time. Accordingly, during the predetermined frame time, the corresponding subpixel SP may emit light.

Each of the driving transistor DRT, the scan transistor SCT and the sensing transistor SENT may be an n-type transistor or a p-type transistor. In the disclosure, for convenience of description, each of the driving transistor DRT, the scan transistor SCT and the sensing transistor SENT is an n-type transistor.

The storage capacitor Cst is not a parasitic capacitor (e.g., Cgs or Cgd) which is an internal capacitor existing between the gate node and the source node (or drain node) of the driving transistor DRT, but may be an external capacitor intentionally designed outside the driving transistor DRT.

The subpixel SP illustrated herein is merely an example, and various changes may be made thereto, e.g., such as further including one or more transistors or one or more capacitors. For example, a number of transistors TFTs in the pixel circuit of the present disclosure may be three or more, and a number of capacitors may be one or more. For example, each of the first, second, third and fourth subpixels SP1, SP2, SP3 and SP4 or each of the first, second, and third subpixels SP1, SP2, and SP3 may have one of 3T1C structure including three transistors and one capacitor, 6T1C structure including six transistors and one capacitor, 7T1C structure including seven transistors and one capacitor and 8T1C structure including eight transistors and one capacitor, and exemplary embodiments of the present disclosure are not limited thereto.

Figure 3:
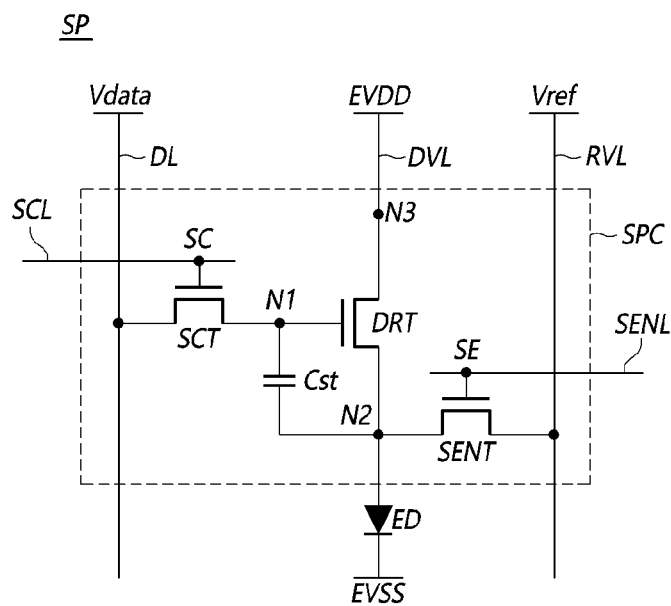
FIG. 3 illustrates an equivalent circuit of a subpixel having a 2-gate driven structure in a display panel according to embodiments of the disclosure.

FIG. 3 illustrates an equivalent circuit of a subpixel having a 2-gate driven structure in a display panel according to embodiments of the disclosure.

The subpixel circuit SPC of the subpixel SP in FIG. 3 has the same 3T1C structure as that of FIG. 2. The subpixel SP in FIG. 3 may have a 2-gate driven structure.

As shown in FIG. 3, when the subpixel SP has a 2-gate driven structure, the subpixel SP may be connected to two gate lines GL including the scan signal line SCL and the sensing signal line SENL.

Referring to FIG. 3, in the subpixel circuit SPC of the subpixel SP having the 2-gate driven structure, the gate node of the scan transistor SCT may be connected to the scan signal line SCL, and the gate node of the sensing transistor SENT may be connected to the sensing signal line SENL. Accordingly, the scan transistor SCT and sensing transistor SENT may operate independently of each other.

The subpixel circuit SPC of the subpixel SP having 2-gate driven structure may receive the scan signal SC through the scan signal line SCL and receive the scan signal SC through the sensing signal line SENL. In the subpixel circuit SPC of the subpixel SP having the 2-gate driven structure, the gate node of the scan transistor SCT may receive the scan signal SC through the scan signal line SCL, and the gate node of the sensing transistor SENT may receive the sensing signal SE through the sensing signal line SENL.

When the subpixel SP has the 2-gate driven structure, the on-off timings of the scan transistor SCT and the on-off timings of the sensing transistor SENT in one subpixel SP may be independent. In other words, when the subpixel SP has the 2-gate driven structure, the on-off timings of the scan transistor SCT and the on-off timings of the sensing transistor SENT in one subpixel SP may be different or identical.

Figure 4:
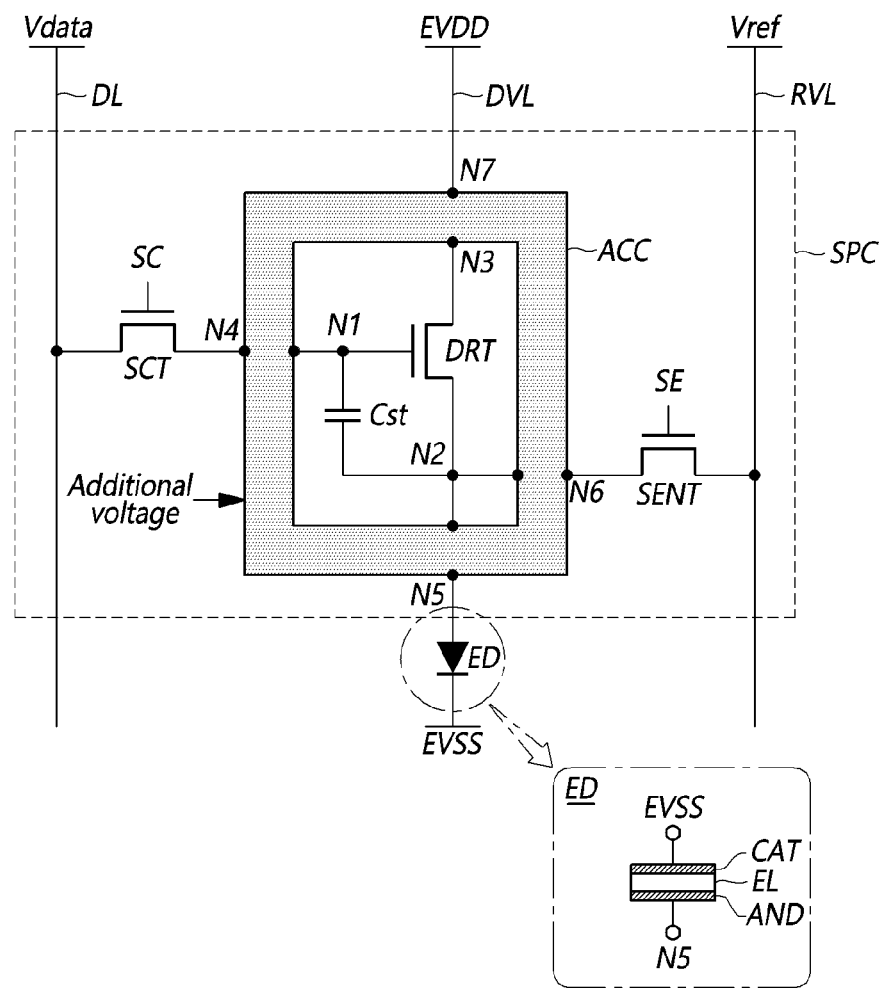
FIG. 4 is a diagram showing another equivalent circuit of a subpixel in a display panel according to embodiments of the present disclosure.

FIG. 4 is a diagram showing another equivalent circuit of a subpixel in a display panel according to embodiments of the present disclosure.

Referring to FIG. 4, the subpixel SP may include a light emitting element ED and a subpixel circuit SPC for driving the light emitting element ED. The subpixel circuit SPC may include an additional control circuit ACC in addition to the driving transistor DRT, scan transistor SCT, sensing transistor SENT, and storage capacitor Cst.

The additional control circuit ACC may include one or more transistors and/or one or more capacitors.

The additional control circuit ACC may include a fourth node N4 electrically connected to the source node or drain node of the scan transistor SCT, a fifth node N5 electrically connected to the anode electrode AND of the light emitting element ED, a sixth node N6 electrically connected to the source node or drain node of the sensing transistor SENT, and a seventh node N7 electrically connected to the high potential voltage line DVL.

The additional control circuit ACC may be supplied with additional voltage, if required.

Referring to FIG. 4, when the fourth node N4 and the first node N1 are electrically connected and the fifth node N5, the sixth node N6 and the second node N2 are electrically connected, and the seventh node N7 and the third node N3 are electrically connected by the additional control circuit ACC, the subpixel SP of FIG. 4 may become the same as the subpixel SP of FIG. 2.

For example, the additional control circuit ACC may include an emission control transistor that controls the connection between the second node N2 and the fifth node N5. As another example, the additional control circuit ACC may include an emission control transistor that controls the connection between the seventh node N7 and the third node N3.

Figure 5:
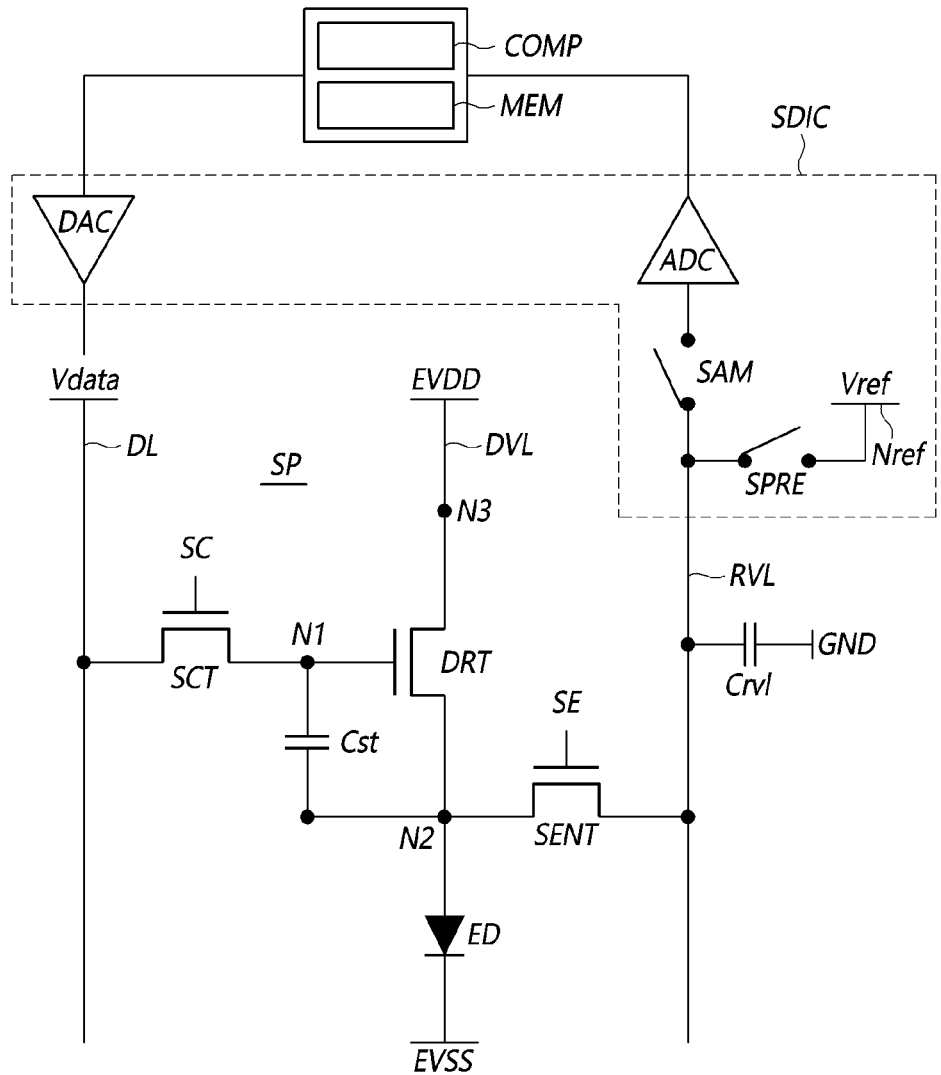
FIG. 5 is a view illustrating a compensation circuit of a display device according to embodiments of the disclosure.

FIG. 5 is a view illustrating a compensation circuit of a display device according to embodiments of the disclosure. the subpixel FIG. 5 takes the subpixel of FIG. 2 as an example.

Referring to FIG. 5, the compensation circuit is a circuit capable of sensing and compensation processing on characteristic values of circuit elements in the subpixel SP. Here, the circuit element may mean, e.g., a light emitting element ED or a driving transistor DRT.

The compensation circuit may include a power switch SPRE, a sampling switch SAM, an analog-to-digital converter ADC, a compensator COMP, and a memory MEM. The compensation circuit may further include a subpixel SP.

The power switch SPRE may control the connection between the reference voltage line RVL and the reference voltage supply node Nref. The reference voltage Vref output from the power supply may be supplied to the reference voltage supply node Nref, and the reference voltage Vref supplied to the reference voltage supply node Nref may be applied to the reference voltage line RVL through the power switch SPRE.

The sampling switch SAM may control a connection between the analog-to-digital converter ADC and the reference voltage line RVL. If connected to the reference voltage line RVL by the sampling switch SAM, the analog-to-digital converter ADC may convert the voltage (analog voltage) of the connected reference voltage line RVL into a sensing value corresponding to a digital value.

According to the driving of the subpixel SP, a line capacitor Crvl may be formed between the reference voltage line RLV and the ground GND. The voltage of the reference voltage line RVL may correspond to the charge amount of the line capacitor Crvl.

The analog-to-digital converter ADC may provide sensing data including a sensing value to the compensator COMP.

The compensator COMP may figure out characteristic values of the circuit elements (e.g., the light emitting element ED, the driving transistor DRT, etc.) included in the corresponding subpixel SP based on the sensing data supplied from the analog-to-digital converter ADC, calculate a compensation value for reducing a deviation in characteristic value between the circuit elements based on the characteristic values, and store the calculated compensation value in the memory MEM.

For example, the compensation value is information calculated for reducing a deviation in characteristic value between the light emitting elements ED or a deviation in characteristic value between the driving transistors DRT and may include an offset and a gain value for data change.

The controller 140 may change the image data using the compensation value stored in the memory MEM and may supply the changed image data to the data driving circuit 120.

The data driving circuit 120 may convert the changed image data into a data voltage Vdata corresponding to the analog voltage using the digital-to-analog converter DAC and output the data voltage Vdata. Accordingly, compensation may be realized.

The analog-to-digital converter ADC, the power switch SPRE, and the sampling switch SAM may be included in the source driver integrated circuit SDIC. Here, the source driver integrated circuit SDIC may be an integrated circuit that constitutes the data driving circuit 120 and may include a digital-to-analog converter DAC.

The compensator COMP may be included in the controller 140.

As described above, the display device 100 according to embodiments of the disclosure may perform compensation processing to reduce a deviation in characteristic value between the driving transistors DRT. To perform compensation processing, the display device 100 may perform sensing driving to detect the deviation in characteristic value between the driving transistors DRT.

The display device 100 according to embodiments of the disclosure may perform sensing driving in two sensing modes (first sensing mode and second sensing mode). Sensing driving in the two sensing modes (first sensing mode and second sensing mode) is described below with reference to FIGS. 6A and 6B.

Figure 6A:
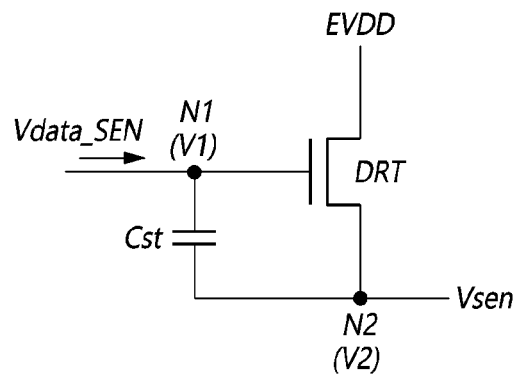
FIGS. 6A and 6B are diagrams illustrating a first sensing mode and a second sensing mode of a display device according to embodiments of the disclosure.
Figure 6A:
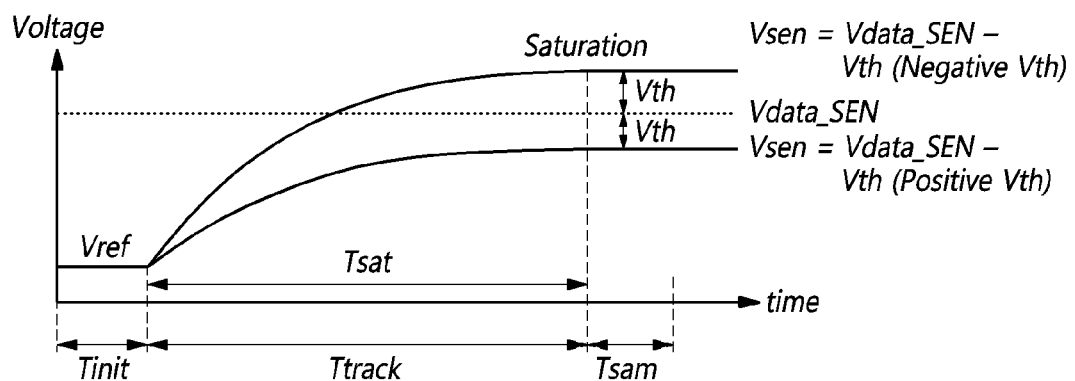
Figure 6B:
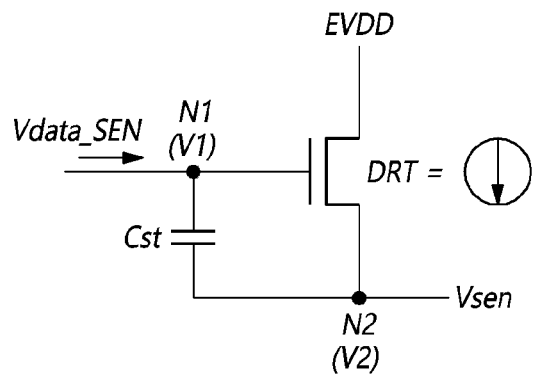
Figure 6B:
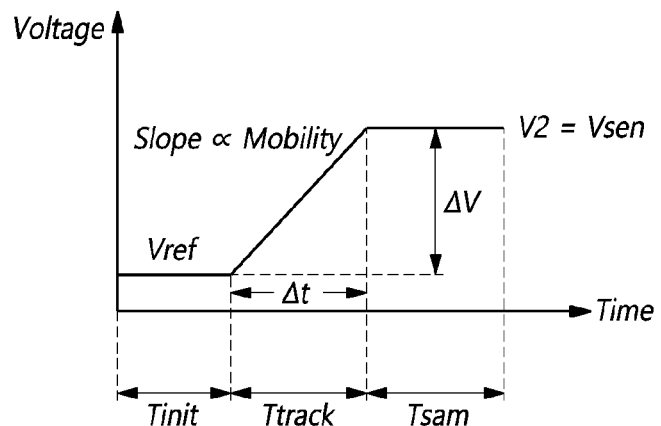

FIGS. 6A and 6B are diagrams illustrating a first sensing mode and a second sensing mode of a display device according to embodiments of the disclosure.

Referring to FIG. 6A, "first sensing mode" is a sensing mode for sensing the threshold voltage requiring a relatively long sensing time among the characteristic values (e.g., threshold voltage and mobility) of the driving transistor DRT. The first sensing mode may also be referred to as a "slow sensing mode" or a "threshold voltage sensing mode".

Referring to FIG. 6B, "second sensing mode" is a sensing mode for sensing the mobility requiring a relatively short sensing time among the characteristic values (e.g., threshold voltage and mobility) of the driving transistor DRT. The second sensing mode may also be referred to as a "fast sensing mode" or a "mobility sensing mode".

Sensing driving in the first sensing mode and sensing driving in the second sensing mode are described below.

First, referring to FIG. 6A, sensing driving in the first sensing mode is described.

Referring to FIG. 6A, the sensing driving period in the first sensing mode may include an initialization period Tinit, a tracking period Ttrack, and a sampling period Tsam.

The initialization period Tinit of the sensing driving period of the first sensing mode is a period for initializing the first node N1 and the second node N2 of the driving transistor DRT.

During the initialization period Tinit, the voltage V1 of the first node N1 of the driving transistor DRT may be initialized as a sensing driving data voltage Vdata_SEN, and the voltage V2 of the second node N2 of the driving transistor DRT may be initialized as a sensing driving reference voltage Vref.

During the initialization period Tinit, the scan transistor SCT and the sensing transistor SENT may be turned on, and the power switch SPRE may be turned on.

The tracking period Ttrack of the sensing driving period of the first sensing mode is a period for tracking the voltage V2 of the second node N2 of the driving transistor DRT reflecting the threshold voltage Vth of the driving transistor DRT or a change therein.

During the tracking period Ttrack, the power switch SPRE may be turned off, or the sensing transistor SENT may be turned off.

Accordingly, during the tracking period Ttrack, the first node N1 of the driving transistor DRT is in a constant voltage state of having the sensing driving data voltage Vdata_SEN, but the second node N2 of the driving transistor DRT may be in an electrically floating state. Accordingly, during the tracking period Ttrack, the voltage V2 of the second node N2 of the driving transistor DRT may be varied.

During the tracking period Ttrack, the voltage V2 of the second node N2 of the driving transistor DRT may increase until the voltage V2 of the second node N2 of the driving transistor DRT reflects the threshold voltage Vth of the driving transistor DRT.

During the initialization period Tinit, the voltage difference between the first node N1 and second node N2 of the initialized driving transistor DRT may be the threshold voltage Vth of the driving transistor DRT or more. Accordingly, when the tracking period Ttrack starts, the driving transistor DRT is in a turn-on state and conducts current. Accordingly, if the tracking period Ttrack starts, the voltage V2 of the second node N2 of the driving transistor DRT may increase.

During the tracking period Ttrack, the voltage V2 of the second node N2 of the driving transistor DRT does not steadily increase.

To the end of the tracking period Ttrack, the width at which the voltage of the second node N2 of the driving transistor DRT increase may be reduced and, resultantly, the voltage V2 of the second node N2 of the driving transistor DRT may be saturated.

The saturated voltage V2 of the second node N2 of the driving transistor DRT may correspond to the difference Vdata_SEN−Vth between the data voltage Vdata_SEN and the threshold voltage Vth or the difference Vdata_SEN−ΔVth between the data voltage Vdata_SEN and the threshold voltage deviation ΔVth. Here, the threshold voltage Vth may be a negative threshold voltage (Negative Vth) or a positive threshold voltage (Positive Vth).

If the voltage V2 of the second node N2 of the driving transistor DRT is saturated, the sampling period Tsam may be started.

The sampling period Tsam of the sensing driving period of the first sensing mode is a period for measuring the voltage (Vdata_SEN−Vth, Vdata_SEN−ΔVth) reflecting the threshold voltage Vth of the driving transistor DRT or a change therein.

The sampling period Tsam of the sensing driving period of the first sensing mode is a step in which the analog-to-digital converter ADC senses the voltage of the reference voltage line RVL. The voltage of the reference voltage line RVL may correspond to the voltage V2 of the second node N2 of the driving transistor DRT and correspond to the charged voltage of the line capacitor Crvl formed in the reference voltage line RVL.

During the sampling period Tsam, the voltage Vsen sensed by the analog-to-digital converter ADC is the voltage Vdata_SEN−Vth which is the data voltage Vdata_SEN minus the threshold voltage Vth or the voltage Vdata_SEN−ΔVth which is the data voltage Vdata_SEN minus the threshold voltage deviation ΔVth. Here, Vth may be a positive threshold voltage or a negative threshold voltage.

During the tracking period Ttrack of the sensing driving period of the first sensing mode, the saturation time Tsat taken for the voltage V2 of the second node N2 of the driving transistor DRT to be increased and saturated may be a temporal length of the tracking period Ttrack of the sensing driving period of the first sensing mode and may be a time taken for the threshold voltage Vth of the driving transistor DRT or a change therein to be reflected to the voltage V2 (V2=Vdata_SEN−Vth) of the second node N2 of the driving transistor DRT.

The saturation time Tsat may occupy most of the overall temporal length of the sensing driving period of the first sensing mode. In the first sensing mode, it may take a quite long time (saturation time: Tsat) for the voltage V2 of the second node N2 of the driving transistor DRT to be increased and saturated.

As described above, the sensing driving scheme for sensing the threshold voltage of the driving transistor DRT requires a long saturation time Tsat until the voltage state of the second node N2 of the driving transistor DRT indicates the threshold voltage of the driving transistor DRT and is thus referred to as a slow mode (first sensing mode).

Next, referring to FIG. 6B, a sensing driving period in the second sensing mode is described.

Referring to FIG. 6B, the sensing driving period in the second sensing mode may include an initialization period Tinit, a tracking period Ttrack, and a sampling period Tsam.

The initialization period Tinit of the sensing driving period of the second sensing mode is a period for initializing the first node N1 and the second node N2 of the driving transistor DRT.

During the initialization period Tinit, the scan transistor SCT and the sensing transistor SENT may be turned on, and the power switch SPRE may be turned on.

During the initialization period Tinit, the voltage V1 of the first node N1 of the driving transistor DRT may be initialized as a sensing driving data voltage Vdata_SEN, and the voltage V2 of the second node N2 of the driving transistor DRT may be initialized as a sensing driving reference voltage Vref.

The tracking period Ttrack of the sensing driving period of the second sensing mode is a period during which the voltage V2 of the second node N2 of the driving transistor DRT is changed during a preset tracking time Δt until the voltage V2 of the second node N2 of the driving transistor DRT becomes a voltage state of reflecting the mobility of the driving transistor DRT or a change in mobility.

During the tracking period Ttrack, the preset tracking time Δt may be set to be short. Accordingly, during the short tracking time Δt, it is hard for the voltage V2 of the second node N2 of the driving transistor DRT to reflect the threshold voltage Vth. However, during the short tracking time Δt, the voltage V2 of the second node N2 of the driving transistor DRT may be changed in such an extent as to be able to figure out the mobility of the driving transistor DRT.

Accordingly, the second sensing mode is a sensing driving scheme for sensing the mobility of the driving transistor DRT.

In the tracking period Ttrack, as the power switch SPRE is turned off or the sensing transistor SENT is turned off, the second node N2 of the driving transistor DRT may become an electrically floating state.

During the tracking period Ttrack, by the scan signal SC of the turn-off level voltage, the scan transistor SCT may be in a turned-off state, and the first node N1 of the driving transistor DRT may be in a floating state.

During the initialization period Tinit, the voltage difference between the first node N1 and second node N2 of the initialized driving transistor DRT may be the threshold voltage Vth of the driving transistor DRT or more. Accordingly, when the tracking period Ttrack starts, the driving transistor DRT is in a turn-on state and conducts current.

If the first node N1 and second node N2 of the driving transistor DRT are the gate node and source node, respectively, the voltage difference between the first node N1 and second node N2 of the driving transistor DRT becomes Vgs.

Accordingly, during the tracking period Ttrack, the voltage V2 of the second node N2 of the driving transistor DRT may be increased. In this case, the voltage V1 of the first node N1 of the driving transistor DRT may also be increased.

During the tracking period Ttrack, the increasing rate of the voltage V2 of the second node N2 of the driving transistor DRT is varied depending on the current capability (i.e., mobility) of the driving transistor DRT. As the current capability (mobility) of the driving transistor DRT increases, the voltage V2 of the second node N2 of the driving transistor DRT may be further sharply increased.

After the tracking period Ttrack proceeds the preset tracking time Δt, i.e., after the voltage V2 of the second node N2 of the driving transistor DRT rises during the preset tracking time Δt, the sampling period Tsam may proceed.

During the tracking period Ttrack, the increasing rate of the voltage V2 of the second node N2 of the driving transistor DRT corresponds to the voltage variation ΔV of the second node N2 of the driving transistor DRT during the preset tracking time Δt. The voltage variation Δt of the second node N2 of the driving transistor DRT may correspond to the voltage variation of the reference voltage line RVL.

After the tracking period Ttrack proceeds the preset tracking time Δt, the sampling period Tsam may begin. During the sampling period Tsam, the sampling switch SAM may be turned on, so that the reference voltage line RVL and the analog-to-digital converter ADC may be electrically connected with each other.

The analog-to-digital converter ADC may sense the voltage of the reference voltage line RVL. The voltage Vsen sensed by the analog-to-digital converter ADC may be the voltage Vref+ΔV which is the reference voltage Vref plus an increment during the preset tracking time Δt, i.e., the voltage variation Δt.

The voltage Vsen sensed by the analog-to-digital converter ADC may be the voltage of the reference voltage line RVL and may be the voltage of the second node N2 electrically connected with the reference voltage line RVL through the sensing transistor SENT.

In the sampling period Tsam of the sensing driving period of the second sensing mode, the voltage Vsen sensed by the analog-to-digital converter ADC may be varied depending on the mobility of the driving transistor DRT. As the mobility of the driving transistor DRT increases, the sensing voltage Vsen increases. As the mobility of the driving transistor DRT decreases, the sensing voltage Vsen decreases.

As described above, the sensing driving scheme for sensing the mobility of the driving transistor DRT may change the voltage of the second node N2 of the driving transistor DRT only for a short time Δt and is thus called a fast mode (second sensing mode).

Referring to FIG. 6A, the compensator COMP may figure out the threshold voltage Vth of the driving transistor DRT, or a change therein, in the corresponding subpixel SP based on sensing data corresponding to the voltage Vsen sensed through the first sensing mode, calculate the threshold voltage compensation value of reducing or removing the threshold voltage deviation between the driving transistors DRT, and store the calculated threshold voltage compensation value in the memory MEM.

Referring to FIG. 6B, the compensator COMP may figure out the mobility of the driving transistor DRT, or a change therein, in the corresponding subpixel SP based on sensing data corresponding to the voltage Vsen sensed through the second sensing mode, calculate the mobility compensation value of reducing or removing the mobility deviation between the driving transistors DRT, and store the calculated mobility compensation value in the memory MEM.

The controller 140 may change the data based on the threshold voltage compensation value $\Phi$ and the mobility compensation value $\alpha$ stored in the memory MEM, and supply the changed data (Data'=$\alpha$×Data+$\Phi$ to the data driving circuit 120.

The data driving circuit 120 may convert the data (Data'=$\alpha$×Data+$\Phi$ supplied from the controller 140 into the data voltage Vdata and supply the converted data to the corresponding sub-pixel SP. Here, the data voltage Vdata supplied to the corresponding subpixel SP may be a data voltage Vata capable of reducing the threshold voltage deviation and the mobility deviation.

Meanwhile, as described above, since a long sensing time is required for threshold voltage sensing and a short sensing time is sufficient for mobility sensing, threshold voltage sensing may be performed in the first sensing mode corresponding to a slow sensing mode, and mobility sensing may be performed in the second sensing mode corresponding to a fast sensing mode.

Figure 7:
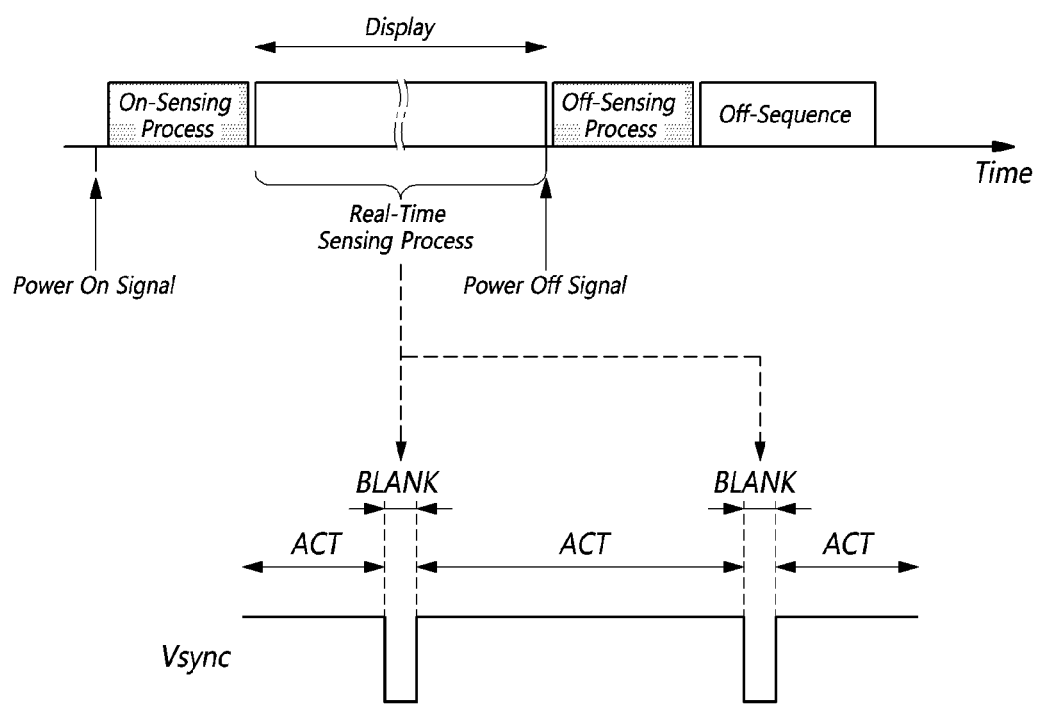
FIG. 7 is a diagram illustrating various sensing driving timings (various sensing periods) of a display device according to embodiments of the disclosure.

FIG. 7 is a diagram illustrating various sensing driving timings (various sensing periods) of a display device according to embodiments of the disclosure.

Referring to FIG. 7, the display device 100 according to embodiments of the disclosure may sense the characteristic value of the driving transistor DRT in each subpixel SP disposed in the display panel 110 if a power on signal is generated. Such sensing process is referred to as an on-sensing process.

The display device 100 according to embodiments of the disclosure may sense the characteristic value of the driving transistor DRT in each subpixel SP disposed in the display panel 110 before an off sequence, such as power off, proceeds if a power off signal is generated. Such sensing process is referred to as an off-sensing process.

The display device 100 according to embodiments of the disclosure may sense the characteristic value of the driving transistor DRT in each subpixel SP during display driving until before a power off signal is generated after a power on signal is generated. Such sensing process is referred to as a "real-time sensing process."

Such real-time (RT) sensing process may be performed every blank time BLANK between the active times ACT with respect to the vertical sync signal Vsync.

Since a short time is sufficient for the mobility sensing of the driving transistor DRT, the mobility sensing may proceed in the second sensing mode corresponding to a fast-sensing mode of the two sensing modes.

Since a short time is sufficient for mobility sensing, mobility sensing may proceed in any one of the on-sensing process, off-sensing process, and real-time sensing process. For example, the mobility sensing which may proceed in the second sensing mode may proceed in the real-time sensing process that may reflect changes in mobility in real-time during display driving. In other words, the mobility sensing may proceed every blank period BLANK during display driving.

Threshold voltage sensing of the driving transistor DRT requires a long sensing time including a long saturation time Vsat. Accordingly, threshold voltage sensing may be performed in the first sensing mode corresponding to the slow sensing mode of the two sensing modes.

The threshold voltage sensing has a long sensing time and thus should be performed using a timing when the user's viewing is not disturbed. Accordingly, the threshold voltage sensing of the driving transistor DRT may proceed while display driving is not done (i.e., the circumstance where the user does not intend to view) after a power off signal is generated according to, e.g., a user input. In other words, the threshold voltage sensing may proceed in the off-sensing process.

Figure 8:
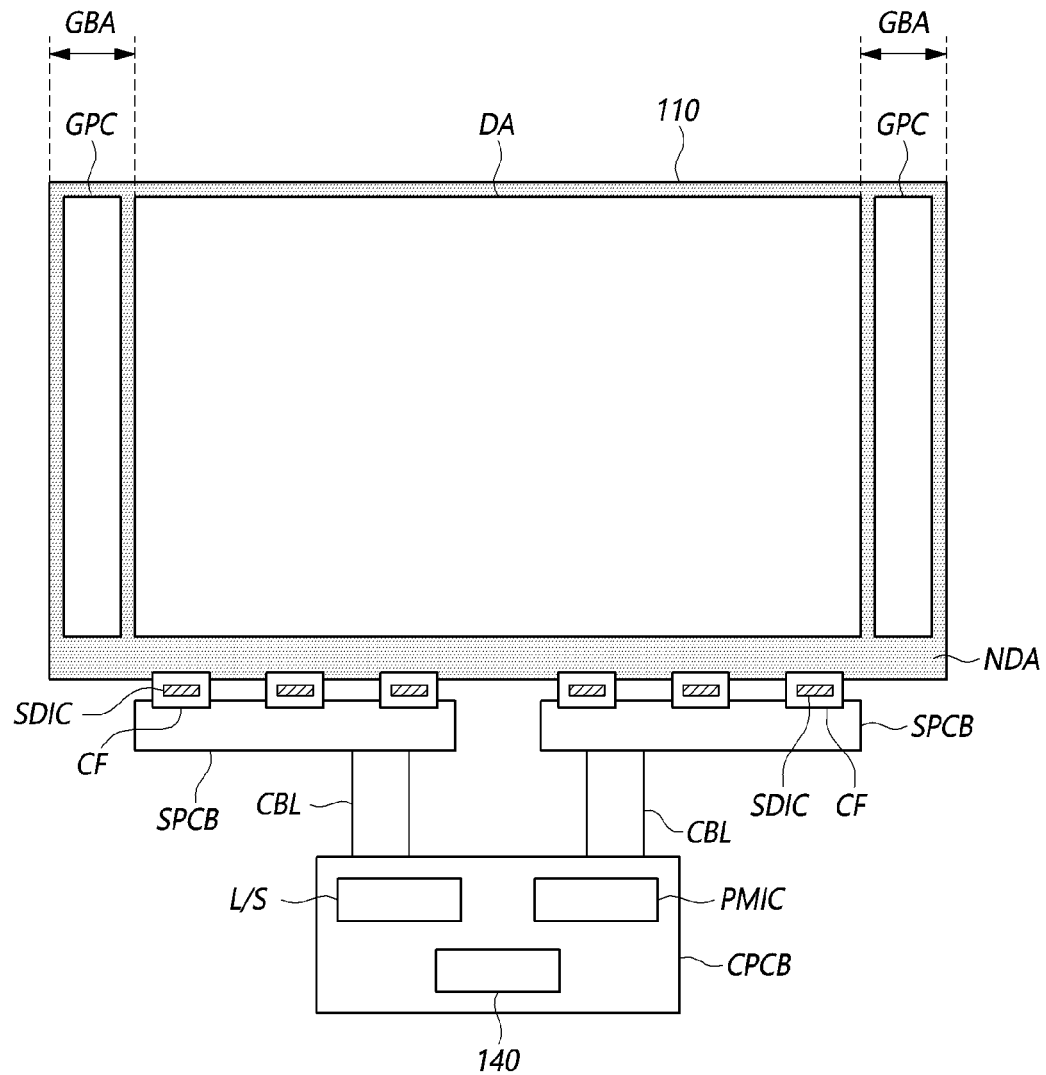
FIG. 8 is a view illustrating an example system implementation of a display device according to embodiments of the disclosure.

FIG. 8 is a view illustrating an example system implementation of a display device according to embodiments of the disclosure.

Referring to FIG. 8, the display panel 110 may include a display area DA in which images are displayed and a non-display area NDA in which no image is displayed.

According to the implementation example of FIG. 8, the data driving circuit 120 may include a plurality of source driver integrated circuits SDIC and may be implemented in a chip on film (COF) method. Each of the plurality of source driver integrated circuits SDIC may be mounted on the circuit film CF connected to the non-display area NDA of the display panel 110. Here, the circuit film CF is also referred to as a flexible printed circuit.

The gate driving circuit 130 may be implemented in a gate in panel (GIP) type. Hereinafter, the gate driving circuit 130 implemented in the GIP type is also referred to as a "gate driving panel circuit GPC".

The gate driving panel circuit GPC may be formed in the non-display area NDA of the display panel 110. According to the implementation example of FIG. 8, the gate driving panel circuit GPC may be disposed in both the non-display area NDA positioned outside one side of the display area DA and the non-display area NDA positioned outside the other side of the display area DA.

The display device 100 may include at least one source printed circuit board SPCB for a circuit connection between the plurality of source driver integrated circuits SDIC and the other devices (e.g., 140, L/S, PMIC, etc.), and a control printed circuit board CPCB for mounting control components and various electric devices.

The circuit film CF on which the source driver integrated circuit SDIC is mounted may be connected to at least one source printed circuit board SPCB. In other words, one side of the source driver integrated circuit SDIC-mounted circuit film CF may be electrically connected with the display panel 110, and the opposite side thereof may be electrically connected with the source printed circuit board SPCB.

The controller 140, the power management integrated circuit PMIC, and the like may be mounted on the control printed circuit board CPCB.

The controller 140 may perform an overall control function related to driving of the display panel 110, and may control operations of the plurality of source driver integrated circuits SDIC and the gate driving panel circuit GPC.

The power management integrated circuit PMIC may supply various voltages or currents to the plurality of source driver integrated circuits SDIC, gate driving panel circuit GPC, or the like, or may control various voltages or currents to be supplied.

At least one source printed circuit board SPCB and the control printed circuit board CPCB may be circuit-connected through at least one connection cable CBL. Here, the connection cable CBL may be, e.g., either a flexible printed circuit (FPC) or a flexible flat cable (FFC).

The at least one source printed circuit board SPCB and control printed circuit board CPCB may be integrated into a single printed circuit board.

The display device 100 according to embodiments of the disclosure may further include a level shifter L/S for adjusting the voltage level of signal. For example, the level shifter L/S may be disposed on a control printed circuit board CPCB or a source printed circuit board SPCB.

In the display device 100 according to embodiments of the disclosure, the level shifter L/S may output signals required for gate driving to the gate driving panel circuit GPC which is the GIP-type gate driving circuit 130.

For example, the power management integrated circuit PMIC may output a signal to the level shifter L/S. The level shifter L/S may adjust the voltage level of the signal input from the power management integrated circuit PMIC. The signal of which the voltage level is adjusted by the level shifter L/S may be input to the gate driving panel circuit GPC.

For example, the level shifter L/S may output a plurality of clock signals having different phases to the gate driving panel circuit GPC. The gate driving panel circuit GPC may generate a plurality of gate signals (e.g., the scan signal SC, the sensing signal SE, etc.) based on the plurality of clock signals input from the level shifter L/S and output the generated plurality of gate signals to a plurality of gate lines (e.g., the scan signal line SCL, the sensing signal line SENL, etc.).

The non-display area NDA of the display panel 110 may include a gate bezel area GBA. The gate bezel area GBZ may refer to an area in which the gate driving panel circuit GPC, which is the GIP-type gate driving circuit 130, and various lines connected to the gate driving panel circuit GPC are disposed.

Various lines connected to the gate driving panel circuit GPC may include a plurality of clock lines, a high-level gate voltage line, and a low-level gate voltage line.

Described below is the structure of the gate driving panel circuit GPC and the gate bezel area GBA in which the gate driving panel circuit GPC is disposed according to embodiments of the disclosure.

Figure 9:
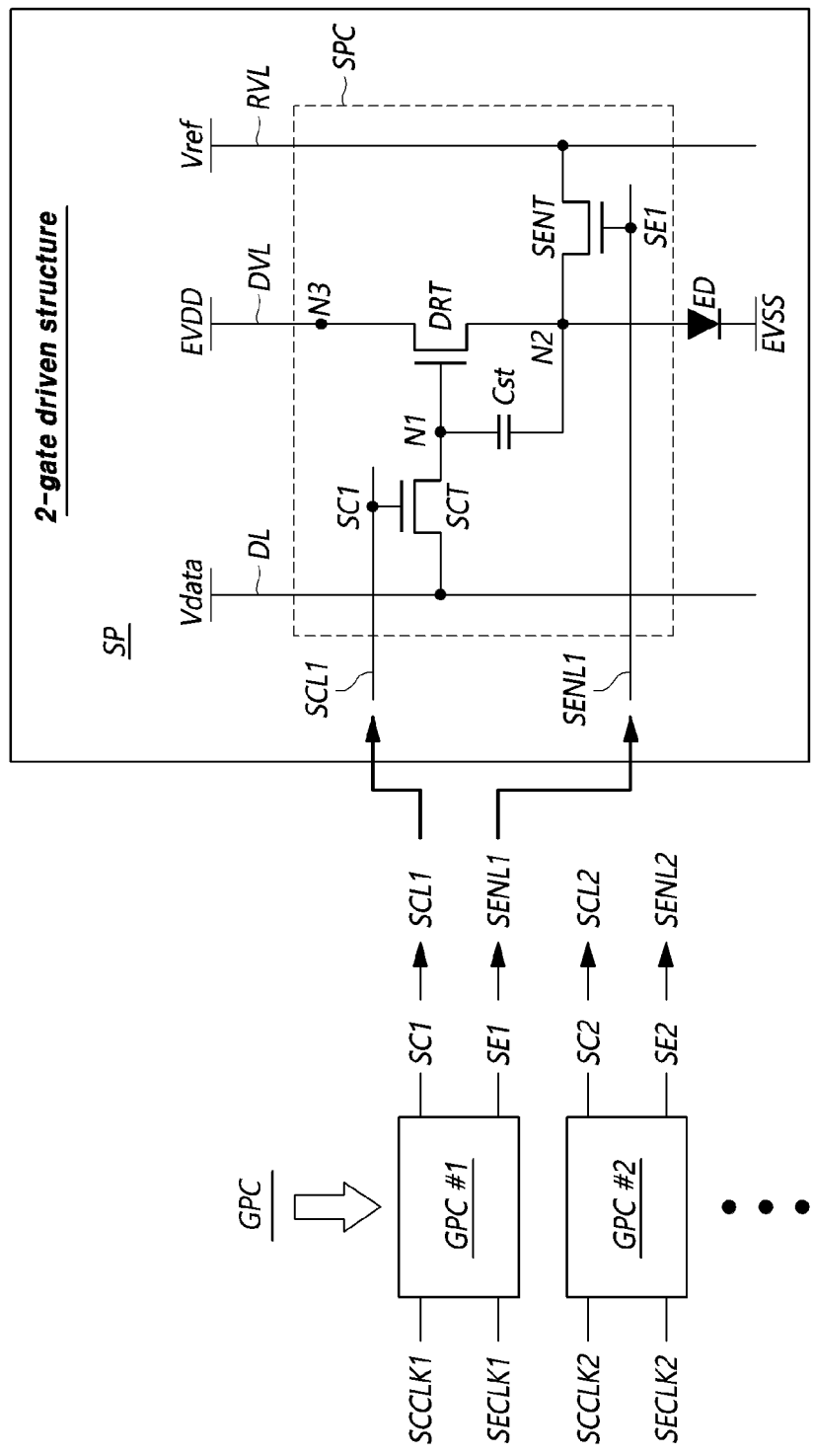
FIG. 9 illustrates an input and output of a gate driving panel circuit according to embodiments of the disclosure.

FIG. 9 illustrates an input and output of a gate driving panel circuit according to embodiments of the disclosure.

Referring to FIG. 9, the gate driving panel circuit GPC according to embodiments of the disclosure may include a first gate driving panel circuit GPC #1 for generating the first scan signal SC1 and the first sensing signal SE1, and a second gate driving panel circuit GPC #2 for generating a second scan signal SC2 and a second sensing signal SE2.

The first gate driving panel circuit GPC #1 may receive a first scan clock signal SCCLK1 and a first sensing clock signal SECLK1, and generate a first scan signal SC1 and a first sensing signal SE1.

The first scan clock signal SCCLK1 and the first sensing clock signal SECLK1 may be output from the level shifter L/S.

The first scan signal SC1 and the first sensing signal SE1 may be applied to the first scan signal line SCL1 and the first sensing signal line SENL1, respectively.

The first scan signal line SCL1 and the first sensing signal line SENL1 may be connected to the first subpixel SP.

Referring to FIG. 9, the second gate driving panel circuit GPC #2 may receive a second scan clock signal SCCLK2 and a second sensing clock signal SECLK2, and generate a second scan signal SC2 and a second sensing signal SE2.

The second scan clock signal SCCLK2 and the second sensing clock signal SECLK2 may be output from the level shifter L/S.

The second scan signal SC2 and the second sensing signal SE2 may be applied to the second scan signal line SCL2 adjacent to the first scan signal line SCL1 and the second sensing signal line SENL2 adjacent to the first sensing signal line SENL1, respectively.

The second scan signal line SCL2 and the second sensing signal line SENL2 may be connected to the second subpixel SP.

Figure 10:
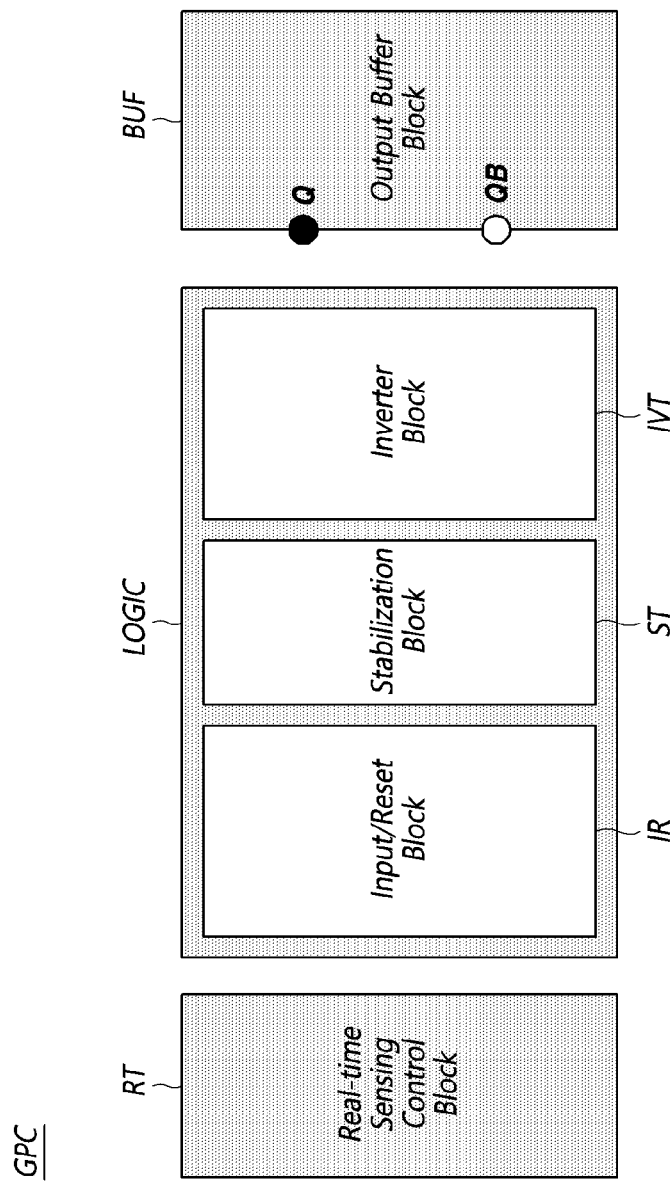
FIG. 10 is a block diagram illustrating a gate driving panel circuit according to embodiments of the disclosure.

FIG. 10 is a block diagram illustrating a gate driving panel circuit according to embodiments of the disclosure.

Referring to FIG. 10, the gate driving panel circuit GPC may include an output buffer block BUF, a logic block LOGIC, and a real-time sensing control block RT.

The output buffer block BUF may be configured to output two or more gate signals. For example, the output buffer block BUF included in the gate driving panel circuit GPC may output at least one scan signal SC and at least one sensing signal SE. In this case, the subpixel SP may have a 2-gate driven structure as shown in FIG. 3.

The output buffer block BUF may be controlled according to voltage states of a Q node and a QB node. The operation and output of the output buffer block BUF may vary according to voltage states of the Q node and the QB node.

The Q node and the QB node may have different voltage levels. For example, if the voltage of the Q node during a first period is a high-level voltage, the voltage of the QB node may be a low-level voltage. If the voltage of the Q node is a low-level voltage during a second period before or after the first period, the voltage of the QB node may be a high-level voltage.

The logic block LOGIC may be a circuit block that controls the operation of the output buffer block BUF and implements an operation of a shift register. The logic block LOGIC may control the voltages of the Q node and the QB node to control the operation of the output buffer block BUF.

The logic block LOGIC may include an input/reset block IR, a stabilization block ST, and an inverter block IVT.

The input/reset block IR may be a circuit block that controls charge and discharge of the Q node. The inverter block IVT may control the inverted voltage level of the voltage level of the Q node to be the voltage level of the QB node according to the voltage of the Q node. The stabilization block ST may stabilize the Q node and the output according to the voltage of the QB node during a period when the output signal of the gate driving panel circuit GPC has a turn-off level voltage.

Each of the input/reset block IR, the stabilization block ST, and the inverter block IVT may include at least one transistor.

The real-time sensing control block RT may be a circuit block for controlling the operation of the output buffer block BUF for real-time sensing driving. Here, the real-time sensing driving may be sensing driving performed in real time during display driving and sensing driving performed every blank period BLANK between active periods ACT (see FIG. 7). The real-time sensing driving may be performed in a second sensing mode corresponding to the fast-sensing mode (FIG. 6B). The real-time sensing driving may be sensing driving for sensing the mobility of the driving transistor DRT of each subpixel SP (FIG. 6B).

The real-time sensing control block RT may include at least one transistor.

The real-time sensing control block RT may control the voltages of the Q node and the QB node such that the output buffer block BUF outputs the scan signal SC and the sensing signal SE to the subpixel SP where the real-time sensing driving is performed.

Figure 11:
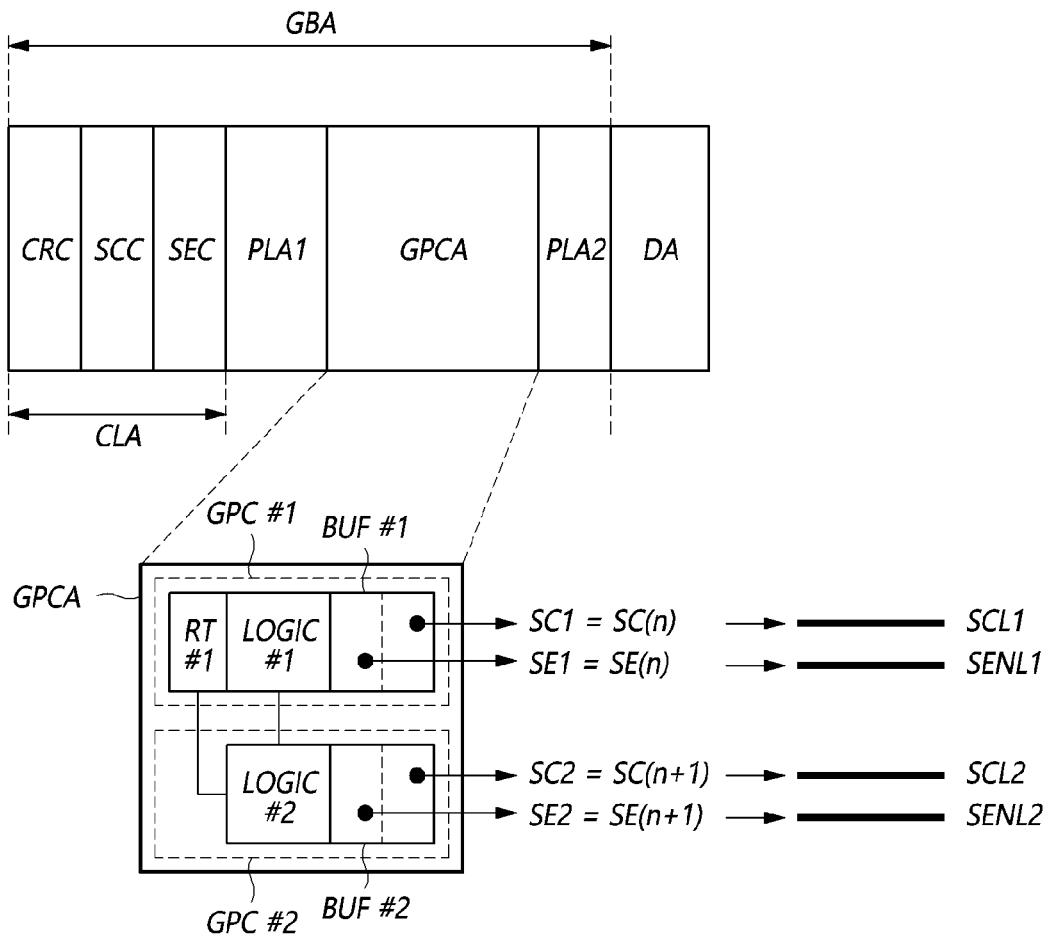
FIG. 11 is a layout view illustrating a gate bezel area in a display panel according to embodiments of the disclosure.

FIG. 11 is a layout view illustrating a gate bezel area in a display panel according to embodiments of the disclosure.

Referring to FIG. 11, the gate bezel area GBA of the display panel 110 may include a clock signal line area CLA, a first power line area PLA1, a gate driving panel circuit area GPCA, and a second power line area PLA2.

The gate driving panel circuit area GPCA may be an area in which the gate driving panel circuit GPC is disposed. The gate driving panel circuit GPC may output scan signals SC and sensing signals SE to be supplied to the subpixel SP having a 2-gate driven structure.

Various lines for supplying power, voltage, or signals to the gate driving panel circuit GPC may be disposed around the gate driving panel circuit area GPCA. Accordingly, in the gate bezel area GBA, the clock signal line area CLA, the first power line area PLA1, and the second power line area PLA2 may be disposed around the gate driving panel circuit area GPCA.

For example, the clock signal line area CLA and the first power line area PLA1 may be positioned on one side of the gate driving panel circuit area GPCA, and the second power line area PLA2 may be positioned on the other side of the gate driving panel circuit area GPCA.

The gate driving panel circuit area GPCA may be positioned on one side of the second power line area PLA2, and the display area DA may be positioned on the other side of the second power line area PLA2.

The clock signal line area CLA may be an area in which clock signal lines for transferring various clock signals to the gate driving panel circuit GPC are disposed.

The first power line area PLA1 may be an area where at least one gate high-potential voltage line for transferring at least one gate high-potential voltage to the gate driving panel circuit GPC is disposed.

At least one control signal line for transferring at least one control signal to the gate driving panel circuit GPC may be disposed in the first power line area PLA1. For example, the at least one control signal may include at least one of a start signal, a reset signal, and a line selection signal.

The second power line area PLA2 may be an area where at least one gate low-potential voltage line for transferring at least one gate low-potential voltage to the gate driving panel circuit GPC is disposed.

The clock signal line area CLA may include a carry clock signal line area CRC, a scan clock signal line area SCC, and a sensing clock signal line area SEC.

The carry clock signal line area CRC may be an area in which carry clock signal lines for transferring carry clock signals to the gate driving panel circuit GPC are disposed.

The scan clock signal line area SCC may be an area in which scan clock signal lines for transferring scan clock signals to the gate driving panel circuit GPC are disposed.

The sensing clock signal line area SEC may be an area in which sensing clock signal lines for transferring sensing clock signals to the gate driving panel circuit GPC are disposed.

The position order of the carry clock signal line area CRC, the scan clock signal line area SCC, and the sensing clock signal line area SEC may be variously set (e.g., CRC-SCC-SEC, SCC-CRC-SEC, SCC-SEC-CRC, SEC-SCC-CRC, etc.).

For example, among the carry clock signal line area CRC, the scan clock signal line area SCC, and the sensing clock signal line area SEC, the scan clock signal line area SCC may be positioned between the carry clock signal line area CRC and the sensing clock signal line area SEC, and the carry clock signal line area CRC may be positioned further away from the display area DA or the gate driving panel circuit area GPCA than the sensing clock signal line area SEC.

The gate driving panel circuit GPC disposed in the gate driving panel circuit area GPCA may include, e.g., a first gate driving panel circuit GPC #1 and a second gate driving panel circuit GPC #2. Each of the first gate driving panel circuit GPC #1 and the second gate driving panel circuit GPC #2 may have a separate Q node and a separate QB node.

The first gate driving panel circuit GPC #1 may include a first output buffer block BUF #1, a first logic block LOGIC #1, and a first real-time sensing control block RT #1.

The first output buffer block BUF #1 may be configured to output the first scan signal SC1 and the first sensing signal SE1 to the first scan signal line SCL1 and the first sensing signal line SENL1, respectively, connected to the first subpixel SP. For example, the first scan signal SC1 may be an nth scan signal SC(n), and the first sensing signal SE1 may be an nth sensing signal SE(n).

The first logic block LOGIC #1 may be configured to control the operation of the first output buffer block BUF #1 by controlling the voltage of each of the Q node and the QB node.

The second gate driving panel circuit GPC #2 may include only the second output buffer block BUF #2 and the second logic block LOGIC #2.

The second output buffer block BUF #2 may be configured to output the second scan signal SC2 and the second sensing signal SE2 to the second scan signal line SCL2 and the second sensing signal line SENL2, respectively, connected to the second subpixel SP. For example, the second scan signal SC2 may be an (n+1)th scan signal SC(n+1), and the second sensing signal SE2 may be an (n+1)th sensing signal SE(n+1).

The second logic block LOGIC #2 may be configured to control the operation of the second output buffer block BUF #2 by controlling the voltage of each of the Q node and the QB node.

The first real-time sensing control block RT #1 may be shared by the first gate driving panel circuit GPC #1 and the second gate driving panel circuit GPC #2. Accordingly, the size of the gate bezel area GBA may be significantly reduced.

The first real-time sensing control block RT #1 may be configured to control the voltage of each of the Q node and the QB node of the first gate driving panel circuit GPC #1 during a first real-time sensing driving period (first blank period) to control the operation of the first output buffer block BUF #1 such that the first output buffer block BUF #1 outputs the first scan signal SC1 and the first sensing signal SE1 for sensing driving to the first subpixel SP where real-time sensing driving is to be performed.

The first real-time sensing control block RT #1 may be configured to control the voltage of each of the Q node and the QB node of the second gate driving panel circuit GPC #2 during a second real-time sensing driving period (second blank period) different from the first real-time sensing driving period (first blank period) to control the operation of the second output buffer block BUF #2 such that the second output buffer block BUF #2 outputs the second scan signal SC2 and the second sensing signal SE2 for sensing driving to the second subpixel SP where real-time sensing driving is to be performed.

At least one specific node of the first logic block LOGIC #1 and at least one specific node of the second logic block LOGIC #2 may be electrically connected to each other.

Among the first output buffer block BUF #1, the first logic block LOGIC #1, and the first real-time sensing control block RT #1, the first real-time sensing control block RT #1 may be positioned farthest from the display area DA.

The gate driving panel circuit area GPCA may be disposed between the first power line area PLA1 and the second power line area PLA2.

Accordingly, at least one gate high-potential voltage line disposed in the first power line area PLA1 and at least one gate low-potential voltage line disposed in the second power line area PLA2 may be separated by the gate driving panel circuit GPC disposed in the gate driving panel circuit area GPCA.

According to the above-described power supply arrangement, at least one high-potential voltage line and at least one low-potential voltage line do not overlap each other, and thus, the high-potential voltages (GVDD, GVDD2, GVDD_o/GVDD_e) and the low-potential voltages (GVSS0, GVSS1, and GVSS2) may be stabilized.

Figure 12:
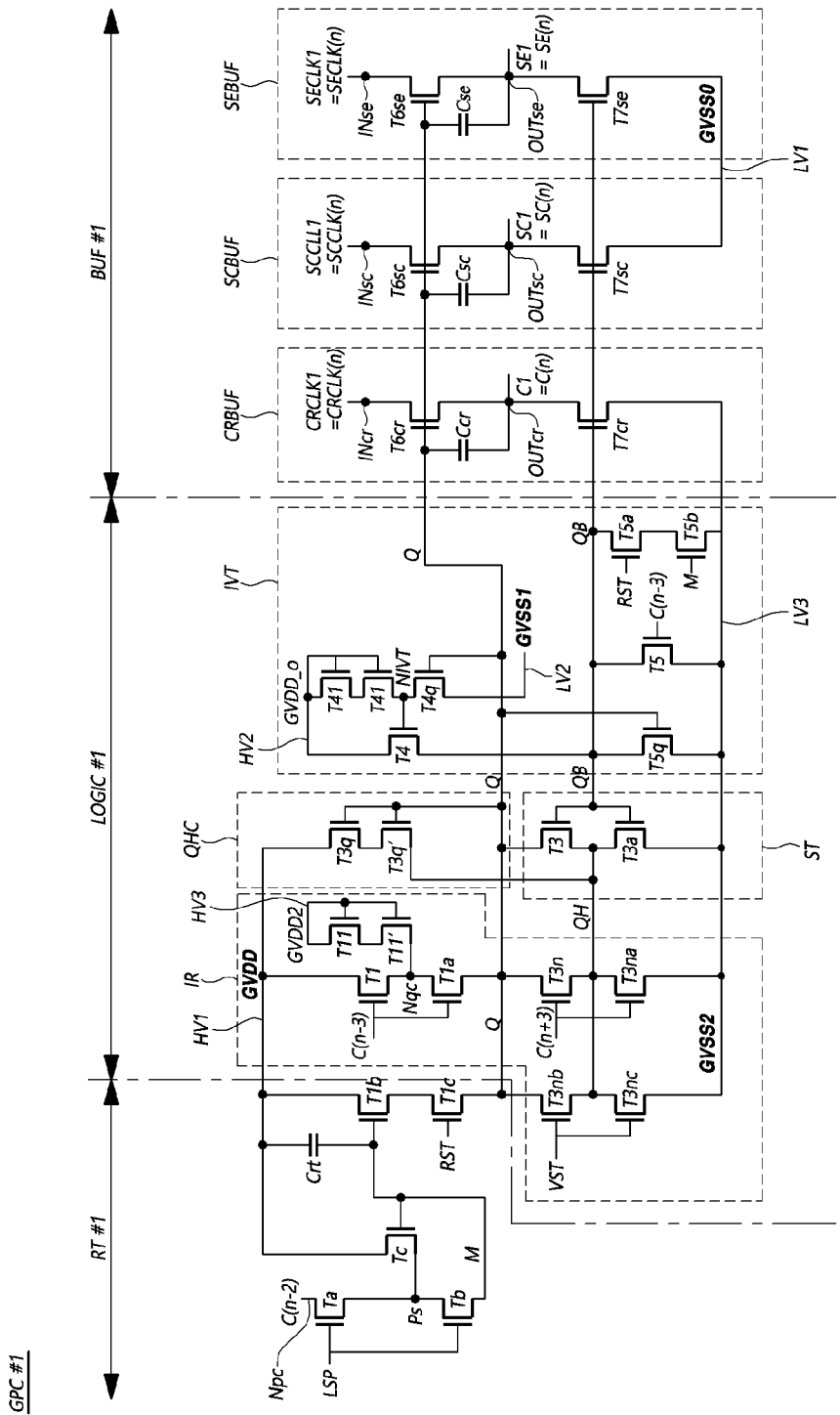
FIG. 12 illustrates a first gate driving panel circuit included in a gate driving panel circuit according to embodiments of the disclosure.

FIG. 12 illustrates a first gate driving panel circuit included in a gate driving panel circuit according to embodiments of the disclosure.

Here, the first gate driving panel circuit GPC #1 may be configured to output an odd-numbered nth scan signal SC(n) and nth sensing signal SE(n). The nth scan signal SC(n) may be supplied to an odd-numbered nth scan signal line SCL, and the nth sensing signal SE(n) may be supplied to an odd-numbered nth sensing signal line SENL. Hereinafter, for convenience of description, the nth scan signal SC(n) may also be referred to as the first scan signal SC1, and the nth sensing signal SE(n) may also be referred to as the first sensing signal SE1.

Referring to FIG. 12, the first gate driving panel circuit GPC #1 may include a first output buffer block BUF #1, a first logic block LOGIC #1, and a first real-time sensing control block RT #1.

The first output buffer block BUF #1 may include a carry output buffer CRBUF, a scan output buffer SCBUF, and a sensing output buffer SEBUF.

The carry output buffer CRBUF may include a carry pull-up transistor T6cr and a carry pull-down transistor T7cr.

The carry pull-up transistor T6cr may be turned on or off according to the voltage of the Q node, thereby controlling the connection between the carry clock node INcr to which the nth carry clock signal CRCLK(n) is input and the carry output node OUTcr where the nth carry signal C(n) is output. Here, the nth carry clock signal CRCLK(n) may also be referred to as the first carry clock signal CRCLK1, and the nth carry signal C(n) may also be referred to as the first carry signal C1.

The gate node of the carry pull-up transistor T6cr may be the Q node or may be electrically connected to the Q node. The source node (or drain node) of the carry pull-up transistor T6cr may be the carry output node OUTcr or may be electrically connected to the carry output node OUTcr. The drain node (or source node) of the carry pull-up transistor T6cr may be the carry clock node INcr or may be electrically connected to the carry clock node INcr.

The carry pull-up transistor T6cr may be turned on to output the first carry clock signal CRCLK1 as the first carry signal C1 having a high-level voltage.

The carry output buffer CRBUF may further include a carry bootstrapping capacitor Ccr connected between the gate node and the source node (or the drain node) of the carry pull-up transistor T6cr.

The carry-pull-down transistor T7cr may be turned on or off according to the voltage of the QB node, thereby controlling the connection between the third gate low-potential node LV3 to which the third gate low-potential voltage GVSS2 is input and the carry output node OUTcr where the nth carry signal C(n) is output.

The gate node of the carry pull-down transistor T7cr may be the QB node or may be electrically connected to the QB node. The drain node or the source node of the carry pull-down transistor T7cr may be the third gate low-potential node LV3 or may be electrically connected to the third gate low-potential node LV3, and the source node or the drain node of the carry pull-down transistor T7cr may be the carry output node OUTcr or may be electrically connected to the carry output node OUTcr.

The carry pull-down transistor T7cr may be turned on to output the third gate low-potential voltage GVSS2 as the first carry signal C1 having a low-level voltage.

The scan output buffer SCBUF may be configured to output an nth scan clock signal SCCLK(n) having a turn-on level voltage or a turn-off level voltage to the scan output node OUTsc. The nth scan clock signal SCCLK(n) output to the scan output node OUTsc may be applied to the first scan signal line SCL1 electrically connected to the scan output node OUTsc.

The scan output buffer SCBUF may include a scan pull-up transistor T6sc and a scan pull-down transistor T7sc.

The scan pull-up transistor T6sc may be turned on or off according to the voltage of the Q node, thereby controlling the connection between the scan clock node INsc to which the nth scan clock signal SCCLK(n) is input and the scan output node OUTsc where the nth scan signal SC(n) is output. Here, the nth scan clock signal SCCLK(n) may also be referred to as the first scan clock signal SCCLK1, and the nth scan signal SC(n) may also be referred to as the first scan signal SC1.

The gate node of the scan pull-up transistor T6sc may be the Q node or may be electrically connected to the Q node. The source node (or drain node) of the scan pull-up transistor T6sc may be the scan output node OUTsc or may be electrically connected to the scan output node OUTsc. The drain node (or source node) of the scan pull-up transistor T6sc may be the scan clock node INsc or may be electrically connected to the scan clock node INsc.

The scan pull-up transistor T6sc may be turned on to output the scan clock signal SCCLK, as the first scan signal SC1 having a turn-on level voltage (e.g., a high-level voltage), to the scan output node OUTsc. The first scan signal SC1 having a turn-on level voltage (e.g., a high-level voltage) output from the scan pull-up transistor T6sc may be applied to the first scan signal line SCL1.

The scan output buffer SCBUF may further include a scan bootstrapping capacitor Csc connected between the gate node and the source node (or the drain node) of the scan pull-up transistor T6sc.

The scan pull-down transistor T7sc may be turned on or off according to the voltage of the QB node, thereby controlling the connection between the first gate low-potential node LV1 to which the first gate low-potential voltage GVSS0 is input and the scan output node OUTsc where the nth scan signal SC(n) is output.

The gate node of the scan pull-down transistor T7sc may be the QB node or may be electrically connected to the QB node. The drain node or the source node of the scan pull-down transistor T7sc may be the first gate low-potential node LV1 or may be electrically connected to the first gate low-potential node LV1. The source node or drain node of the scan pull-down transistor T7*sc* may be the scan output node OUTsc or may be electrically connected to the scan output node OUTsc.

The scan pull-down transistor T7*sc* may be turned on to output the first gate low-potential voltage GVSS0, as the first scan signal SC1 having a turn-off level voltage (e.g., a low-level voltage), to the scan output node OUTsc. The first scan signal SC1 having a turn-off level voltage (e.g., a low-level voltage) in the scan pull-up transistor T6*sc* may be applied to the first scan signal line SCL1.

The sensing output buffer SEBUF may be configured to output an nth sensing signal SE(n) having a turn-on level voltage or a turn-off level voltage to the sensing output node OUTse. The nth sensing signal SE(n) output to the sensing output node OUTse may be applied to the first sensing signal line SENL1 electrically connected to the sensing output node OUTse.

The sensing output buffer SEBUF may include a sensing pull-up transistor T6*se* and a sensing pull-down transistor T7*se*.

The sensing pull-up transistor T6*se* may be turned on or off according to the voltage of the Q node, thereby controlling the connection between the sensing clock node INse to which the nth sensing clock signal SECLK(n) is input and the sensing output node OUTse where the nth sensing signal SE(n) is output. Here, the nth sensing clock signal SECLK(n) may also be referred to as the first sensing clock signal SECLK1, and the nth sensing signal SE(n) may also be referred to as the first sensing signal SE1.

The gate node of the sensing pull-up transistor T6*se* may be the Q node or may be electrically connected to the Q node. The source node (or drain node) of the sensing pull-up transistor T6*se* may be the sensing output node OUTse or may be electrically connected to the sensing output node OUTse. The drain node (or source node) of the sensing pull-up transistor T6*se* may be the sensing clock node INse or may be electrically connected to the sensing clock node INse.

The sensing pull-up transistor T6*se* may be turned onto output the sensing clock signal SECLK, as the first sensing signal SE1 having a turn-on level voltage (e.g., a high-level voltage), to the sensing output node OUTse. The first sensing signal SE1 having a turn-on level voltage (e.g., a high-level voltage) output from the sensing pull-up transistor T6*se* may be applied to the first sensing signal line SENL1.

The sensing output buffer SEBUF may further include a sensing bootstrapping capacitor Se connected between the gate node and the source node (or the drain node) of the sensing pull-up transistor T6*se*.

The sensing pull-down transistor T7*se* may be turned on or off according to the voltage of the QB node, thereby controlling the connection between the first gate low-potential node LV1 to which the first gate low-potential voltage GVSS0 is input and the sensing output node OUTse where the nth sensing signal SE(n) is output.

The gate node of the sensing pull-down transistor T7*se* may be the QB node or may be electrically connected to the QB node. The drain node or the source node of the sensing pull-down transistor T7*se* may be the first gate low-potential node LV1 or may be electrically connected to the first gate low-potential node LV1. The source node or drain node of the sensing pull-down transistor T7*se* may be the sensing output node OUTse or may be electrically connected to the sensing output node OUTse.

The sensing pull-down transistor T7*se* may be turned on to output the first gate low-potential voltage GVSS0, as the first sensing signal SE1 having a turn-off level voltage (e.g., a low-level voltage), to the sensing output node OUTse. The first sensing signal SE1 having a turn-off level voltage (e.g., a low-level voltage) in the sensing pull-down transistor T7*se* may be applied to the first sensing signal line SENL1.

The respective gate nodes of the carry pull-up transistor T6*cr*, the scan pull-up transistor T6*sc*, and the sensing pull-up transistor T6*se* included in the first output buffer block BUF #1 may be electrically connected to each other.

The Q node may be shared by the carry output buffer CRBUF, the scan output buffer SCBUF, and the sensing output buffer SEBUF included in the first output buffer block BUF #1. The Q node may be electrically connected to the gate node of the carry pull-up transistor T6*cr*, the gate node of the scan pull-up transistor T6*sc*, and the gate node of the sensing pull-up transistor T6*se*. This structure may also be referred to as a "Q node sharing structure".

The respective gate nodes of the carry-pull-down transistor T7*cr*, the scan-pull-down transistor T7*sc*, and the sensing-pull-down transistor T7*se* included in the first output buffer block BUF #1 may be connected to each other.

The QB node may be shared by the carry output buffer CRBUF, the scan output buffer SCBUF, and the sensing output buffer SEBUF included in the first output buffer block BUF #1. The QB node may be electrically connected to the gate node of the carry pull-down transistor T7*cr*, the gate node of the scan pull-down transistor T7*sc*, and the gate node of the sensing pull-down transistor T7*se*. This structure may also be referred to as a "QB node sharing structure".

As shown in FIG. 12, each of the carry pull-up transistor T6*cr*, the scan pull-up transistor T6*sc*, and the sensing pull-up transistor T6*se* achieves "Q node sharing structure" by electrically connecting gate node thereof to each other and connecting it to the Q node, and each of the carry pull-down transistor T7*cr*, the scan pull-down transistor T7*sc*, and the sensing pull-down transistor T7*se* achieves "QB node sharing structure" by electrically connecting gate node thereof to each other and connecting it to the QB node, however, embodiments of the present disclosure are not limited thereto.

The first logic block LOGIC #1 is the circuit block for controlling the voltages of the Q node and the QB node to control the operation of the first output buffer block BUF #1, and may include an input/reset block IR, a stabilization block ST, and an inverter block IVT.

The input/reset block IR is a circuit block for controlling charge and discharge of the Q node, and may include a Q node charge block connected between the first gate high-potential node HV1 and the Q node and a Q node discharge block connected between the Q node and the third gate low-potential node LV3. Here, the first gate high-potential voltage GVDD may be input to the first gate high-potential node HV1. The third gate low-potential voltage GVSS2 may be input to the third gate low-potential node LV3.

The Q node charge block of the input/reset block IR may include at least one Q node charge transistor for controlling the connection between the first gate high-potential node HV1 and the Q node by being turned on or off according to the (n−3)th carry signal C(n−3) to charge the Q node.

For example, the Q node charge block of the input/reset block IR may include a first Q node charge transistor T1 and a second Q node charge transistor T1*a* connected in series between the first gate high-potential node HV1 and the Q node.

The gate node of the first Q node charge transistor T1 and the gate node of the second Q node charge transistor T1*a* may be electrically connected to each other to receive the (n−3)th carry signal C(n−3) together.

The first Q node charge transistor T1 may be connected between the first gate high-potential node HV1 and the Q node charge control node Nqc, and the second Q node charge transistor T1a may be connected between the Q node charge control node Nqc and the Q node.

The Q node charge block of the input/reset block IR may further include a first Q node charge control transistor T11 and a second Q node charge control transistor T11' connected in series between the third gate high-potential node HV3 and the Q node charge control node Nqc to control the Q node charge control node Nqc. Here, the third gate high-potential voltage GVDD2 may be applied to the third gate high-potential node HV3.

The gate node of the first Q node charge control transistor T11 and the gate node of the second Q node charge control transistor T11' may be electrically connected to each other and may be connected to the third gate high-potential node HV3 together.

The Q node discharge block of the input/reset block IR may include a first Q node discharge transistor T3$n$ and a second Q node discharge transistor T3$na$ connected in series between the Q node and the third gate low-potential node LV3 to discharge the Q node.

The first Q node discharge transistor T3$n$ and the second Q node discharge transistor T3$na$ may be turned on or off together according to the (n+3)th carry signal C(n+3) to control the connection between the Q node and the third gate low-potential node LV3.

The first Q node discharge transistor T3$n$ may be connected between the Q node and the holding node QH node, and the second Q node discharge transistor T3$na$ may be connected between the holding node QH node and the third gate low-potential node LV3.

The gate node of the first Q node discharge transistor T3$n$ and the gate node of the second Q node discharge transistor T3$na$ may be electrically connected to each other to receive the (n+3)th carry signal C(n+3) together.

The Q node discharge block of the input/reset block IR may further include a third Q node discharge transistor T3$nb$ and a fourth Q node discharge transistor T3$nc$ connected in series between the Q node and the third gate low-potential node LV3 to discharge the Q node.

The third Q node discharge transistor T3$nb$ and the fourth Q node discharge transistor T3$nc$ may be turned on or off together according to the start signal VST to control the connection between the Q node and the third gate low-potential node LV3.

The third Q node discharge transistor T3$nb$ may be connected between the Q node and the holding node QH node, and the fourth Q node discharge transistor T3$nc$ may be connected between the holding node QH node and the third gate low-potential node LV3.

The stabilization block ST may be a circuit block that stabilizes the Q node and the output according to the voltage of the QB node during a period when the output signal of the gate driving panel circuit GPC has a turn-off level voltage.

The stabilization block ST may include a first stabilization transistor T3 and a second stabilization transistor T3$a$ that are turned on or off according to the voltage of the QB node to control the connection between the Q node and the third gate low-potential node LV3.

The first stabilization transistor T3 may be connected between the Q node and the holding node QH node, and may be turned on or off according to the voltage of the QB node to control the connection between the Q node and the holding node QH node.

The second stabilization transistor T3$a$ may be connected between the holding node QH node and the third gate low-potential node LV3, and may be turned on or off according to the voltage of the QB node to control the connection between the holding node QH node and the third gate low-potential node LV3.

The inverter block IVT may be a circuit block that controls the inverted voltage level of the voltage level of the Q node to be the voltage level of the QB node according to the voltage of the Q node.

The inverter block IVT may include a QB node charge transistor T4 for charging the QB node.

The QB node charge transistor T4 may be connected between the second gate high-potential node HV2 and the QB node, and may be turned on or off according to the voltage of the inverter control node NIVT to control the connection between the second gate high-potential node HV2 and the QB node. Here, the second gate high-potential voltage GVDD_o may be applied to the second gate high-potential node HV2.

The inverter block IVT may further include a first inverter control transistor T4$q$ for controlling the voltage of the inverter control node NIVT.

The first inverter control transistor T4$q$ may be connected between the inverter control node NIVT and the second gate low-potential node LV2 and may be turned on or off according to the voltage of the Q node to control the connection between the inverter control node NIVT and the second gate low-potential node LV2. Here, the second gate low-potential voltage GVSS1 may be applied to the second gate low-potential node LV2.

As the Q node has a low-level voltage, the first inverter control transistor T4$q$ may be turned off. Accordingly, the inverter control node NIVT is in a state in which the second gate high-potential voltage GVDD_o supplied by the second inverter control transistor T41 is applied. Accordingly, the QB node charge transistor T4 may be turned on, so that the second gate high-potential voltage GVDD_o may be supplied to the QB node (Q node charging).

As the Q node has a high-level voltage, the first inverter control transistor T4$q$ may be turned on to supply the second gate low-potential voltage GVSS1 to the inverter control node NIVT. Accordingly, the QB node charge transistor T4 may be turned off to prevent the second gate high-potential voltage GVDD_o from being supplied to the QB node.

The inverter block IVT may further include a second inverter control transistor T41 for controlling the voltage of the inverter control node NIVT.

The second inverter control transistor T41 may be connected between the second gate high-potential node HV2 and the inverter control node NIVT, and may be turned on or off according to the second gate low-potential voltage GVSS1 to control the connection between the second gate high-potential node HV2 and the inverter control node NIVT.

The second inverter control transistor T41 may always maintain the turned-on state to supply the second gate high-potential voltage GVDD_o to the inverter control node NIVT.

The inverter block IVT may include a first QB node discharge transistor T5 connected between the QB node and the third gate low-potential node LV3 to discharge the QB node.

The first QB node discharge transistor T5 may be turned on or off according to the (n−3)th carry signal C(n−3), and may control the connection between the QB node and the third gate low-potential node LV3. The first QB node discharge transistor T5 may be turned on, so that the third gate low-potential voltage GVSS2 may be applied to the QB node. Accordingly, the QB node may be discharged.

The inverter block IVT may further include a second QB node discharge transistor T5$q$ connected between the QB node and the third gate low-potential node LV3 to discharge the QB node.

The second QB node discharge transistor T5$q$ may be turned on or off according to the voltage of the Q node to control the connection between the QB node and the third gate low-potential node LV3. The second QB node discharge transistor T5$q$ may be turned on, so that the third gate low-potential voltage GVSS2 may be applied to the QB node. Accordingly, the QB node may be discharged.

The inverter block IVT may further include a third QB node discharge transistor T5$a$ and a fourth QB node discharge transistor T5$b$ connected in series between the QB node and the third gate low-potential node LV3 to discharge the QB node.

The reset signal RST may be input to the gate node of the third QB node discharge transistor T5$a$. In other words, the third QB node discharge transistor T5$a$ may be turned on or off according to the voltage of the reset signal RST.

The gate node of the fourth QB node discharge transistor T5$b$ may be electrically connected to the intermediate node M. In other words, the fourth QB node discharge transistor T5$b$ may be turned on or off according to the voltage of the intermediate node M. Here, the intermediate node M may be a node included in the first real-time sensing control block RT #1.

Among the plurality of QB node discharge transistors T5, T5$q$, T5$a$, and T5$b$ included in the inverter block IVT, the first QB node discharge transistor T5 and the second QB node discharge transistor T5$q$ may be configured to discharge the QB node for display driving during the active period ACT, and the third QB node discharge transistor T5$a$ and the fourth QB node discharge transistor T5$b$ may be configured to discharge the QB node for sensing driving during the blank period BLANK.

The first logic block LOGIC #1 may further include a holding node control block QHC for controlling the voltage of the holding node QH node. The holding node control block QHC may be connected between the first gate high-potential node HV1 and the holding node QH node.

The holding node control block QHC may include a first holding node control transistor T3$q$ and a second holding node control transistor T3$q'$ connected in series between the first gate high-potential node HV1 and the holding node QH node.

The respective gate nodes of the first holding node control transistor T3$q$ and the second holding node control transistor T3$q'$ may be connected to the Q node together.

When the Q node has a high-level voltage, both the first holding node control transistor T3$q$ and the second holding node control transistor T3$q'$ may be turned on, so that the first gate high-potential voltage GVDD may be applied to the holding node QH node. As the holding node QH node has the first gate high-potential voltage GVDD, the Q node may stably maintain the high-level voltage regardless of the on-off state of the third Q node discharge transistor T3$nb$, the first Q node discharge transistor T3$n$, and the first stabilization transistor T3.

The first real-time sensing control block RT #1 may be a circuit block for controlling the operation of the first output buffer block BUF #1 for real-time sensing driving. The first real-time sensing control block RT #1 may be configured to control the voltage of the Q node such that the first scan signal SC1 and the first sensing signal SE1 are output at a predetermined timing by the first output buffer block BUF #1 during the blank period BLANK.

The first real-time sensing control block RT #1 may control the first scan signal SC1 to be output to one of the plurality of scan signal lines SCL by the first output buffer block BUF #1 during the blank period BLANK, and may control the first sensing signal SE1 to be output to one of the plurality of sensing signal lines SENL. Accordingly, sensing may be performed on the subpixel SP included in any one of the plurality of subpixel lines.

The first real-time sensing control block RT #1 may include a first sensing control transistor Ta, a second sensing control transistor Tb, a third sensing control transistor Tc, a fourth sensing control transistor T1$b$, and a fifth sensing control transistor T1$c$.

The first sensing control transistor Ta and the second sensing control transistor Tb may be connected in series between the previous carry input node Npc and the intermediate node M. Here, the (n−2)th carry signal C(n−2) may be input to the previous carry input node Npc.

In order to perform real-time sensing driving on the subpixel SP capable of receiving the first sensing signal SE1 and the first scan signal SC1 output from the first gate driving panel circuit GPC #1, the first gate driving panel circuit GPC #1 should output the first scan signal SC1 and the first sensing signal SE1 as gate signals for sensing driving during the real-time sensing driving period. Here, the real-time sensing driving period may be included in the blank period BLANK.

The first real-time sensing control block RT #1 may use the line selection signal LSP to control the first scan signal SC1 and the first sensing signal SE1 to be output as gate signals for sensing driving during the real-time sensing driving period.

During the real-time sensing driving period, the line selection signal LSP may be commonly input to the respective gate nodes of the first sensing control transistor Ta and the second sensing control transistor Tb. Here, the line selection signal LSP is a signal in the form of a pulse and may be commonly applied to the respective gate nodes of the first sensing control transistor Ta and the second sensing control transistor Tb in the middle of the frame.

The third sensing control transistor Tc may be turned on or off according to the voltage of the intermediate node M to control the connection between the connection point Ps and the first gate high-potential node HV1. Here, the connection point Ps may be a point where the first sensing control transistor Ta and the second sensing control transistor Tb are connected.

The fourth sensing control transistor T1$b$ and the fifth sensing control transistor T1$c$ may be connected in series between the first gate high-potential node HV1 and the Q node.

The gate node of the fourth sensing control transistor T1$b$ may be connected to the intermediate node M. The reset signal RST may be input to the gate node of the fifth sensing control transistor T1$c$.

During the real-time sensing driving period, the fourth sensing control transistor T1$b$ and the fifth sensing control transistor T1$c$ may be turned on according to the voltage of the intermediate node M and the reset signal RST, respectively, to transfer the first gate high-potential voltage GVDD to the Q node. Accordingly, during the real-time sensing driving period, the Q node may be charged. Here, the real-time sensing driving period may be included in the blank period BLANK.

The first real-time sensing control block RT #1 may include a sensing control capacitor Crt connected between the first gate high-potential node HV1 and the intermediate node M.

Figure 13A:
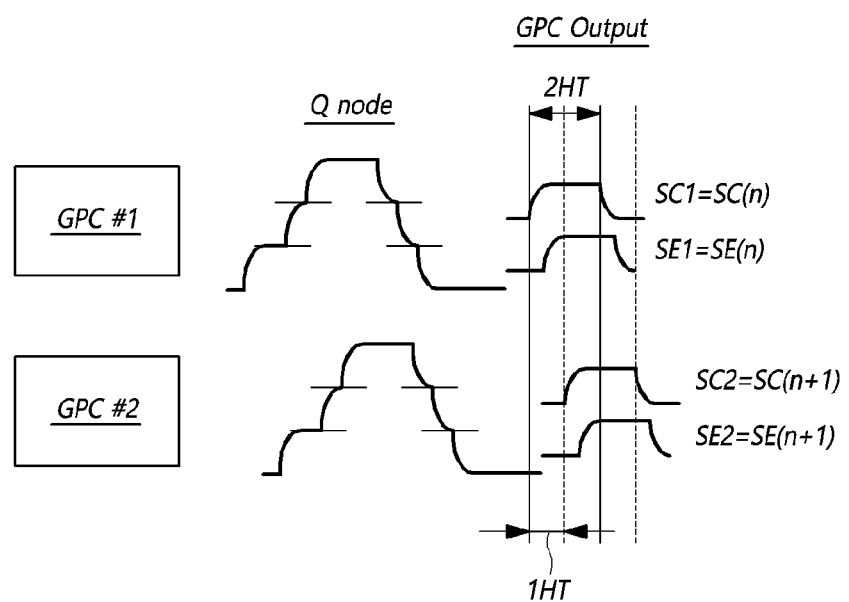
FIG. 13A illustrates a variation in voltage at Q node and output of each of a first gate driving panel circuit and a second gate driving panel circuit included in a gate driving panel circuit according to embodiments of the disclosure.

FIG. 13A illustrates a variation in voltage at Q node and output of each of a first gate driving panel circuit and a second gate driving panel circuit included in a gate driving panel circuit according to embodiments of the disclosure.

FIG. 12 shows an example of a first gate driving panel circuit GPC #1 including a first output buffer block BUF #1, a first logic block LOGIC #1, and a first real-time sensing control block RT #1, wherein the first output buffer block BUF #1 includes a carry output buffer CRBUF, a scan output buffer SCBUF, and a sensing output buffer SEBUF, and the first logic block LOGIC #1 includes an input/reset block IR, a stabilization block ST, a holding node control block QHC and an inverter block IVT. However, embodiments of the present disclosure are not limited thereto, the first gate driving panel circuit GPC #1 may further include other circuit blocks.

Referring to FIG. 13A, two or more voltage rises may occur during the voltage rising process of the Q node of the first gate driving panel circuit GPC #1. Two or more voltage rises (boosting) may occur during the voltage rising process of the Q node of the second gate driving panel circuit GPC #2.

When the Q node of the first gate driving panel circuit GPC #1 has a high-level voltage, the first gate driving panel circuit GPC #1 may output a first scan signal SC1 having a high-level voltage and a first sensing signal SE1 having a high-level voltage. The high-level voltage section of the first sensing signal SE1 may proceed after the high-level voltage section of the first scan signal SC1.

When the Q node of the second gate driving panel circuit GPC #2 has a high-level voltage, the second gate driving panel circuit GPC #2 may output a second scan signal SC2 having a high-level voltage and a second sensing signal SE2 having a high-level voltage. The high-level voltage section of the second sensing signal SE2 may proceed after the high-level voltage section of the second scan signal SC2.

The temporal length of the high-level voltage section of each of the first scan signal SC1 and the second scan signal SC2 may be a 2-horizontal time 2HT, but not limited thereto.

The high-level voltage section of the first scan signal SC1 and the high-level voltage section of the second scan signal SC2 may temporally overlap each other. A length in which the high-level voltage section of the first scan signal SC1 overlaps the high-level voltage section of the second scan signal SC2 may be a 1 horizontal time 1HT, but not limited thereto. As described above, a gate driving method in which high-level voltage sections of two scan signals SC1 and SC2 output immediately adjacent to each other temporally overlap each other temporally may be referred to as an "overlap gate driving method".

The high-level voltage section of the first sensing signal SE1 and the high-level voltage section of the second sensing signal SE2 may temporally overlap each other. A length in which the high-level voltage section of the first sensing signal SE1 overlaps the high-level voltage section of the second sensing signal SE2 may be a 1 horizontal time 1HT, but not limited thereto.

As shown in FIG. 13A, three voltage rises occur during the voltage rising process of the Q node of the first gate driving panel circuit GPC #1, and three voltage rises occur during the voltage rising process of the Q node of the second gate driving panel circuit GPC #2. However, FIG. 13A is only an example of variation in voltage at Q node of each of the first gate driving panel circuit and the second gate driving panel circuit, during the voltage rising process of each of the Q node of the first gate driving panel circuit GPC #1 and the Q node of the second gate driving panel circuit GPC #2, two or more voltage rises may occur.

Figure 13B:
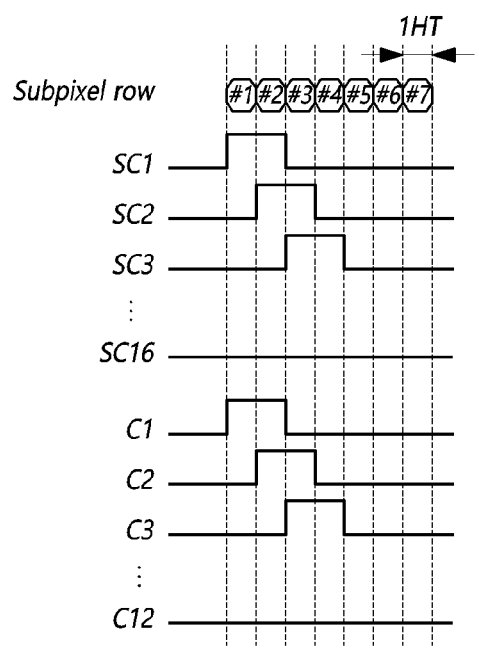
FIG. 13B illustrates scan signals and carry signals generated in a gate driving panel circuit according to embodiments of the disclosure.

FIG. 13B illustrates scan signals and carry signals generated in a gate driving panel circuit according to embodiments of the disclosure.

Referring to FIG. 13B, the gate driving panel circuit GPC may supply a corresponding scan signal to each of a plurality of subpixel rows #1, #2, #3, . . . . The gate driving panel circuit GPC may supply a first scan signal SC1 to a first subpixel row #1, may supply a second scan signal SC2 to a second subpixel row #2, and may supply a third scan signal SC3 to a third subpixel row #3.

The temporal length of the high-level voltage interval of each of the scan signals SC1 to SC16 may be a 2 horizontal time 2HT. The second half of the high-level voltage section of the first scan signal SC1 and the first half of the high-level voltage section of the second scan signal SC2 may overlap each other by 1 horizontal time HT, but not limited thereto, for example, the second half of the high-level voltage section of the first scan signal SC1 and the first half of the high-level voltage section of the second scan signal SC2 may overlap each other by more or less than 1 horizontal time HT. The second half of the high-level voltage section of the second scan signal SC2 and the first half of the high-level voltage section of the third scan signal SC3 may overlap each other by 1 horizontal time HT, but not limited thereto, for example, the second half of the high-level voltage section of the second scan signal SC2 and the first half of the high-level voltage section of the third scan signal SC3 may overlap each other by more or less than 1 horizontal time HT.

The gate driving panel circuit GPC may internally output the carry signals C1 to C12.

The temporal length of the high-level voltage section of each of the carry signals C1 to C12 may be 2 horizontal time 2HT. The second half of the high-level voltage section of the first carry signal C1 and the first half of the high-level voltage section of the second carry signal C2 may overlap each other by 1 horizontal time 1HT, but not limited thereto, for example, the second half of the high-level voltage section of the first carry signal C1 and the first half of the high-level voltage section of the second carry signal C2 may overlap each other by more or less than 1 horizontal time 1HT. The second half of the high-level voltage section of the second carry signal C2 and the first half of the high-level voltage section of the third carry signal C3 may overlap each other by 1 horizontal time 1HT, but not limited thereto, for example, the second half of the high-level voltage section of the second carry signal C2 and the first half of the high-level voltage section of the third carry signal C3 may overlap each other by more or less than 1 horizontal time 1HT.

Figure 14:
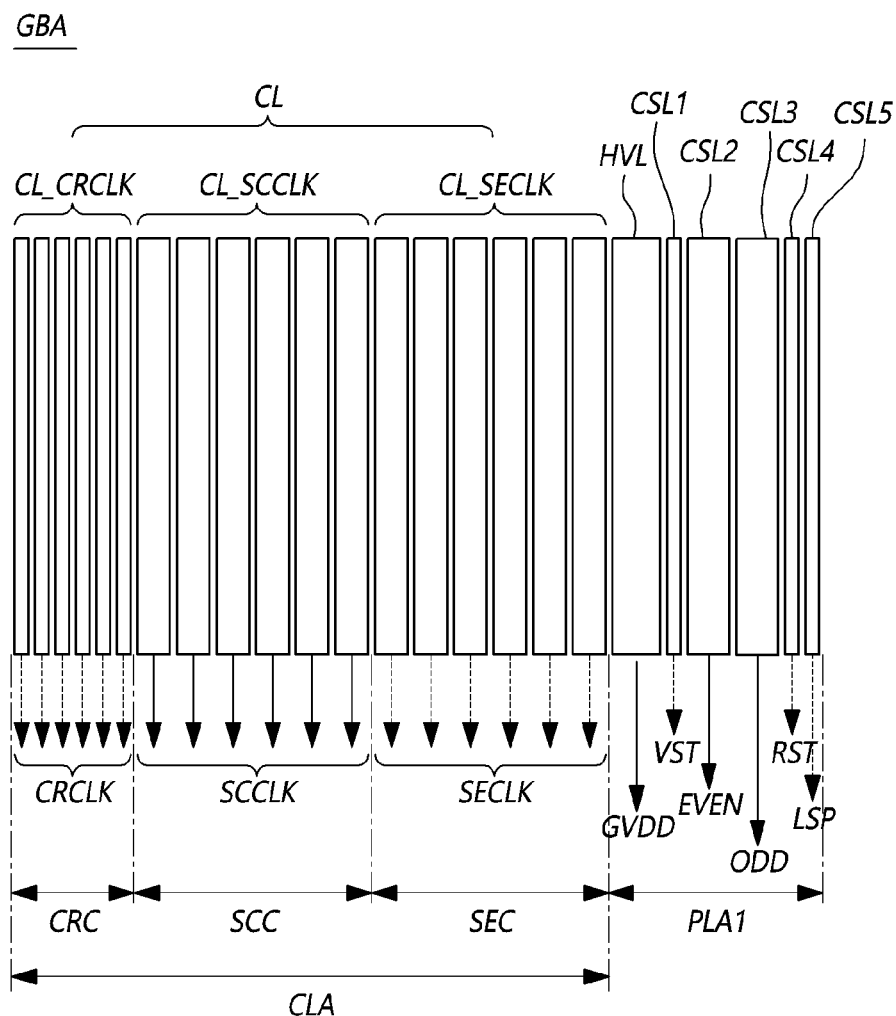
FIG. 14 is a view illustrating an arrangement of lines in a first power line area and a clock signal line area included in a gate bezel area within the non-display area of the display panel according to embodiments of the disclosure.

FIG. 14 is a view illustrating an arrangement of lines in a first power line area and a clock signal line area included in a gate bezel area within the non-display area of the display panel according to embodiments of the disclosure.

Referring to FIG. 14, the gate bezel area GBA of the display panel 110 may include a clock signal line area CLA and a first power line area PLA1. The clock signal line area CLA and the first power line area PLA1 may be positioned on one side of the gate driving panel circuit area GPCA.

The plurality of clock signal lines CL disposed in the clock signal line area CLA may include a carry clock signal line area CRC, a scan clock signal line area SCC, and a sensing clock signal line area SEC.

The carry clock signal lines CL_CRCLK for transferring the carry clock signals CRCCLK to the gate driving panel circuit GPC may be disposed in the carry clock signal line area CRC.

In the scan clock signal line area SCC, the scan clock signal lines CL_SCCLK for transferring the scan clock signals SCCLK to the gate driving panel circuit GPC may be disposed.

The sensing clock signal lines CL_SECLK for transferring the sensing clock signals SECLK to the gate driving panel circuit GPC may be disposed in the sensing clock signal line area SEC.

Among the carry clock signal line area CRC, the scan clock signal line area SCC, and the sensing clock signal line area SEC, the scan clock signal line area SCC may be positioned between the carry clock signal line area CRC and the sensing clock signal line area SEC, the carry clock signal line area CRC may be positioned farthest from the display area DA, and the sensing clock signal line area SEC may be positioned closest to the display area DA.

Among the carry clock signal line area CRC, the scan clock signal line area SCC, and the sensing clock signal line area SEC, the carry clock signal line area CRC may be positioned farthest from the gate driving panel circuit area GPCA, and the sensing clock signal line area SEC may be positioned closest to the gate driving panel circuit area GPCA.

The width of one scan clock signal line CL_SCCLK may be larger than the width of one carry clock signal line CL_CRCLK. The width of one sensing clock signal line CL_SECLK may be larger than the width of one carry clock signal line CL_CRCLK.

In the first power line area PLA1, at least one gate high-potential voltage line HVL for transferring at least one gate high-potential voltage GVDD to the gate driving panel circuit GPC may be disposed.

At least one control signal line may be additionally disposed in the first power line area PLA1. For example, the at least one control signal line may include at least one of a start signal line CSL1 for transferring a start signal VST for indicating the start of the gate driving operation to the gate driving panel circuit GPC, a first driving order control signal line CSL2 for transferring an even-numbered driving control signal EVEN to the gate driving panel circuit GPC, a second driving order control signal line CSL3 for transferring an odd-numbered driving control signal ODD to the gate driving panel circuit GPC, a reset signal line CSL4 for transferring a reset signal RST for indicating the end of the gate driving operation to the gate driving panel, and a line selection signal line CSL5 for transferring a line selection signal LSP to the gate driving panel circuit GPC.

The gate high-potential voltage line HVL may have a larger width than the start signal line CSL1, the reset signal line CSL4, and the line selection signal line CSL5.

The first driving order control signal line CSL2 and the second driving order control signal line CSL3 may be disposed in two specific line areas within the first power line area PLA1. As an example of changing the line arrangement, the first driving order control signal line CSL2 and the second driving order control signal line CSL3 may not be disposed in two specific line areas in the first power line area PLA1, but different gate high-potential voltage lines may be disposed.

For example, the second gate high-potential voltage may be separated by the 2-1 gate high-potential voltage GVDD_o applied at a high level at the odd-numbered horizontal time and the 2-2 gate high-potential voltage GVDD_e applied at a high level at the even-numbered horizontal time.

Therefore, when the 2-1 gate high-potential voltage GVDD_o is high level, the first group of pull-down transistors may be turned on and the second group of pull-down transistors may be turned off.

On the other hand, when the 2-2 gate high-potential voltage GVDD_e is high level, the second group of pull-down transistors may be turned on and the first group of pull-down transistors may be turned off.

Here, it illustrates the case where the 2-1 gate high-potential voltage GVDD_o is applied at a high level at the odd-numbered horizontal time as an example.

Figure 15:
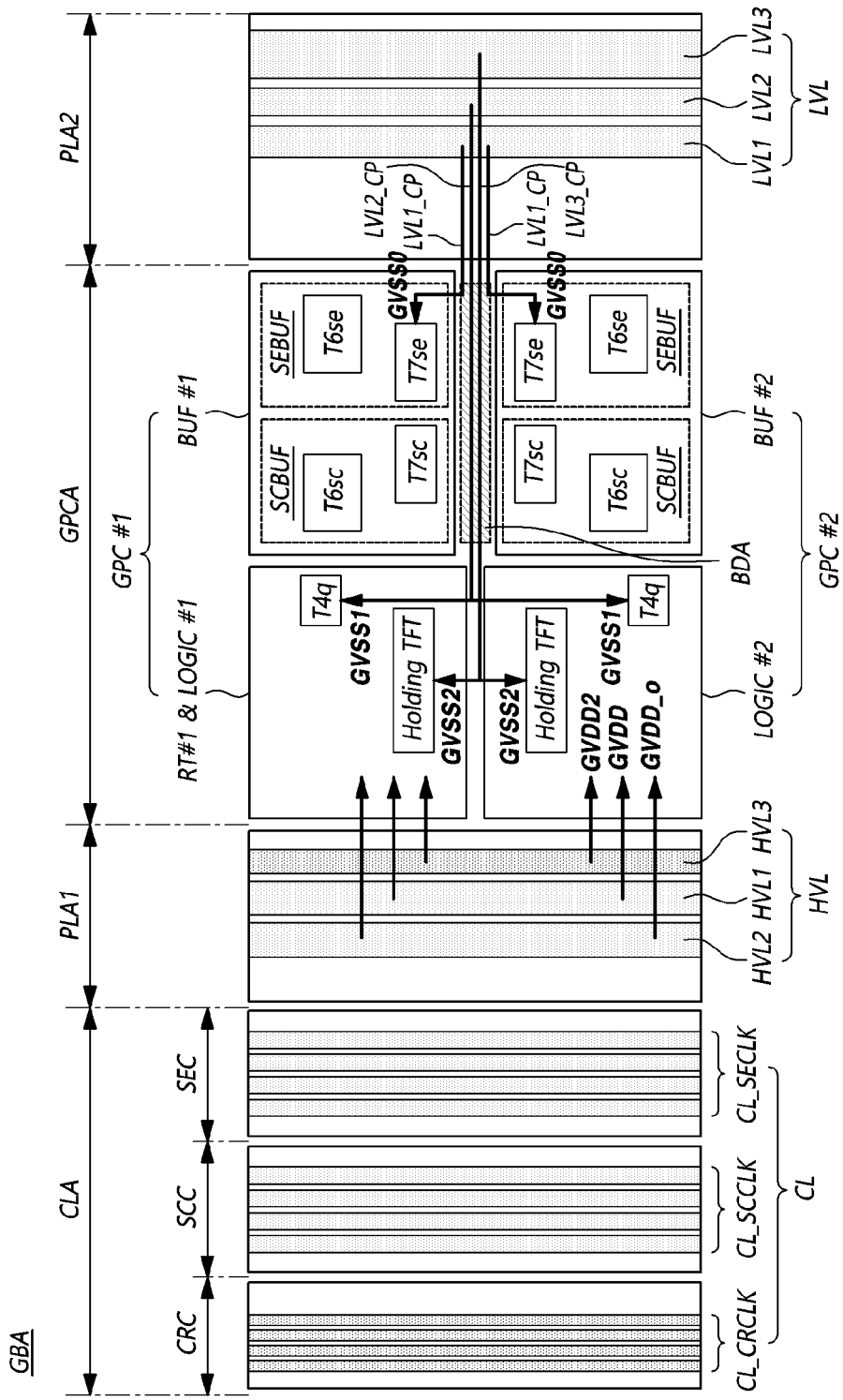
FIG. 15 is a plan view illustrating a gate bezel area in a display panel according to embodiments of the disclosure.

FIG. 15 is a plan view illustrating a gate bezel area in a display panel according to embodiments of the disclosure. However, it is assumed that the first gate driving panel circuit GPC #1 and the second gate driving panel circuit GPC #2 are disposed in the gate driving panel circuit area GPCA.

Referring to FIG. 15, the first gate driving panel circuit GPC #1 and the second gate driving panel circuit GPC #2 may be disposed in the gate driving panel circuit area GPCA.

The first gate driving panel circuit GPC #1 may include a first output buffer block BUF #1, a first logic block LOGIC #1, and a first real-time sensing control block RT #1. The second gate driving panel circuit GPC #2 may include a second output buffer block BUF #2, a second logic block LOGIC #2, and a first real-time sensing control block RT #1.

The first output buffer block BUF #1 of the first gate driving panel circuit GPC #1 may include a scan output buffer SCBUF for outputting the first scan signal SC1 and a sensing scan output buffer SEBUF for outputting the first sensing signal SE1.

The second output buffer block BUF #2 of the second gate driving panel circuit GPC #2 may include a scan output buffer SCBUF for outputting the second scan signal SC2 and a sensing scan output buffer SEBUF for outputting the second sensing signal SE2.

The scan output buffer SCBUF included in each of the first output buffer block BUF #1 and the second output buffer block BUF #2 may include a scan pull-up transistor T6sc and a scan pull-down transistor T7sc.

The sensing output buffer SEBUF included in each of the first output buffer block BUF #1 and the second output buffer block BUF #2 may include a sensing pull-up transistor T6se and a sensing pull-down transistor T7se.

The gate bezel area GBA in the non-display area NDA of the display panel 110 may include a central area BDA separating the first output buffer block BUF #1 and the second output buffer block BUF #2.

The display panel 110 may further include a first gate low-potential voltage connection line LVL1_CP for connecting the first gate low-potential voltage line LVL1 disposed in the second power line area PLA2 to the first output buffer block BUF #1 and the second output buffer block BUF #2.

The display panel 110 may further include a second gate low-potential voltage connection line LVL2_CP for connecting the second gate low-potential voltage line LVL2 disposed in the second power line area PLA2 to the first logic block LOGIC #1 and the second logic block LOGIC #2.

The display panel 110 may further include a third gate low-potential voltage connection line LVL3_CP for connecting the third gate low-potential voltage line LVL3 disposed in the second power line area PLA2 to the first logic block LOGIC #1 and the second logic block LOGIC #2.

The first gate low-potential voltage connection line LVL1_CP, the second gate low-potential voltage connection line LVL2_CP, and the third gate low-potential voltage connection line LVL3_CP may pass through the central area BDA.

The scan output buffer SCBUF of the first output buffer block BUF #1 and the scan output buffer SCBUF of the second output buffer block BUF #2 may have a symmetrical structure with respect to the central area BDA.

For example, the positions or shapes of the elements included in the scan output buffer SCBUF of the first output buffer block BUF #1 and the positions or shapes of the elements included in the scan output buffer SCBUF of the second output buffer block BUF #2 may be symmetrical with respect to the central area BDA. Here, elements included in the scan output buffer SCBUF may include transistors T6sc and T7sc and capacitors Csc.

The sensing output buffer SEBUF of the first output buffer block BUF #1 and the sensing output buffer SEBUF of the second output buffer block BUF #2 may have a symmetrical structure with respect to the central area BDA.

For example, the positions or shapes of the elements included in the sensing output buffer SEBUF of the first output buffer block BUF #1 and the positions or shapes of the elements included in the sensing output buffer SEBUF of the second output buffer block BUF #2 may be symmetrical with respect to the central area BDA. Here, elements included in the sensing output buffer SEBUF may include transistors T6se and T7se and capacitors Cse.

The clock signal line area CLA may be positioned on one side of the gate driving panel circuit area GPCA, and may be an area in which a plurality of clock signal lines CL are disposed.

For example, the clock signal line area CLA may include a carry clock signal line area CRC, a scan clock signal line area SCC, and a sensing clock signal line area SEC.

The plurality of clock signal lines CL may include a plurality of carry clock signal lines CL_CRCLK disposed in the carry clock signal line area CRC, a plurality of scan clock signal lines CL_SCCLK disposed in the scan clock signal line area SCC, and a plurality of sensing clock signal lines CL_SECLK disposed in the sensing clock signal line area SEC.

Each of the plurality of carry clock signal lines CL_CRCLK, the plurality of scan clock signal lines CL_SCCLK, and the plurality of sensing clock signal lines CL_SECLK requires load reduction for gate driving, and thus may have a multi-layer line structure.

The scan clock signal SCCLK and the sensing clock signal SECLK may be more sensitive to signal delay or signal waveform change in terms of driving than the carry clock signal CRCLK. Accordingly, to reduce the load of the plurality of scan clock signal lines CL_SCCLK and the plurality of sensing clock signal lines CL_SECLK, the line width of each of the plurality of scan clock signal lines CL_SCCLK and the plurality of sensing clock signal lines CL_SECLK may be designed to be larger than the line width of each of the plurality of carry clock signal lines CL_CRCLK.

The plurality of scan clock signal lines CL_SCCLK may be disposed between the plurality of carry clock signal lines CL_CRCLK and the plurality of sensing clock signal lines CL_SECLK. The plurality of carry clock signal lines CL_CRCLK may be positioned farther from the gate driving panel circuit area GPCA than the plurality of sensing clock signal lines CL_SECLK.

The first power line area PLA1 may include a gate high-potential voltage line HVL positioned on one side of the gate driving panel circuit area GPCA and disposed in the column direction.

For example, the gate high-potential voltage line HVL may include a first gate high-potential voltage line HVL1 for transferring the first gate high-potential voltage GVDD to the first gate driving panel circuit GPC #1 and the second gate driving panel circuit GPC #2, a second gate high-potential voltage line HVL2 for transferring the second gate high-potential voltage GVDD_o to the first gate driving panel circuit GPC #1 and the second gate driving panel circuit GPC #2, and a third gate high-potential voltage line HVL3 for transferring the third gate high-potential voltage GVDD2 to the first gate driving panel circuit GPC #1 and the second gate driving panel circuit GPC #2.

The first gate high-potential voltage line HVL1 may be the first gate high-potential node HV1 or may be electrically connected to the first gate high-potential node HV1. The second gate high-potential voltage line HVL2 may be the second gate high-potential node HV2 or may be electrically connected to the second gate high-potential node HV2. The third gate high-potential voltage line HVL3 may be the third gate high-potential node HV3 or may be electrically connected to the third gate high-potential node HV3.

The first gate high-potential voltage GVDD, the second gate high-potential voltages GVDD_o, and the third gate high-potential voltage GVDD2 may be supplied to the first logic block LOGIC #1 included in the first gate driving panel circuit GPC #1 and the second logic block LOGIC #2 included in the second gate driving panel circuit GPC #2.

Among the first gate high-potential voltage GVDD, the second gate high-potential voltages GVDD_o, and the third gate high-potential voltage GVDD2, the first gate high-potential voltage GVDD may also be supplied to the first real-time sensing control block RT #1 included in the first gate driving panel circuit GPC #1.

The second power line area PLA2 may include a gate low-potential voltage line LVL positioned on the other side of the gate driving panel circuit area GPCA and disposed in the column direction.

For example, the gate low-potential voltage line LVL may include a first gate low-potential voltage line LVL1 for transferring the first gate low-potential voltage GVSS0 to the first gate driving panel circuit GPC #1 and the second gate driving panel circuit GPC #2, a second gate low-potential voltage line LVL2 for transferring the second gate low-potential voltage GVSS1 to the first gate driving panel circuit GPC #1 and the second gate driving panel circuit GPC #2, and a third gate low-potential voltage line LVL3 for transferring the third gate low-potential voltage GVSS2 to the first gate driving panel circuit GPC #1 and the second gate driving panel circuit GPC #2.

The first gate low-potential voltage line LVL1 may be the first gate low-potential node LV1 or may be electrically connected to the first gate low-potential node LV1. The second gate low-potential voltage line LVL2 may be the second gate low-potential node LV2 or may be electrically connected to the second gate low-potential node LV2. The third gate low-potential voltage line LVL3 may be the third gate low-potential node LV3 or may be electrically connected to the third gate low-potential node LV3.

The first gate low-potential voltage GVSS0 may be supplied to the scan output buffer SCBUF and the sensing output buffer SEBUF included in the first output buffer block BUF #1 of the first gate driving panel circuit GPC #1, and may be supplied to the scan output buffer SCBUF and the sensing output buffer SEBUF included in the second output buffer block BUF #2 of the second gate driving panel circuit GPC #2.

The first gate low-potential voltage GVSS0 may be applied to the drain nodes or the source nodes of the scan pull-down transistor T7sc and the sensing pull-down transistor T7se included in the first output buffer block BUF #1, and may be applied to the drain nodes or the source nodes of the scan pull-down transistor T7sc and the sensing pull-down transistor T7se included in the second output buffer block BUF #2.

The first gate low-potential voltage connection line LVL1_CP may electrically connect the drain nodes or the source nodes of the scan pull-down transistor T7sc and the sensing pull-down transistor T7se included in the first output buffer block BUF #1 to the first gate low-potential voltage line LVL1.

Further, the first gate low-potential voltage connection line LVL1_CP may electrically connect the drain nodes or the source nodes of the scan pull-down transistor T7sc and the sensing pull-down transistor T7se included in the second output buffer block BUF #2 to the first gate low-potential voltage line LVL1.

The first gate low-potential voltage connection line LVL1_CP may be disposed in the row direction and may pass through the central area BDA.

The second gate low-potential voltage GVSS1 may be supplied to the first logic block LOGIC #1 of the first gate driving panel circuit GPC #1 and the second logic block LOGIC #2 of the second gate driving panel circuit GPC #2.

The second gate low-potential voltage GVSS1 may be applied to the drain node or the source node of the first inverter control transistor T4q included in the first logic block LOGIC #1, and may be applied to the drain node or the source node of the first inverter control transistor T4q included in the second logic block LOGIC #2.

The second gate low-potential voltage connection line LVL2_CP may electrically connect the drain node or the source node of the first inverter control transistor T4q included in the first logic block LOGIC #1 to the second gate low-potential voltage line LVL2. Further, the second gate low-potential voltage connection line LVL2_CP may electrically connect the drain node or the source node of the first inverter control transistor T4q included in the second logic block LOGIC #2 to the second gate low-potential voltage line LVL2.

The third gate low-potential voltage GVSS2 may be supplied to the first logic block LOGIC #1 of the first gate driving panel circuit GPC #1, and may be supplied to the second logic block LOGIC #2 of the second gate driving panel circuit GPC #2.

The third gate low-potential voltage GVSS2 may be included in each of the first logic block LOGIC #1 and the second logic block LOGIC #2 and may be applied to the drain nodes or source nodes of the holding transistors Holding TFT connected to the third gate low-potential node LV3. Here, the holding transistors Holding TFTs may include a second Q node discharge transistor T3na, a fourth Q node discharge transistor T3nc, a second stabilization transistor T3a, a second QB node discharge transistor T5q, a first QB node discharge transistor T5, and a fourth QB node discharge transistor T5b.

The third gate low-potential voltage connection line LVL3_CP may be included in each of the first logic block LOGIC #1 and the second logic block LOGIC #2, and may electrically connect the drain nodes or source nodes of holding transistors Holding TFT connected to the third gate low-potential node LV3 to the third gate low-potential voltage line LVL3.

Further, the third gate low-potential voltage GVSS2 may be applied to the drain node or source node of the carry-pull-down transistor T7cr included in the carry output buffer CRBUF of each of the first output buffer block BUF #1 and the second output buffer block BUF #2.

As described above, since the first output buffer block BUF #1 and the second output buffer block BUF #2 have a symmetric structure with respect to the central area BDA, efficient transfer (supply) of the gate low-potential voltages GVSS0, GVSS1, and GVSS2 may be possible.

The use and structure of the first to third gate high-potential voltage lines HVL1, HVL2, and HVL3 and the use and structure of the first to third gate low-potential voltage lines LVL1, LVL2, and LVL3 are described below.

The first gate high-potential voltage GVDD transferred through the first gate high-potential voltage line HVL1 may be a high-potential voltage supplied to the Q node charge block of the input/reset block IR of each of the first logic block LOGIC #1 and the second logic block LOGIC #2 and used when charging the Q node. For example, the first gate high-potential voltage GVDD transferred through the first gate high-potential voltage line HVL1 may be a high-potential voltage used to charge the Q node by being connected to the drain node or source node of the first Q node charge transistor T1.

Further, the first gate high-potential voltage GVDD transferred through the first gate high-potential voltage line HVL1 may be a high-potential voltage supplied to the first real-time sensing control block RT #1 and used to charge the Q node during the real-time sensing driving period.

The second gate high-potential voltage GVDD_o transferred through the second gate high-potential voltage line HVL2 may be a high-potential voltage supplied to the inverter block IVT of each of the first logic block LOGIC #1 and the second logic block LOGIC #2 and used to charge the QB node.

The third gate high-potential voltage GVDD2 transferred through the third gate high-potential voltage line HVL3 may be applied to the drain node (or source node) and the gate node of the first Q node charge control transistor T11 included in each of the first logic block LOGIC #1 and the second logic block LOGIC #2, and may be applied to the Q node charge control node Nqc through the first Q node charge control transistor T11. The first Q node charge control transistor T11 included in each of the first logic block LOGIC #1 and the second logic block LOGIC #2 may serve to compensate for the negative threshold voltage of the first Q node charge transistor T1.

The first gate low-potential voltage GVSS0 transferred through the first gate low-potential voltage line LVL1 may be supplied to the scan output buffer SCBUF and the sensing output buffer SEBUF of the first output buffer block BUF #1 to change the voltage levels of the first scan signal SC1 and the first sensing signal SE1 to the turn-off voltage level. Accordingly, driving of the first scan signal line SCL1 and the first sensing signal line SENL1 may be turned off.

The first gate low-potential voltage GVSS0 transferred through the first gate low-potential voltage line LVL1 may be supplied to the scan output buffer SCBUF and the sensing output buffer SEBUF of the second output buffer block BUF #2 to change the voltage levels of the second scan signal SC2 and the second sensing signal SE2 to the turn-off voltage level. Accordingly, driving of the second scan signal line SCL2 and the second sensing signal line SENL2 may be turned off.

The second gate low-potential voltage GVSS1 transferred through the second gate low-potential voltage line LVL2 may be a low-potential voltage applied to the drain node or source node of the first inverter control transistor T4q included in the inverter block IVT of each of the first logic block LOGIC #1 and the second logic block LOGIC #2.

The second gate low-potential voltage GVSS1 may be configured as a separate low-potential voltage separated from the third gate low-potential voltage GVSS2.

The third gate low-potential voltage GVSS2 transferred through the third gate low-potential voltage line LVL3 may be a low-potential voltage supplied to each of the first logic block LOGIC #1 and the second logic block LOGIC #2 and used to discharge (or turn off) the Q node and to discharge (or turn off) the QB node.

The third gate low-potential voltage GVSS2 transferred through the third gate low-potential voltage line LVL3 may be a power voltage supplied to the largest number of transistors.

Since the first gate high-potential voltage GVDD, the second gate high-potential voltages GVDD_o and GVDD_e, the first gate low-potential voltage GVSS0, the second gate low-potential voltage GVSS1, and the third gate low-potential voltage GVSS2 directly affect the outputs of the first gate driving panel circuit GPC #1 and the second gate driving panel circuit GPC #2, it may be better to reduce the line resistance of each of the first gate high-potential voltage line HVL1, the second gate high-potential voltage line HVL2, the first gate low-potential voltage line LVL1, the second gate low-potential voltage line LVL2, and the third gate low-potential voltage line LVL3.

Accordingly, the first gate high-potential voltage line HVL1, the second gate high-potential voltage line HVL2, the first gate low-potential voltage line LVL1, the second gate low-potential voltage line LVL2, and the third gate low-potential voltage line LVL3 may have a multi-layer line structure.

The first Q node charge control transistor T11 connected to the third gate high-potential voltage line HVL3 does not require a high voltage. Further, there are many lines crossing and overlapping the third gate high-potential voltage line HVL3. Thus, the third gate high-potential voltage line HVL3 may have a single-layer line structure.

Hereinafter, a multi-layer line structure of the plurality of clock signal lines CL is described, a multi-layer line structure of each of the first gate high-potential voltage line HVL1, the second gate high-potential voltage line HVL2, the first gate low-potential voltage line LVL1, the second gate low-potential voltage line LVL2, and the third gate low-potential voltage line LVL3 is described, and a single-layer line structure of the third gate high-potential voltage line HVL3 is described.

Figure 16A:
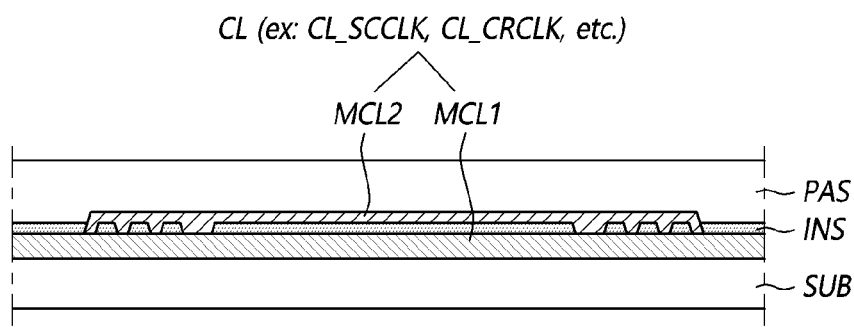
FIG. 16A illustrates a multi-layer line structure of a clock signal line in a gate bezel area in a display panel according to embodiments of the disclosure.

FIG. 16A illustrates a multi-layer line structure of a clock signal line in a gate bezel area in a display panel according to embodiments of the disclosure.

Referring to FIG. 16A, the plurality of clock signal lines CL disposed in the clock signal line area CLA may include a carry clock signal line CL_CRCLK and a scan clock signal line CL_SCCLK, or may further include a sensing clock signal line. All or some of the plurality of clock signal lines CL may be multi-layer lines.

The clock signal line CL having the multi-layer line structure may include a first metal clock signal line MCL1 and a second metal clock signal line MCL2 electrically connected to each other. The first metal clock signal line MCL1 and the second metal clock signal line MCL2 may be positioned on different layers and may be electrically connected to each other.

The first metal clock signal line MCL1 may be disposed in the first metal layer, which is a metal layer between the substrate SUB and the insulation layer INS on the substrate SUB.

The second metal clock signal line MCL2 may be disposed in the second metal layer, which is a metal layer between the insulation layer INS and the protection layer PAS on the insulation layer INS.

For example, the insulation layer INS may include a buffer layer and a gate insulation film.

The buffer layer may have a single layer or a multiple layer of an inorganic insulating material such as silicon oxide (SiO2) and silicon nitride (SiNx). For example, the buffer layer may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The second metal clock signal line MCL2 may be connected to the first metal clock signal line MCL1 through a contact hole of the insulation layer INS.

For example, a light shield may be positioned under the active layer (channel) of the driving transistor DRT formed in the display area DA and may overlap the channel of the driving transistor DRT. An insulation layer (e.g., a buffer layer) may be disposed between the channel of the driving transistor DRT and the light shield. The light shield may be formed of a first metal (e.g., a light shield metal). In other words, the first metal layer may be a metal layer on which the light shield is disposed.

One of two or more capacitor electrodes constituting the storage capacitor Cst formed in the display area DA may be formed of the first metal (light shield metal). In other words, the first metal layer may be a metal layer where one of two or more capacitor electrodes constituting the storage capacitor Cst is disposed.

As another example, the source-drain electrode of the transistor may be formed of the first metal (e.g., source-drain metal). In other words, the first metal layer may be a metal layer where the source-drain electrode of the transistor is disposed.

For example, the scan signal line SCL and the sensing signal line SENL may be formed of a second metal (e.g., gate metal). In other words, the second metal layer may be a metal layer where the scan signal line SCL and the sensing signal line SENL are disposed. The second metal layer may be a metal layer where another one of the two or more capacitor electrodes constituting the storage capacitor Cst formed in the display area DA is disposed.

Figure 16B:
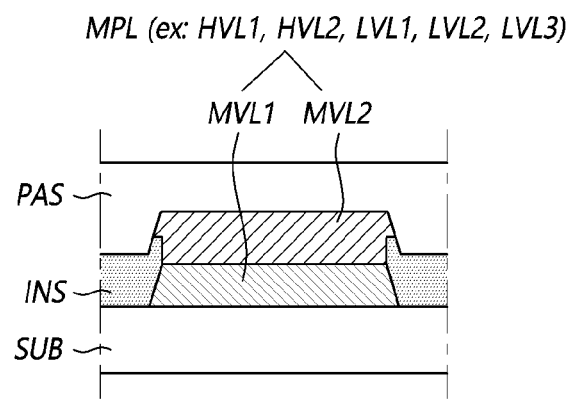
FIG. 16B illustrates a multi-layer structure of a multi-layer power line in a gate bezel area in a display panel according to embodiments of the disclosure.

FIG. 16B illustrates a multi-layer structure of a multi-layer power line in a gate bezel area in a display panel according to embodiments of the disclosure.

A multi-layer power line MPL having a multi-layer line structure may be disposed in the gate bezel area GBA.

The multi-layer power line MPL may include a first metal power line MVL1 and a second metal power line MVL2. The first metal power line MVL1 and the second metal power line MVL2 may be positioned on different layers and may be electrically connected to each other.

The first metal power line MVL1 may be disposed in the first metal layer between the substrate SUB and the insulation layer INS on the substrate SUB. The second metal power line MVL2 may be disposed in the second metal layer between the insulation layer INS and the protection layer PAS on the insulation layer INS. For example, the insulation layer INS may include a buffer layer and a gate insulation film. The buffer layer may have a single layer or a multiple layer of an inorganic insulating material such as silicon oxide (SiO2) and silicon nitride (SiNx). For example, the buffer layer may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

The second metal power line MVL2 may be connected to the first metal power line MVL1 through a contact hole of the insulation layer INS.

For example, the first metal layer may be a metal layer where the light shield positioned under the channel of the driving transistor DRT formed in the display area DA is disposed. The first metal layer may be a metal layer where one of two or more capacitor electrodes constituting the storage capacitor Cst formed in the display area DA is disposed.

As another example, the first metal layer may be a metal layer constituting the source-drain electrode of the transistor.

For example, the second metal layer may be a metal layer constituting the scan signal line SCL and the sensing signal line SENL. The second metal layer may be a metal layer where another one of the two or more capacitor electrodes constituting the storage capacitor Cst formed in the display area DA is disposed.

For example, the multi-layer power line MPL having the multi-layer line structure may include a first gate high-potential voltage line HVL1, a second gate high-potential voltage line HVL2, a first gate low-potential voltage line LVL1, a second gate low-potential voltage line LVL2, and a third gate low-potential voltage line LVL3.

Figure 16C:
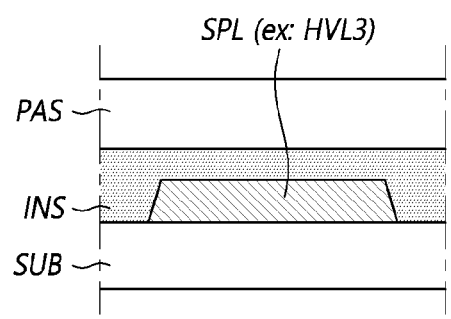
FIG. 16C illustrates a single-layer line structure of a single-layer power line in a gate bezel area in a display panel according to embodiments of the disclosure.

FIG. 16C illustrates a single-layer line structure of a single-layer power line in a gate bezel area in a display panel according to embodiments of the disclosure.

A single-layer power line SPL having a single-layer line structure may be disposed in the gate bezel area GBA.

The single-layer power line SPL may be disposed in the first metal layer between the substrate SUB and the insulation layer INS on the substrate SUB. For example, the insulation layer INS may include a buffer layer and a gate insulation film. The buffer layer may have a single layer or a multiple layer of an inorganic insulating material such as silicon oxide (SiO2) and silicon nitride (SiNx). For example, the buffer layer may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

For example, the first metal layer may be a metal layer where the light shield positioned under the channel of the driving transistor DRT formed in the display area DA is disposed. The first metal layer may be a metal layer where one of two or more capacitor electrodes constituting the storage capacitor Cst formed in the display area DA is disposed.

As another example, the first metal layer may be a metal layer constituting the source-drain electrode of the transistor.

For example, the single-layer power supply line SPL having a single-layer line structure may include a third gate high-potential voltage line HVL3.

All or some of the plurality of clock signal lines CL may be multi-layer lines. Some of the plurality of gate high-potential voltage lines HVL may be single-layer lines and the others may be multi-layer lines. The plurality of gate low-potential voltage lines LVL may be multi-layer lines.

At this time, in order for stable operation of the gate driving panel circuit GPC, the first gate high-potential voltage GVDD charging the Q node must be maintained stably. To achieve this, the voltage drop on the first gate high-potential voltage line HVL1 transferring the first gate high-potential voltage GVDD must not be large.

For this purpose, it is effective to reduce the first current flowing through the first gate high-potential voltage line HVL1 and reduce the line resistance formed in the first gate high-potential voltage line HVL1.

Figure 17:
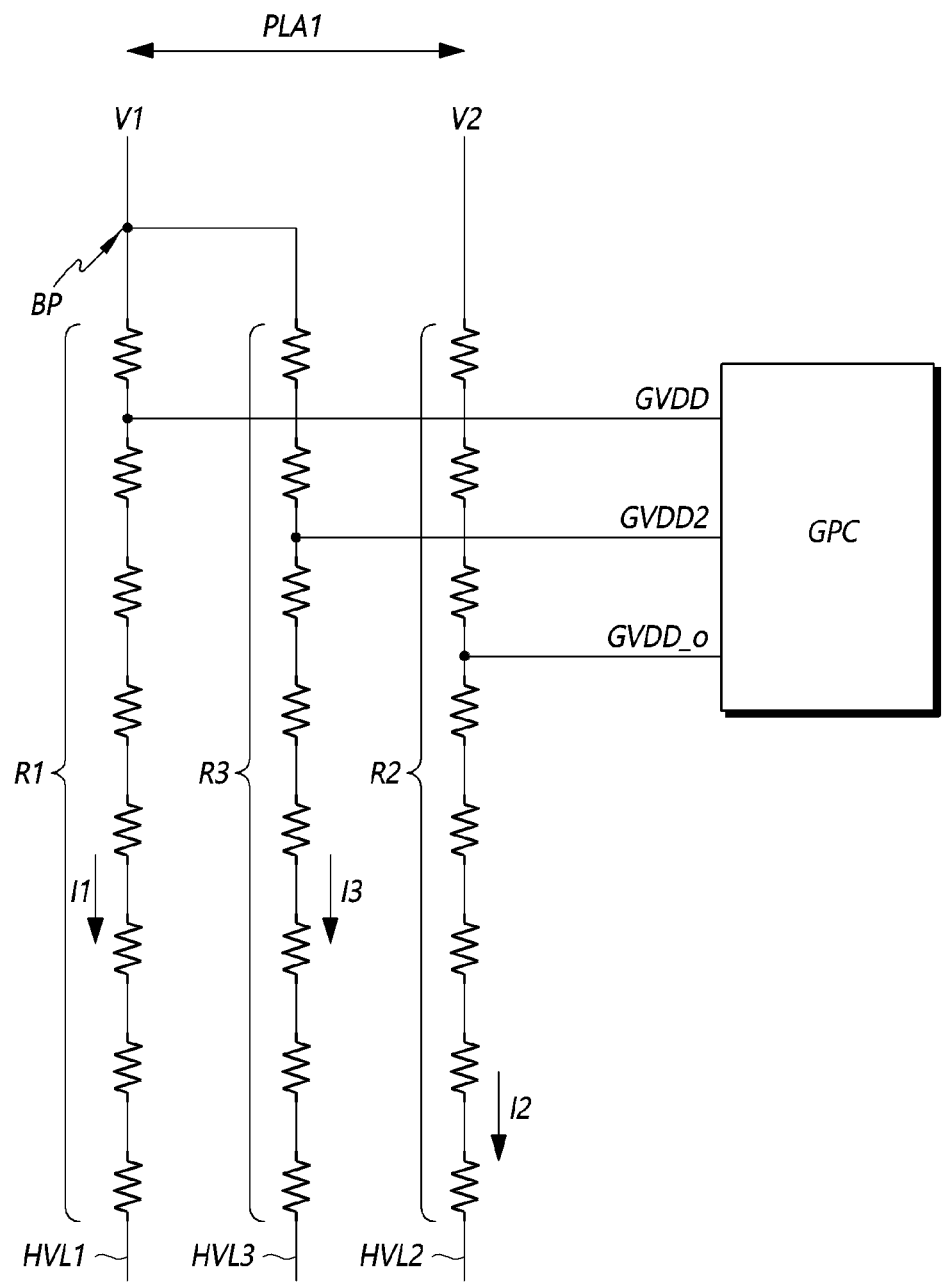
FIG. 17 is a circuit diagram showing the arrangement structure of the gate high-potential voltage lines in the display panel according to embodiments of the disclosure.

FIG. 17 is a circuit diagram showing the arrangement structure of the gate high-potential voltage lines in the display panel according to embodiments of the disclosure.

Referring to FIG. 17, a plurality of gate high-potential voltage lines HVL1, HVL2, and HVL3 transferring a plurality of gate high-potential voltages GVDD, GVDD2, and GVDD_o may be disposed at the first power line area PLA1 in the display panel 110 according to embodiments of the disclosure.

For example, the first gate high-potential voltage GVDD may be a voltage used to charge the Q node in the gate driving panel circuit GPC. The third gate high-potential voltage GVDD2 may be a voltage for reducing the voltage drop of the transistor (e.g., T1 and T1a in FIG. 12) controlling the Q node. The second gate high-potential voltage GVDD_o may be a voltage used to charge the QB node.

Since the Q node of the gate driving panel circuit GPC may greatly affect the operation of the display device 100, the voltage drop of the first gate high-potential voltage GVDD charging the Q node must not be large due to the first current I1 flowing through the first gate high-potential voltage line HVL1.

For the above purpose, it is effective to reduce the level of the first current I1 flowing through the first gate high-potential voltage line HVL1, and to reduce the first line resistance R1 formed in the first gate high-potential voltage line HVL1.

First, the third gate high-potential voltage line HVL3 forming the third gate high-potential voltage GVDD2 may be branched from the first gate high-potential voltage line HVL1.

That is, the first gate high-potential voltage line HVL1 and the third gate high-potential voltage line HVL3 may be connected to share the first voltage V1. When the first line resistance R1 of the first gate high-potential voltage line HVL1 is different from the third line resistance R3 of the third gate high-potential voltage line HVL3, the first gate high-potential voltage GVDD may be different from the third gate high-potential voltage GVDD2.

On the other hand, when the first line resistance R1 of the first gate high-potential voltage line HVL1 is same as the third line resistance R3 of the third gate high-potential voltage line HVL3, the first high-potential voltage GVDD may be same as the third gate high-potential voltage GVDD2.

When the third gate high-potential voltage line HVL3 is branched from the branch point BP of the first gate high-potential voltage line HVL1, the current flowing by the first voltage V1 is divided into a first current I1 flowing through the first gate high-potential voltage line HVL1 and a third current I3 flowing through the third gate high-potential voltage line HVL3 from the branch point BP. Accordingly, the first current I1 flowing through the first gate high-potential voltage line HVL1 may be reduced, and the voltage drop in the first gate high-potential voltage line HVL1 may be reduced.

On the other hand, a second voltage V2 different from the first voltage V1 may be supplied to the second gate high-potential voltage line HVL2 transferring the second gate high-potential voltage GVDD_o. Accordingly, the level of the second gate high potential-voltage GVDD_o may be determined by the second current I2 flowing through the second gate high-potential voltage line HVL2 and the second line resistance R2 of the second gate high-potential voltage line HVL2.

In short, the voltage of the first gate high-potential voltage GVDD charging the Q node in the display panel 110 of the disclosure may be stably maintained by electrically separating the first gate high-potential voltage line HVL1 for charging the Q node of the gate driving panel circuit GPC from the second gate high-potential voltage line HVL2 for charging the QB node, and by branching the third gate high-potential voltage line HVL3 for controlling an operation of a transistor that controls the Q node from the first gate high-potential voltage line HVL1.

In addition, the display panel 110 of the disclosure may stably maintain the first gate high-potential voltage GVDD for charging the Q node by reducing the first line resistance R1 of the first gate high-potential voltage line HVL1 for charging the Q node of the gate driving panel circuit GPC.

Figure 18:
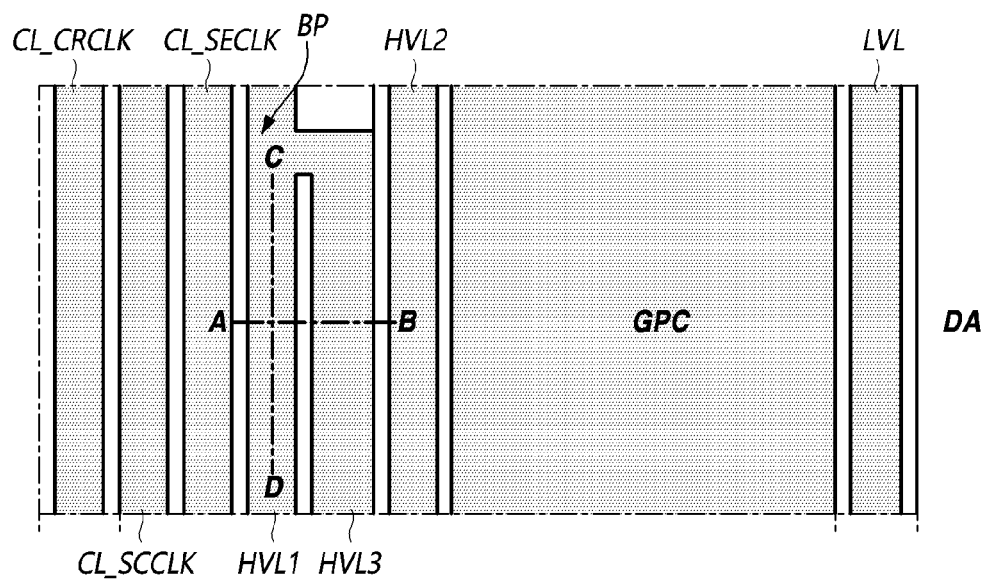
FIG. 18 is a diagram showing an exemplary top view of the gate bezel area in a display panel according to embodiments of the disclosure.

FIG. 18 is a diagram showing an exemplary top view of the gate bezel area in a display panel according to embodiments of the disclosure.

Referring to FIG. 18, at least one gate driving panel circuit GPC and a plurality of gate control signal lines are disposed in the non-display area NDA on at least one side of the display area DA.

A plurality of gate control signal lines may include a carry clock signal line CL_CRCLK transferring the carry clock signal CRCLK, a scan clock signal line CL_SCCLK transferring the scan clock signal SCCLK, a sensing clock signal line CL_SECLK transferring the sensing clock signal SECLK, the gate high-potential voltage lines HVL1, HVL2 and HVL3 transferring the gate high-potential voltages GVDD, GVDD2 and GVDD_o, and the gate low-potential voltage line LVL transferring the gate low-potential voltage GVSS.

The first gate high-potential voltage GVDD may be a voltage used to charge the Q node of the gate driving panel circuit GPC. The second gate high-potential voltage GVDD_o may be a voltage used to charge the QB node of the gate driving panel circuit GPC. The third gate high-potential voltage GVDD2 may be a voltage to reduce the voltage drop of the transistor controlling the Q node.

Meanwhile, the gate low-potential voltage line LVL may be composed of a plurality of gate low-potential voltage lines transferring a plurality of gate low-potential voltages with different levels, but only one gate low-potential voltage line LVL is shown here.

The third gate high-potential voltage line HVL3 forming the third gate high-potential voltage GVDD2 may be branched from the first gate high-potential voltage line HVL1 at the branch point BP in the display panel 110 of the disclosure. On the other hand, the second gate high-potential voltage line HVL2 may be electrically separated from the first gate high-potential voltage line HVL1.

In this way, when the third gate high-potential voltage line HVL3 is branched from the first gate high-potential voltage line HVL1, the current due to the first voltage V1 is divided into the first current I1 flowing through the first gate high-potential voltage line HVL1 and the third current I3 flowing through the third gate high-potential voltage line HVL3. Therefore, the voltage drop in the first gate high-potential voltage line HVL1 can be reduced.

In addition, the display panel 110 of the disclosure has a structure in which the third gate high-potential voltage line HVL3 is branched from the first gate high-potential voltage line HVL1. Since the first line resistance R1 of the first gate high-potential voltage line HVL1 is smaller than the third line resistance R3 of the third gate high-potential voltage line HVL3, the first gate high-potential voltage GVDD charging the Q node can be maintained stably.

Figure 19:
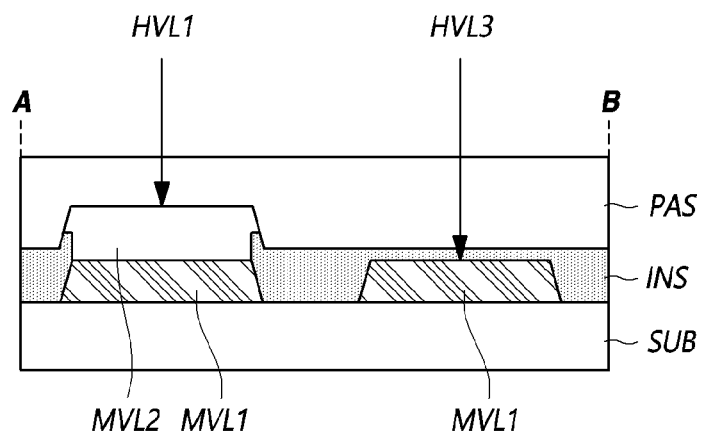
FIG. 19 is a diagram showing a horizontal cross-section of a first gate high-potential voltage line and a third gate high-potential voltage line in a display panel according to embodiments of the disclosure.
Figure 20:
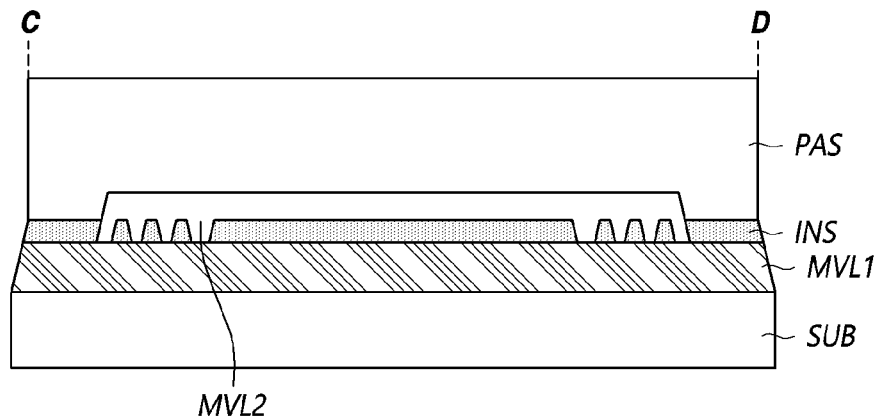
FIG. 20 is a diagram showing a vertical cross-section of a first gate high-potential voltage line in a display panel according to embodiments of the disclosure.

FIG. 19 is a diagram showing a horizontal cross-section of a first gate high-potential voltage line and a third gate high-potential voltage line in a display panel according to embodiments of the disclosure. FIG. 20 is a diagram showing a vertical cross-section of a first gate high-potential voltage line in a display panel according to embodiments of the disclosure. Specifically, FIG. 19 shows a cross-section cut along the A-B line in FIG. 18, and FIG. 20 shows a cross-section cut along the C-D line in FIG. 18.

Referring to FIGS. 19 and 20, the first gate high-potential voltage line HVL1 may be formed in a multi-layer line structure and the third gate high-potential voltage line HVL3 may be formed in a single-layer line structure in the display panel 110 of the disclosure. Therefore, the first line resistance R1 of the first gate high-potential voltage line HVL1 may be smaller than the third line resistance R3 of the third gate high-potential voltage line HVL3.

First, the first metal power line MVL1 may be formed in the non-display area NDA where the first gate high-potential voltage line HVL1 and the third gate high-potential voltage line HVL3 are located on the substrate SUB.

The first metal power line MVL1 may independently form the third gate high-potential voltage line HVL3.

Additionally, the first metal power line MVL1 may serve as a shield layer to block light from entering from the lower part of the display panel 110.

An insulating layer INS (for example, interlayer insulating film INS) may be formed on the first metal power line MVL1. The insulating layer INS may have a single layer or a multiple layer of an inorganic insulating material such as silicon oxide (SiO2) and silicon nitride (SiNx). For example, the insulating layer INS may be formed by inorganic film in a single layer or in multiple layers, for example, the inorganic film in a single layer may be a silicon oxide (SiOx) film or a silicon nitride (SiNx) film, and inorganic films in multiple layers may formed by alternately stacking one or more silicon oxide (SiOx) films, one or more silicon nitride (SiNx) films, and one or more amorphous silicon (a-Si), but the present disclosure is not limited thereto.

In the area where the first gate high-potential voltage line HVL1 is formed, the first metal power line MVL1 may be exposed through a contact hole formed in a partial area of the interlayer insulating film INS, and a second metal power line MVL2 may be formed on the top of that. Through this, the first gate high-potential voltage line HVL1 may be formed in a multi-layer line structure.

The first metal power line MVL1 may be electrically connected to the second metal power line MVL2 through a contact hole formed in the interlayer insulating layer INS. Accordingly, the first gate high-potential voltage line HVL1 may be formed into a multi-layer line structure including the first metal power line MVL1 and the second metal power line MVL2 electrically connected through a contact hole formed in the interlayer insulating film INS.

The first gate high-potential voltage line HVL1 may be formed as a multi-layer line structure in which the first metal power line MVL1 is connected to the second metal power line MVL2, thereby increasing the cross-sectional area through which current flows and reducing the line resistance.

The second metal power line MVL2 may be formed of the same metal as the gate electrode of the transistor constituting the subpixel SP, and the interlayer insulating film INS may be formed of a gate insulating film.

A planarization layer PAS may be formed on the second metal power line MVL2 and the interlayer insulating film INS.

As described previously, it is important to stably maintain the level of the first gate high-potential voltage GVDD since it is a voltage used to charge the Q node of the gate driving panel circuit GPC. On the other hand, the third gate high-potential voltage GVDD2 may be relatively free from level changes compared to the first gate high-potential voltage GVDD since it is a voltage to reduce the voltage drop of the transistor that controls the Q node.

Therefore, when arranging a third signal line extending in the vertical direction, errors caused by signal interference may be reduced by arranging the third signal line at a position closer to the third gate high-potential voltage line HVL3 than the first gate high-potential voltage line HVL1.

Figure 21:
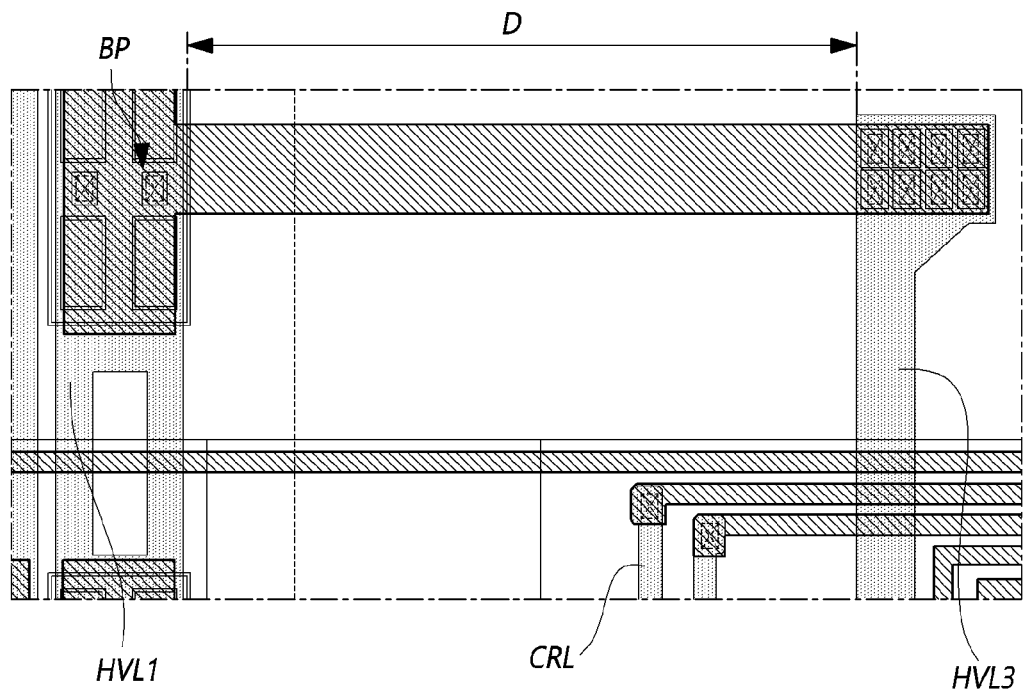
FIG. 21 is a plan view illustrating the arrangement of a first gate high-potential voltage line, a third gate high-potential voltage line, and a third signal line in a display panel according to embodiments of the disclosure.

FIG. 21 is a plan view illustrating the arrangement of a first gate high-potential voltage line, a third gate high-potential voltage line, and a third signal line in a display panel according to embodiments of the disclosure.

Referring to FIG. 21, the third gate high-potential voltage line HVL3 forming the third gate high-potential voltage GVDD2 may be branched from the first gate high-potential voltage line HVL1 at the branch point BP in the display panel 110 of the disclosure. On the other hand, the second gate high-potential voltage line HVL2 may be electrically separated from the first gate high-potential voltage line HVL1.

In here, it is important to stably maintain the level of the first gate high-potential voltage GVDD since it is a voltage used to charge the Q node of the gate driving panel circuit GPC. On the other hand, the third gate high-potential voltage GVDD2 may be relatively free from level changes compared to the first gate high-potential voltage GVDD since it is a voltage to reduce the voltage drop of the transistor that controls the Q node.

Accordingly, the third gate high-potential voltage line HVL3 may be branched to have a constant distance D from the first gate high-potential voltage line HVL1 at the branch point BP. And, some of the gate control signal lines may be disposed between the first gate high-potential voltage line HVL1 and the third gate high-potential voltage line HVL3.

For example, in any gate driving panel circuit GPC constituting the gate driving circuit 130, the carry signal line CRL transferring the carry signal C to a rear gate driving panel circuit GPC may be disposed between the first gate high-potential voltage line HVL1 and the third gate high-potential voltage line HVL3.

At this time, the carry signal line CRL may be placed closer to the third gate high-potential voltage line HVL3 than the first gate high-potential voltage line HVL1, thereby reducing errors due to signal interference.

Figure 22:
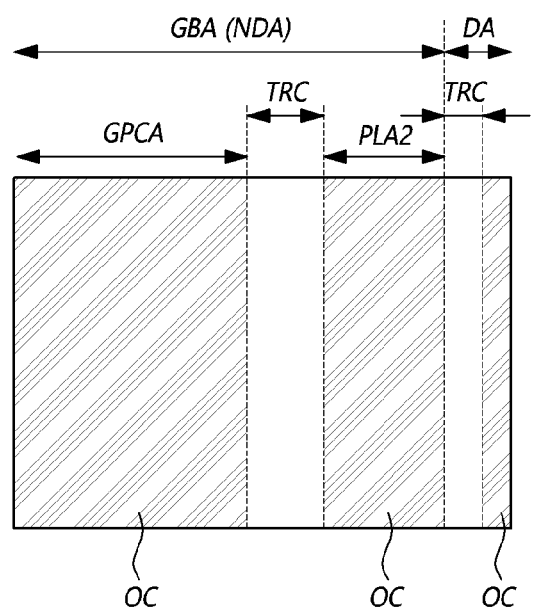
FIG. 22 is a plan view illustrating a partial area including a gate bezel area in a display panel according to embodiments of the disclosure.

FIG. 22 is a plan view illustrating a partial area including a gate bezel area in a display panel according to embodiments of the disclosure.

Referring to FIG. 22, the gate bezel area GBA in the non-display area NDA may include a gate driving panel circuit area GPCA and a second power line area PLA2.

An overcoat layer OC may be disposed in the gate bezel area GBA in the non-display area NDA. At least one trench TRC where the overcoat layer OC has been removed may be present in the gate bezel area GBA.

For example, in the overcoat layer OC, a trench TRC may be formed in at least one of a first area between the gate driving panel circuit area GPCA and the second power line area PLA1 and a second area between the second power line area PLA2 and the display area DA.

For example, the trench TRC may be present in a first area between the gate driving panel circuit area GPCA and the second power line area PLA2. In other words, the overcoat layer OC may be disposed in each of the gate driving panel circuit area GPCA and the second power line area PLA1, and an area in which the overcoat layer OC is not present between the gate driving panel circuit area GPCA and the second power line area PLA1 may correspond to the trench TRC.

For example, a trench TRC may further be present in the second area between the second power line area PLA2 and the display area DA. In other words, an overcoat layer OC may be disposed in each of the second power line area PLA2 and the display area DA, and an area where the overcoat layer OC has been removed between the second power line area PLA2 and the display area DA may correspond to an additional trench TRC.

According to the above-described trench structure, moisture H20 may be prevented from penetrating into the light emitting layer EL.

Figure 23:
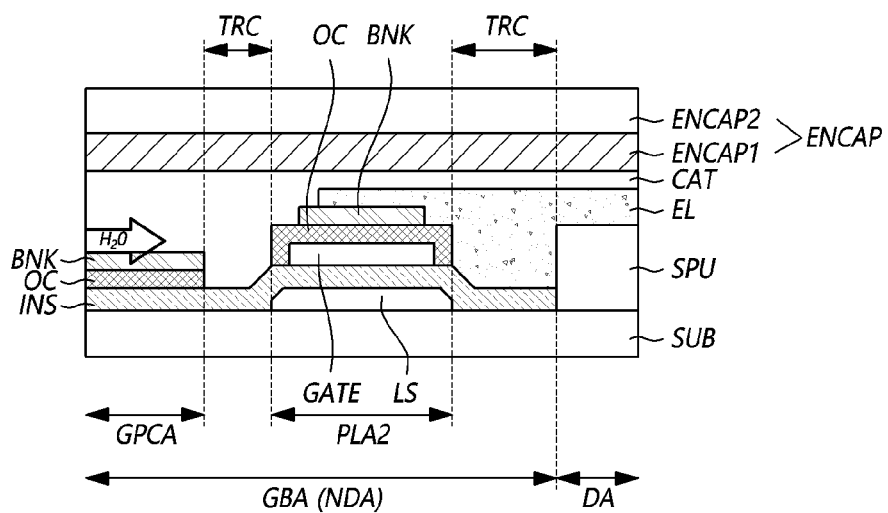
FIG. 23 is a cross-sectional view illustrating a partial area including a gate bezel area in a display panel according to embodiments of the disclosure.

FIG. 23 is a cross-sectional view illustrating a partial area including a gate bezel area in a display panel according to embodiments of the disclosure.

Referring to FIG. 23, in the second power line area PLA2 of the gate bezel area GBA, the light shield LS may be disposed on the substrate SUB.

In the gate bezel area GBA, the insulation layer INS may be disposed while covering the light shield LS.

In the second power line area PLA2 of the gate bezel area GBA, a gate material layer GATE may be disposed on the insulation layer INS and may overlap the light shield LS.

In the gate driving panel circuit area GPCA of the gate bezel area GBA, the overcoat layer OC may be disposed on the insulation layer INS.

In the second power line area PLA2 of the gate bezel area GBA, the overcoat layer OC may be disposed while covering the gate material layer GATE on the insulation layer INS.

In the gate driving panel circuit area GPCA and the second power line area PLA2 of the gate bezel area GBA, the bank BNK may be disposed on the overcoat layer OC.

For example, the bank BNK may include an opaque material (e.g., black material) to prevent a light interference between the adjacent subpixels SP1 to SP4 or between the adjacent subpixels SP1 to SP3. The bank BNK may include a shielding material of at least one of a color pigment, an organic black and a carbon.

Although not shown, a spacer may be disposed on the bank BNK. The spacer may ensure a gap between a fine metal mask (FMM) and the anode electrode AND so that the FMM is not in contact with the anode electrode AND in a deposition process of an emitting layer EL.

In the gate bezel area GBA, a trench TRC where the overcoat layer OC and the bank BNK are absent may be formed between the gate driving panel circuit area GPCA and the second power line area PLA2.

In the gate bezel area GBA, an additional trench TRC where the overcoat layer OC and the bank BNK are absent may be formed between the second power line area PLA2 and the display area DA.

Meanwhile, in the display area DA, the light emitting layer EL may be disposed under the cathode electrode CAT, and the subpixel unit SPU may be disposed under the light emitting layer EL. The subpixel unit SPU may include an anode electrode AE, transistors (e.g., DRT, SCT, or SENT), and a storage capacitor Cst. The light emitting layer EL may extend to the gate bezel area GBA of the non-display area NDA.

For example, the light emitting layer EL may extend from the display area DA to the non-display area NDA and may extend to an upper portion of the bank BNK of the second power line area PLA2 via the trench TRC.

In the display area DA, the cathode electrode CAT may be disposed on the light emitting layer EL. The cathode electrode CAT may extend to the gate bezel area GBA of the non-display area NDA. Accordingly, the cathode electrode CAT may extend from the display area DA to the whole or part of the gate driving panel circuit area GPCA.

The cathode electrode CAT may also be present in the area in which the trench TRC between the gate driving panel circuit area GPCA and the second power line area PLA2 and the trench TRC between the second power line area PLA2 and the display area DA are present.

The encapsulation layer ENCAP may be disposed on the cathode electrode CAT. The encapsulation layer ENCAP may extend from the display area DA to a partial area of the non-display area NDA.

The encapsulation layer ENCAP may include a first encapsulation layer ENCAP1 on the cathode electrode CAT and a second encapsulation layer ENCAP2 on the first encapsulation layer ENCAP1. For example, the first encapsulation layer ENCAP1 may include an adhesive and/or a desiccant having an encapsulation function. The first encapsulation layer ENCAP1 may include an organic material. The first encapsulation layer ENCAP1 may include a non-photosensitive organic insulating material such as acrylic resin, epoxy resin, phenolic resin, polyamide resin, polyimide resin, polyethylene and silicon oxycarbon (SiOC) or a photosensitive organic insulating material such as photoacryl. The second encapsulation layer ENCAP2 may include a metal or an inorganic material.

Alternatively, a first inorganic encapsulation layer, a second organic encapsulation layer, and a third inorganic encapsulation layer that sequentially stacked may be disposed on the cathode electrode CAT. The first inorganic encapsulation layer and the third inorganic encapsulation layer may be made of an inorganic material such as silicon oxide (SiOx) or silicon nitride (SiNx). The second organic encapsulation layer may be made of an organic material such as acrylic resin, epoxy resin, phenolic resin, polyamide resin, and polyimide resin. Materials of the first inorganic encapsulation layer, the second organic encapsulation layer and the third inorganic encapsulation layer are not limited thereto. Meanwhile, the encapsulation layers are not limited to three layers, for example, n layers alternately stacked between inorganic encapsulation layer and organic encapsulation layer (where n is an integer greater than 3) may be included.

Figure 24:
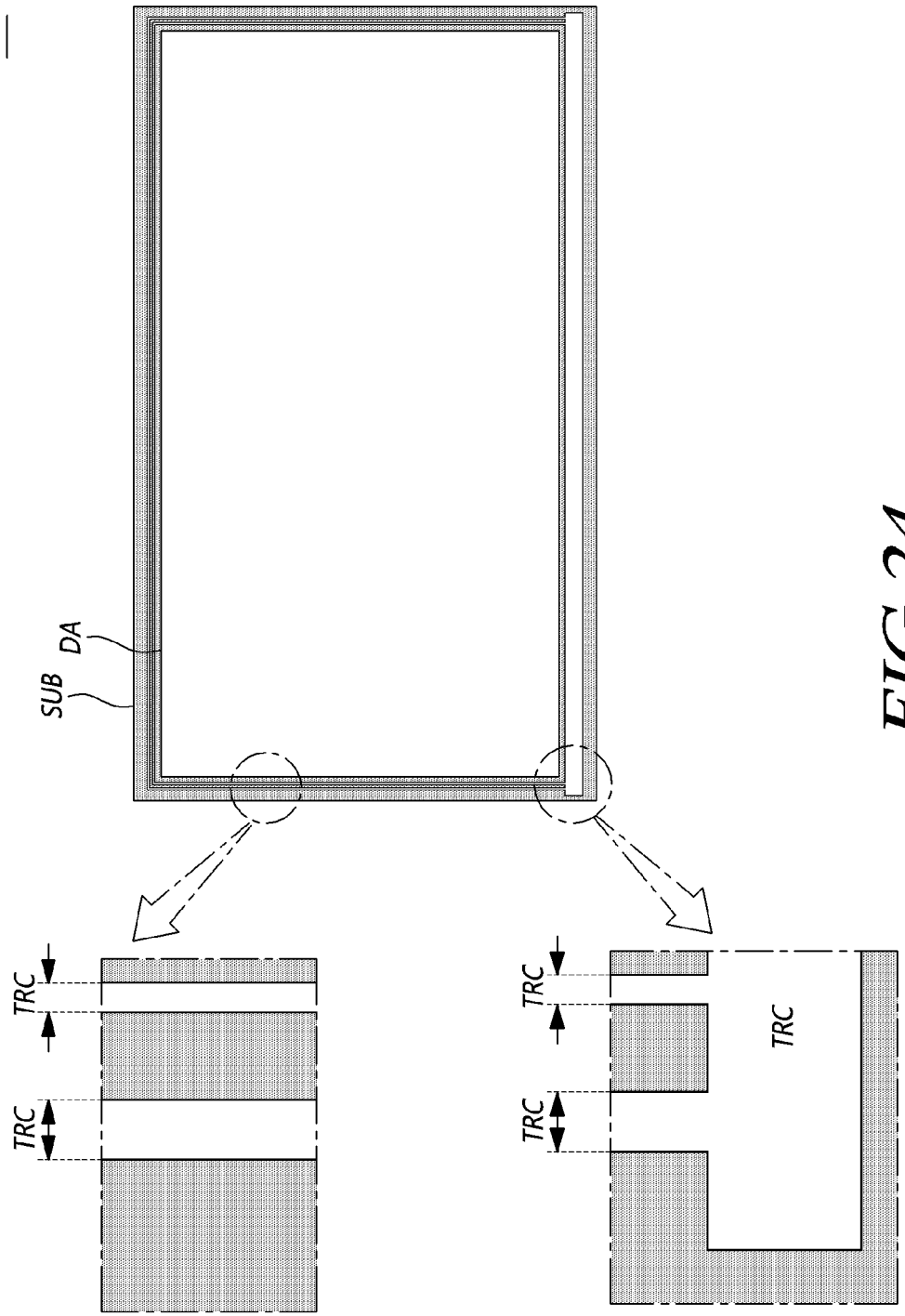
FIG. 24 is a plan view illustrating a display panel, in which a trench is formed in an entire periphery according to embodiments of the disclosure.

FIG. 24 is a plan view illustrating a display panel, in which a trench is formed in an entire periphery according to embodiments of the disclosure.

Referring to FIG. 24, the trench TRC may be formed on the entire outer periphery of the display panel 110. In other words, the trench TRC may be present in the non-display area NDA while surrounding the display area DA.

For example, two rows of trenches TRC may be formed in the three-sided outer area of the four-sided outer area of the display panel 110. For example, the width of the trenches TRC in one row may be greater than the width of each of the trenches TRC in two rows.

For example, one row of trenches TRC may be formed in the one-sided outer area of the four-sided outer area of the display panel 110. The one-sided outer area in which one row of trenches TRC are formed may be an area connected with the circuit films CF on which the source driver integrated circuits SDIC are mounted.

Figure 25:
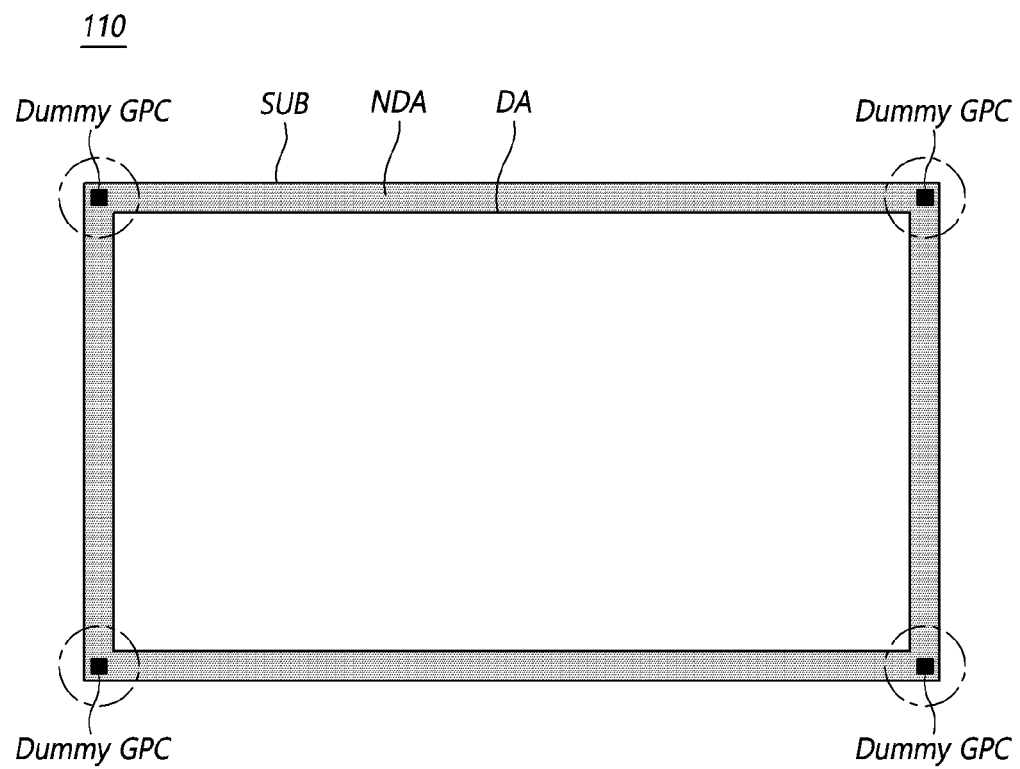
FIG. 25 is a plan view illustrating a display panel, in which a dummy gate driving panel circuit is formed at a corner point according to embodiments of the disclosure.

FIG. 25 is a plan view illustrating a display panel, in which a dummy gate driving panel circuit is formed at a corner point according to embodiments of the disclosure.

Referring to FIG. 25, the display panel 110 according to embodiments of the disclosure may include a dummy gate driving panel circuit Dummy GPC disposed at all or some of a plurality of corner points of the non-display area NDA.

The dummy gate driving panel circuit Dummy GPC has basically the same structure of the gate driving panel circuit GPC. However, the dummy gate driving panel circuit Dummy GPC is not connected to the gate line GL actually used for display driving. Here, each gate line GL may be a scan signal line SCL or a sensing signal line SENL.

Figure 26:
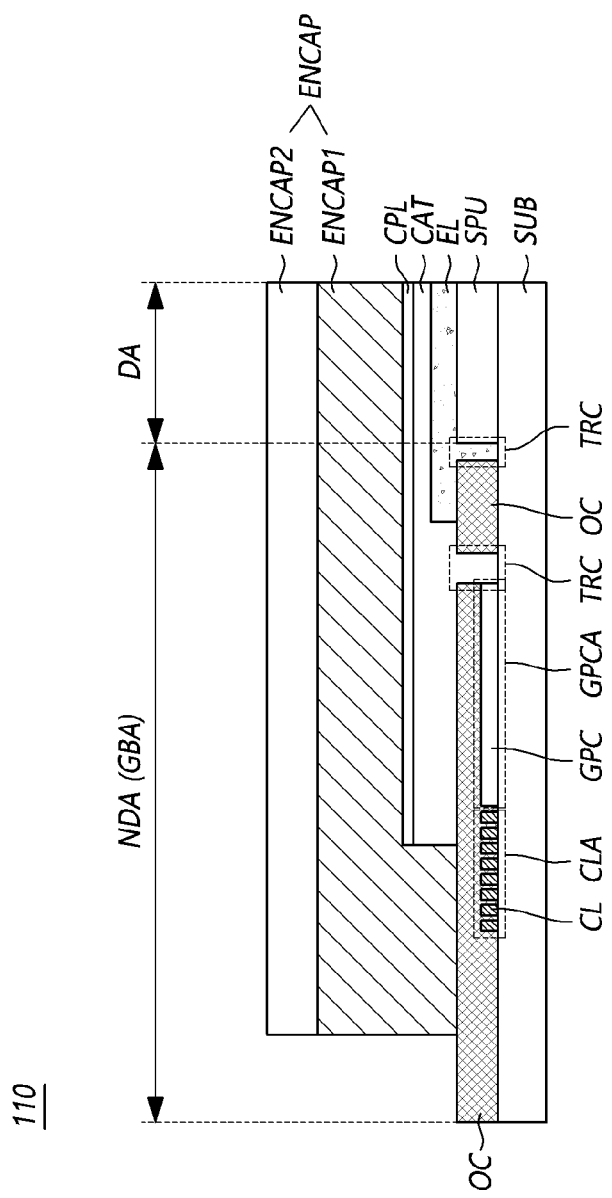
FIG. 26 is a cross-sectional view illustrating a display panel, for an area including a portion of a display area and a gate bezel area according to embodiments of the disclosure.

FIG. 26 is a cross-sectional view illustrating a display panel, for an area including a portion of a display area and a gate bezel area according to embodiments of the disclosure.

The cross-sectional view illustrated in FIG. 26 is a cross-sectional view of an area including the gate bezel area GBA where the gate driving panel circuit GPC is disposed in the non-display area NDA of the display panel 110 and a portion of the display area DA near the gate bezel area GBA.

Referring to FIG. 26, the display panel 110 according to embodiments of the disclosure may include a substrate SUB, a gate driving panel circuit GPC, a plurality of clock signal lines CL, an overcoat layer OC, a cathode electrode CAT, and the like.

The substrate SUB may be divided into a display area DA and a non-display area NDA.

The substrate SUB may include a flexible polymer film. For example, the flexible polymer film may be made of any one of polyimide (PI), polyethylene terephthalate (PET), acrylonitrile-butadiene-styrene copolymer (ABS), polymethyl methacrylate (PMMA), polyethylene naphthalate (PEN), polycarbonate (PC), polyethersulfone (PES), polyarylate (PAR), polysulfone (PSF), cyclic olefin copolymer (COC), triacetylcellulose (TAC), polyvinyl alcohol (PVA), and polystyrene (PS), and the present disclosure is not limited thereto. Alternatively, the substrate SUB may include a glass or a multiple layer where an organic layer and an inorganic layer are alternately laminated. For example, the substrate SUB may include an organic insulating material layer such as polyimide (PI) and an inorganic insulating material layer such as silicon oxide (SiO2) alternately laminated.

The gate driving panel circuit GPC may be disposed on the substrate SUB, may be disposed in the gate driving panel circuit area GPCA included in the gate bezel area GBA of the non-display area NDA, and may be configured to output a gate signal to each of the plurality of gate lines GL disposed in the display area DA.

For example, the plurality of gate lines GL may include a plurality of scan signal lines SCL and a plurality of sensing signal lines SENL.

The plurality of clock signal lines CL may be disposed on the substrate SUB and may be disposed in the clock signal line area CLA positioned on one side of the gate driving panel circuit area GPCA in the non-display area NDA. Each of the plurality of clock signal lines CL may supply a corresponding clock signal to the gate driving panel circuit GPC.

For example, the clock signal line area CLA may be disposed further outside than the gate driving panel circuit area GPCA.

For example, the plurality of clock signal lines CL may include a plurality of carry clock signal lines CL_CRCLK, a plurality of scan clock signal lines CL_SCCLK, and a plurality of sensing clock signal lines CL_SECLK.

The overcoat layer OC may be disposed on the plurality of clock signal lines CL.

The overcoat layer OC may be disposed on the gate driving panel circuit GPC.

The cathode electrode CAT may be disposed in the display area DA and may extend to the non-display area NDA.

The cathode electrode CAT may extend to the gate bezel area GBA in the non-display area NDA, and may extend to an upper portion of the whole or part of the gate driving panel circuit GPC. Accordingly, the cathode electrode CAT may overlap the whole or part of the gate driving panel circuit GPC.

The cathode electrode CAT may extend to the gate bezel area GBA in the non-display area NDA, and may extend to an upper portion of the whole or part of the plurality of clock signal lines CL. Accordingly, the cathode electrode CAT may overlap the whole or part of the plurality of clock signal lines CL.

The first power line area PLA1 may be disposed between the clock signal line area CLA and the gate driving panel circuit area GPCA, and the second power line area PLA2 may be disposed between the gate driving panel circuit area GPCA and the display area DA. However, in FIG. 25, the first power line area PLA1 and the second power line area PLA2 are omitted.

The light emitting layer EL positioned under the cathode electrode CAT may be disposed in the display area DA and may extend to a partial point of the non-display area NDA. The light emitting layer EL may overlap a portion of the overcoat layer OC.

A subpixel unit SPU may be positioned under the light emitting layer EL. The subpixel unit SPU may include an anode electrode AE, transistors (e.g., DRT, SCT, or SENT), and a storage capacitor Cst.

In the non-display area NDA, there may be a hole in the overcoat layer OC or a trench TRC corresponding to an area where the overcoat layer OC has been removed. For example, when there are a plurality of trenches TRC, one of the plurality of trenches TRC may not overlap the light emitting layer EL and another trench may overlap the light emitting layer EL. The light emitting layer EL may extend to the non-display area NDA and be interposed inside the trench TRC of the overcoat layer OC.

The display panel 110 according to embodiments of the disclosure may include a capping layer CPL on the cathode electrode CAT and an encapsulation layer ENCAP on the capping layer CPL.

The encapsulation layer ENCAP may include a first encapsulation layer ENCAP1 and a second encapsulation layer ENCAP2. For example, the first encapsulation layer ENCAP1 may include an adhesive and/or a desiccant having an encapsulation function. The first encapsulation layer ENCAP1 may include an organic material. The first encapsulation layer ENCAP1 may include a non-photosensitive organic insulating material such as acrylic resin, epoxy resin, phenolic resin, polyamide resin, polyimide resin, polyethylene and silicon oxycarbon (SiOC) or a photosensitive organic insulating material such as photoacryl. The second encapsulation layer ENCAP2 may include a metal or an inorganic material. The second encapsulation layer ENCAP2 may be disposed to cover the cathode electrode CAT, the capping layer CPL, and the first encapsulation layer ENCAP1.

Alternatively, a first inorganic encapsulation layer, a second organic encapsulation layer, and a third inorganic encapsulation layer that sequentially stacked may be disposed on the capping layer CPL. The first inorganic encapsulation layer and the third inorganic encapsulation layer may be made of an inorganic material such as silicon oxide (SiOx) or silicon nitride (SiNx). The second organic encapsulation layer may be made of an organic material such as acrylic resin, epoxy resin, phenolic resin, polyamide resin, and polyimide resin. Materials of the first inorganic encapsulation layer, the second organic encapsulation layer and the third inorganic encapsulation layer are not limited thereto. Meanwhile, the encapsulation layers are not limited to three layers, for example, n layers alternately stacked between inorganic encapsulation layer and organic encapsulation layer (where n is an integer greater than 3) may be included.

The encapsulation layer ENCAP may overlap the plurality of clock signal lines CL and the gate driving panel circuit GPC.

When manufacturing the display panel 110, each of the light emitting layer EL, the cathode electrode CAT, and the capping layer CPL may have a slightly different size or edge position depending on a process error. For example, the cathode electrode CAT may overlap none of the plurality of clock signal lines CL disposed in the clock signal line area CLA. Depending on a process error, a portion of the cathode electrode CAT may overlap the whole or part of the plurality of clock signal lines CL disposed in the clock signal line area CLA.

Figure 27:
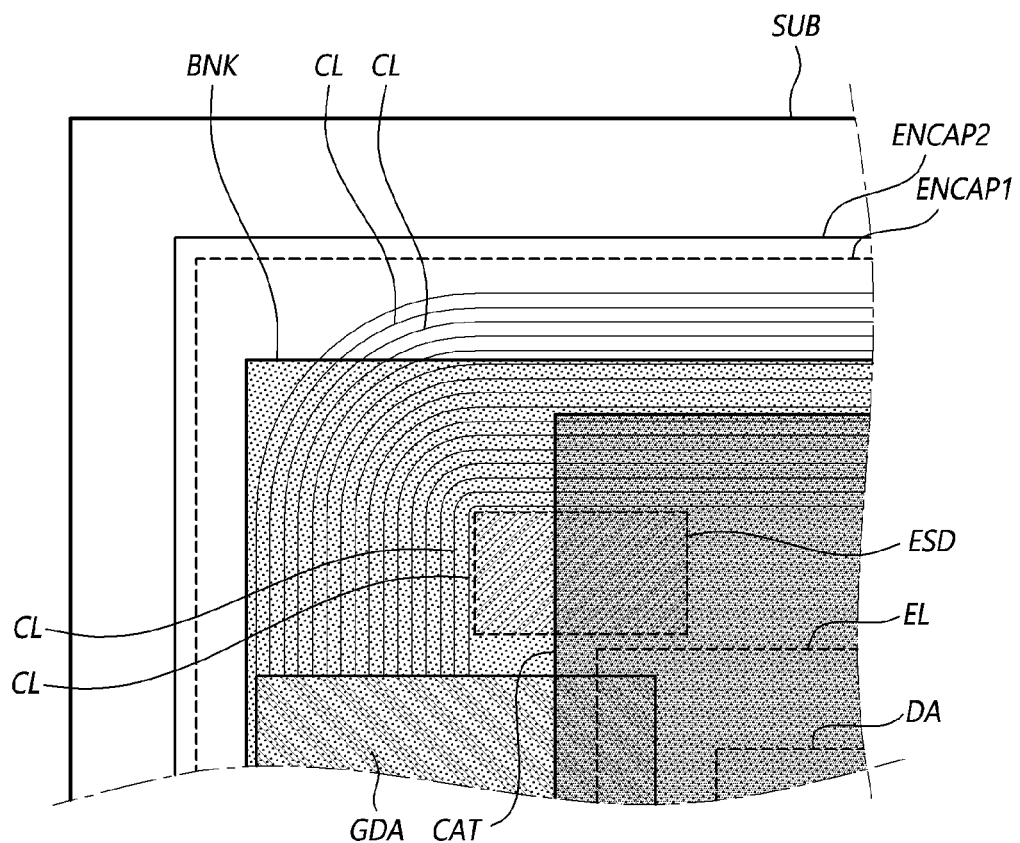
FIG. 27 is a plan view illustrating an outer corner area of a display panel according to embodiments of the disclosure.

FIG. 27 is a plan view illustrating an outer corner area of a display panel according to embodiments of the disclosure.

Referring to FIG. 27, the display panel 110 according to embodiments of the disclosure may include a bank BNK extending from the display area DA to the non-display area NDA, a light emitting layer EL extending from the display area DA to the non-display area NDA, a cathode electrode CAT extending from the display area DA to the non-display area NDA and positioned on the light emitting layer EL, and an electrostatic discharge unit ESD (e.g., an electrostatic discharge circuit) disposed in an outer corner area of the non-display area NDA.

A corner portion of the bank BNK, a corner portion of the cathode electrode CAT, a corner portion of the first encapsulation layer ENCAP1, and a corner portion of the second encapsulation layer ENCAP2 may be present in an outer corner area of the substrate SUB of the display panel 110.

In the outer corner area of the display panel 110, among the bank BNK, the cathode electrode CAT, the first encapsulation layer ENCAP1, and the second encapsulation layer ENCAP2, the bank BNK may extend further outward than the cathode electrode CAT, and the first encapsulation layer ENCAP1 and the second encapsulation layer ENCAP2 may extend further outward than the bank BNK. The second encapsulation layer ENCAP2 may extend to a position similar to that of the first encapsulation layer ENCAP1 or may extend further outward than the first encapsulation layer ENCAP1.

A portion of the gate driving area GDA may be disposed in an outer corner area of the substrate SUB of the display panel 110.

The gate driving area GDA may include a gate driving panel circuit area GPCA in which the gate driving panel circuit GPC is disposed. The gate driving area GDA may further include a clock signal line area CLA, a first power line area PLA1, and a second power line area PLA2.

The gate driving area GDA may overlap the bank BNK, the first encapsulation layer ENCAP1, and the second encapsulation layer ENCAP2. The whole or part of the gate driving area GDA may overlap the cathode electrode CAT.

An electrostatic discharge unit ESD may be disposed in an outer corner area of the substrate SUB of the display panel 110. For example, the electrostatic discharge unit ESD may include an electrostatic discharge circuit or an electrostatic discharge pattern.

The electrostatic discharge unit ESD may not be disposed only in the outer corner area of the substrate SUB, but may be disposed at various positions requiring an electrostatic discharge function.

The electrostatic discharge unit ESD may overlap the bank BNK. The whole or part of the electrostatic discharge unit ESD may overlap the cathode electrode CAT. The electrostatic discharge unit ESD may overlap each of the first encapsulation layer ENCAP1 and the second encapsulation layer ENCAP2.

For example, the bank BNK may be disposed above the entire electrostatic discharge unit ESD. The cathode electrode CAT may be disposed above a portion of the electrostatic discharge unit ESD.

A plurality of clock signal lines CL may be disposed along edges of outer corners of the substrate SUB.

The plurality of clock signal lines CL may overlap the bank BNK, the first encapsulation layer ENCAP1, and the second encapsulation layer ENCAP2. All or some of the plurality of clock signal lines CL may partially overlap the cathode electrode CAT. All or some of the plurality of clock signal lines CL may not overlap the electrostatic discharge unit ESD.

The light emitting layer EL may be disposed to extend from the display area DA to the non-display area NDA. For example, the light emitting layer EL may be one of components for configuring one of an organic light emitting diode (OLED), a quantum dot organic light emitting diode (QD-OLED), and a light emitting diode (LED) chip.

A portion of the gate driving area GDA may overlap the light emitting layer EL. The electrostatic discharge unit ESD may not overlap the light emitting layer EL. In some cases, the electrostatic discharge unit ESD may overlap the whole or part of the light emitting layer EL.

The foregoing embodiments are briefly described below.

A display panel according to the disclosure may comprise a display area where a plurality of subpixels are disposed, a gate driving circuit disposed in a non-display area outside the display area to supply a plurality of scan signals to the plurality of subpixels, and a plurality of gate high-potential voltage lines which are disposed in the non-display area for transferring a plurality of gate high-potential voltages to the gate driving circuit, wherein plurality of gate high-potential voltage lines include a first gate high-potential voltage line transferring a first gate high-potential voltage for charging a first node of the gate driving circuit, a second gate high-potential voltage line transferring a second gate high-potential voltage for charging a second node of the gate driving circuit, and a third gate high-potential voltage line which is branched from the first gate high-potential voltage line for transferring a third gate high-potential voltage to stabilize a transistor controlling the first node.

The gate driving circuit includes a plurality of gate driving panel circuits configured to generate at least one scan signal.

The plurality of gate driving panel circuits include a first gate driving panel circuit and a second gate driving panel circuit, wherein when a first node of the first gate driving panel circuit has a high-level voltage, the first gate driving panel circuit outputs a first scan signal having a high-level voltage, and when a first node of the second gate driving panel circuit has a high-level voltage, the second gate driving panel circuit outputs a second scan signal having a high-level voltage.

A high-level voltage section of the first scan signal and a high-level voltage section of the second scan signal temporally overlap each other.

A temporal length of high-level voltage section of each of the first scan signal and the second scan signal is a 2-horizontal time length, and wherein the high-level voltage section of the first scan signal overlaps the high-level voltage section of the second scan signal is a 1 horizontal time.

The plurality of gate driving panel circuits include an output buffer block configured to output the at least one scan signal according to voltage states of the first node and the second node, a logic block configured to control voltages of the first node and the second node, and a real-time sensing control block configured to control the logic block to perform real-time sensing driving operation.

The first node is a Q node controlling a pull-up transistor of the output buffer block.

The pull-up transistor of the output buffer block includes a carry pull-up transistor, a scan pull-up transistor, and a sensing pull-up transistor, and wherein a gate node of the carry pull-up transistor, a gate node of the scan pull-up transistor, and a gate node of the sensing pull-up transistor are connected to each other and electrically connected to the Q node in common.

The second node is a QB node controlling a pull-down transistor of the output buffer block.

The pull-down transistor of the output buffer block includes a carry pull-down transistor, a scan pull-down transistor, and a sensing pull-down transistor, wherein a gate node of the carry pull-down transistor, a gate node of the scan pull-down transistor, and a gate node of the sensing pull-down transistor are connected to each other and electrically connected to the QB node in common.

The second gate high-potential voltage line is electrically separated from the first gate high-potential voltage line.

A level of the first gate high-potential voltage is equal to or higher than a level of the third gate high-potential voltage.

A line resistance of the first gate high-potential voltage line is smaller than a line resistance of the third gate high-potential voltage line.

The first gate high-potential voltage line is formed in a multi-layer line structure where a first metal power line is electrically connected to a second metal power line.

The first metal power line is made of a metal forming a shield layer to block light on a substrate.

The second metal power line is made of a metal forming a gate electrode of a transistor included in the subpixel.

An interlayer insulating film is disposed between the first metal power line and the second metal power line, and the first metal power line is electrically connected to the second metal power line through a contact hole formed in a portion of the interlayer insulating film.

The second gate high-potential voltage line is formed as a single-layer line structure of a first metal power line.

A gate control signal line is disposed between the first gate high-potential voltage line and the third gate high-potential voltage line.

The gate control signal line is a carry signal line transferring a carry signal to the gate driving circuit.

The carry signal line is disposed close to the third gate high-potential voltage line.

The display panel further includes a plurality of gate low-potential voltage lines which are disposed in the non-display area for transferring a plurality of gate low-potential voltages to the gate driving circuit, wherein the plurality of gate high-potential voltage lines and the plurality of gate low-potential voltage lines are respectively disposed on both sides of the gate driving circuit.

A display device according to the disclosure may comprise a display panel including a plurality of subpixels, a gate driving circuit configured to supply a plurality of scan signals to the display panel through a plurality of gate lines, a data driving circuit configured to supply a plurality of data voltages to the display panel through a plurality of data lines, and a timing controller configured to control the gate driving circuit and the data driving circuit, wherein a first gate high-potential voltage line transferring a first gate high-potential voltage for charging a first node of the gate driving circuit, a second gate high-potential voltage line transferring a second gate high-potential voltage for charging a second node of the gate driving circuit, and a third gate high-potential voltage line which is branched from the first gate high-potential voltage line for transferring a third gate high-potential voltage to stabilize a transistor controlling the first node are disposed in a side area of the gate driving circuit.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed:

1. A display panel comprising:
   a display area including a plurality of subpixels;
   a gate driving circuit in a gate driving panel circuit area of a non-display area that is outside the display area, the gate driving circuit configured to supply a plurality of scan signals to the plurality of subpixels; and
   a plurality of gate high-potential voltage lines in the non-display area, the plurality of gate high-potential voltage lines transferring a plurality of gate high-potential voltages to the gate driving circuit;
   wherein the gate driving panel circuit area is disposed between a first power line area and a second power line area,
   wherein the plurality of gate high-potential voltage lines include:
      a first gate high-potential voltage line transferring a first gate high-potential voltage that charges a first node of the gate driving circuit;
      a second gate high-potential voltage line transferring a second gate high-potential voltage that charges a second node of the gate driving circuit; and
      a third gate high-potential voltage line which is branched from the first gate high-potential voltage line in the first power line area and transfers a third gate high-potential voltage that stabilizes a transistor controlling the first node.

2. The display panel of claim 1, wherein the gate driving circuit includes a plurality of gate driving panel circuits configured to generate at least one scan signal.

3. The display panel of claim 2, wherein the plurality of gate driving panel circuits include a first gate driving panel circuit and a second gate driving panel circuit,
   wherein when a first node of the first gate driving panel circuit has a high-level voltage, the first gate driving panel circuit outputs a first scan signal having the high-level voltage, and when a first node of the second gate driving panel circuit has the high-level voltage, the second gate driving panel circuit outputs a second scan signal having the high-level voltage.

4. The display panel of claim 3, wherein a high-level voltage section of the first scan signal and a high-level voltage section of the second scan signal temporally overlap each other.

5. The display panel of claim 4, wherein a temporal length of the high-level voltage section of each of the first scan signal and the second scan signal is a 2-horizontal time length, and
   wherein the high-level voltage section of the first scan signal overlaps the high-level voltage section of the second scan signal for a 1 horizontal time.

6. The display panel of claim 2, wherein the plurality of gate driving panel circuits include:
   an output buffer block configured to output the at least one scan signal according to voltage states of the first node and the second node;
   a logic block configured to control voltages of the first node and the second node; and
   a real-time sensing control block configured to control the logic block to perform real-time sensing driving operation.

7. The display panel of claim 6, wherein the first node is a Q node that controls a pull-up transistor of the output buffer block.

8. The display panel of claim 7, wherein the pull-up transistor of the output buffer block includes a carry pull-up transistor, a scan pull-up transistor, and a sensing pull-up transistor, and
   wherein a gate node of the carry pull-up transistor, a gate node of the scan pull-up transistor, and a gate node of the sensing pull-up transistor are connected to each other and electrically connected to the Q node in common.

9. The display panel of claim 6, wherein the second node is a QB node that controls a pull-down transistor of the output buffer block.

10. The display panel of claim 9, wherein the pull-down transistor of the output buffer block includes a carry pull-down transistor, a scan pull-down transistor, and a sensing pull-down transistor, and
wherein a gate node of the carry pull-down transistor, a gate node of the scan pull-down transistor, and a gate node of the sensing pull-down transistor are connected to each other and electrically connected to the QB node in common.

11. The display panel of claim 1, wherein the second gate high-potential voltage line is electrically separated from the first gate high-potential voltage line.

12. The display panel of claim 1, wherein a level of the first gate high-potential voltage is equal to or greater than a level of the third gate high-potential voltage.

13. The display panel of claim 1, wherein a line resistance of the first gate high-potential voltage line is less than a line resistance of the third gate high-potential voltage line.

14. The display panel of claim 1, wherein the first gate high-potential voltage line comprises a multi-layer line structure where a first metal power line is electrically connected to a second metal power line.

15. The display panel of claim 14, wherein the first metal power line comprises metal included in a shield layer that blocks light on a substrate.

16. The display panel of claim 14, wherein the second metal power line comprises a metal included in a gate electrode of a transistor included in a subpixel from the plurality of subpixels.

17. The display panel of claim 16, wherein an interlayer insulating film is between the first metal power line and the second metal power line, and the first metal power line is electrically connected to the second metal power line through a contact hole in a portion of the interlayer insulating film.

18. The display panel of claim 1, wherein the second gate high-potential voltage line includes a single-layer line structure of a first metal power line.

19. The display panel of claim 1, wherein a gate control signal line is between the first gate high-potential voltage line and the third gate high-potential voltage line.

20. The display panel of claim 19, wherein the gate control signal line is a carry signal line transferring a carry signal to the gate driving circuit.

21. The display panel of claim 20, wherein the carry signal line is close to the third gate high-potential voltage line.

22. The display panel of claim 1, further comprising:
a plurality of gate low-potential voltage lines in the non-display area that transfer a plurality of gate low-potential voltages to the gate driving circuit,
wherein the plurality of gate high-potential voltage lines and the plurality of gate low-potential voltage lines are respectively disposed on both sides of the gate driving circuit.

23. A display device, comprising:
a display panel including a display area and a non-display area;
a gate driving circuit in a gate driving panel circuit area of the non-display area, the gate driving circuit configured to supply a plurality of scan signals to the display panel through a plurality of gate lines;
a data driving circuit configured to supply a plurality of data voltages to the display panel through a plurality of data lines; and
a timing controller configured to control the gate driving circuit and the data driving circuit,
wherein the gate driving panel circuit area is disposed between a first power line area and a second power line area,
wherein a first gate high-potential voltage line transfers a first gate high-potential voltage that charges a first node of the gate driving circuit;
wherein a second gate high-potential voltage line transfers a second gate high-potential voltage that charges a second node of the gate driving circuit; and
wherein a third gate high-potential voltage line which is branched from the first gate high-potential voltage line in the first power line area transfers a third gate high-potential voltage that stabilizes a transistor controlling the first node,
wherein the first gate high-potential voltage line, the second gate high-potential voltage line, and the third gate high-potential voltage line are disposed in a side area of the gate driving circuit.

* * * * *